(12) United States Patent
Murade

(10) Patent No.: US 6,330,044 B1
(45) Date of Patent: *Dec. 11, 2001

(54) APPARATUS FOR PROVIDING LIGHT SHIELDING IN A LIQUID CRYSTAL DISPLAY

(75) Inventor: Masao Murade, Suwa (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/027,469

(22) Filed: Feb. 23, 1998

(30) Foreign Application Priority Data

Feb. 27, 1997 (JP) .................................................. 9-044378
Oct. 31, 1997 (JP) .................................................. 9-301251

(51) Int. Cl.$^7$ ......................... G02F 1/136; G02F 1/1335; G02F 1/1333
(52) U.S. Cl. ................................ 349/44; 349/110; 349/95
(58) Field of Search .............................. 349/111, 44, 43, 349/42, 92, 93, 110, 95

(56) References Cited

U.S. PATENT DOCUMENTS

| | | | |
|---|---|---|---|
| 4,687,298 | * | 8/1987 | Aoki et al. ............................. 349/111 |
| 4,759,610 | * | 7/1988 | Yangisawa ............................ 349/111 |
| 4,821,092 | * | 4/1989 | Noguchi ................................ 349/111 |
| 4,948,231 | * | 8/1990 | Aoki et al. ............................. 349/111 |
| 5,128,726 | * | 7/1992 | Yangisawa ............................ 349/111 |
| 5,929,948 | * | 7/1999 | Ohori et al. ........................... 349/111 |

* cited by examiner

Primary Examiner—Toan Ton
(74) Attorney, Agent, or Firm—Oliff & Berridge, PLC

(57) ABSTRACT

A leak current due to the effect of light reflected by a polarizing plate or the like is suppressed in pixel switching TFTs in a liquid crystal device and a projection type display device comprising the liquid crystal device, and the characteristics of pixel switching TFT are stabilized. In a liquid crystal device substrate of a liquid crystal device, a first light shielding film is provided below at least the channel region of pixel switching TFTs, extending along scanning lines and connected to constant potential wiring for supplying a constant potential on an outside of the pixel region to fix the potential of the first light shielding film.

15 Claims, 36 Drawing Sheets

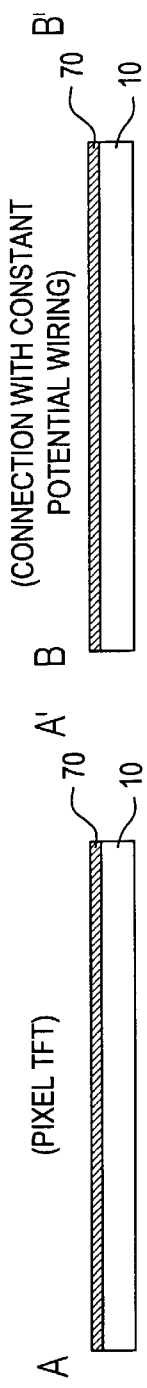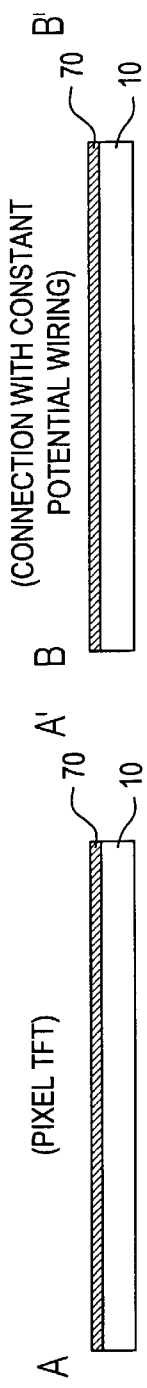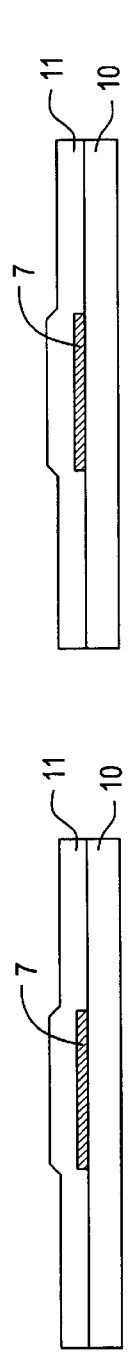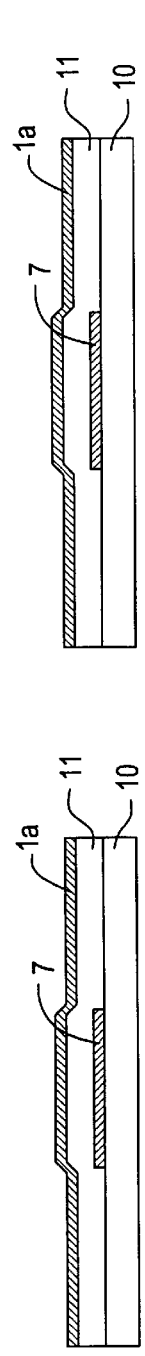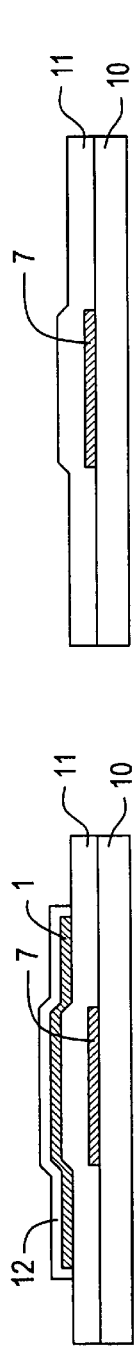
Fig. 24(A) – Fig. 24(F)

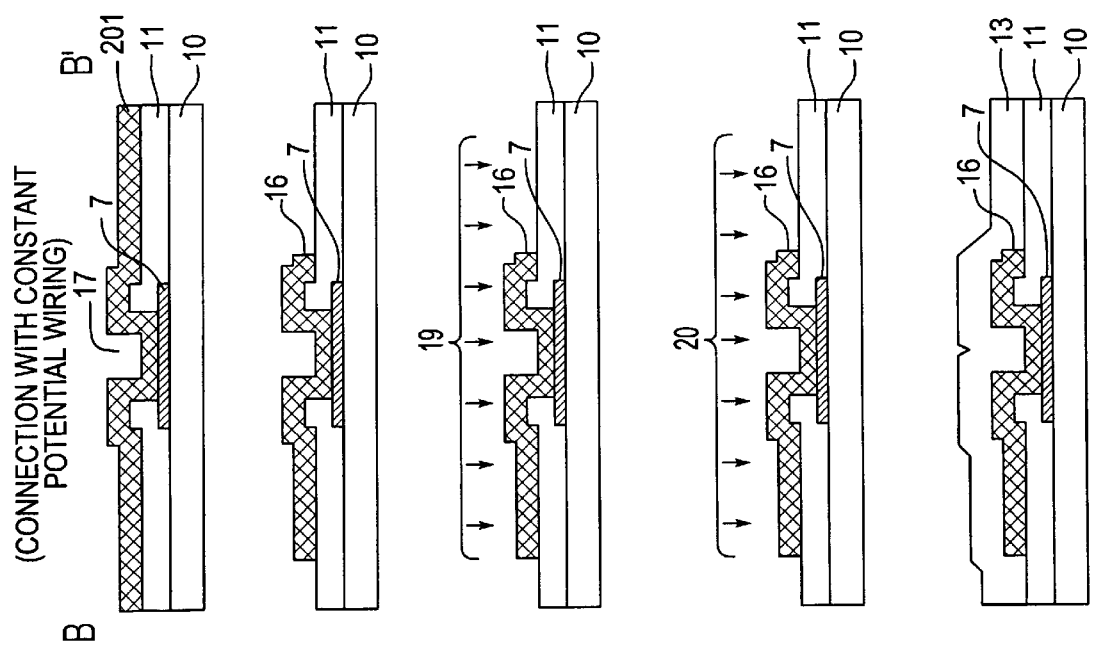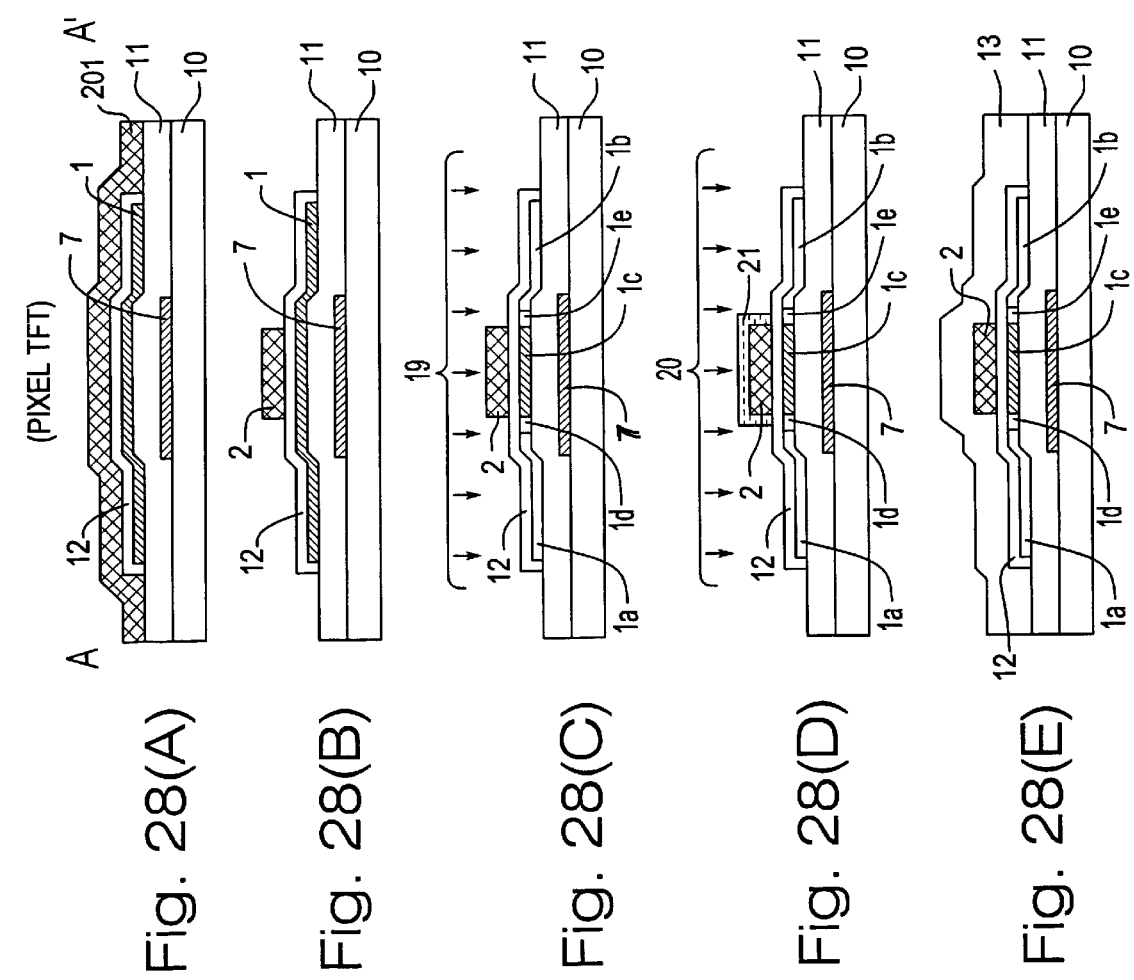
Fig. 28(A)
Fig. 28(B)
Fig. 28(C)
Fig. 28(D)
Fig. 28(E)

APPARATUS FOR PROVIDING LIGHT SHIELDING IN A LIQUID CRYSTAL DISPLAY

BACKGROUND OF THE INVENTION

1. Field of Invention

The present invention relates to a liquid crystal device, a projection type display device and a method of manufacturing the liquid crystal device. Particularly, the present invention relates to a light shielding structure in a liquid crystal device comprising a thin film transistor (referred to as "TFT" hereinafter) as a pixel switching element.

2. Description of Related Art

For a conventional active matrix driving system liquid crystal device a configuration is brought into practical use in which pixel electrodes are formed in a matrix on a glass substrate and a pixel switching TFT comprising a semiconductor layer of an amorphous silicon film or a polysilicon film is formed in correspondence with each of the pixel electrodes so that a voltage is applied to each pixel electrode through the TFT to drive a liquid crystal. In a liquid crystal device comprising pixel switching polysilicon TFT, TFT'S for driving circuits comprising peripheral driving circuits such as a shift register circuit, etc. for driving and controlling a screen display portion can be formed in substantially the same process as the pixel switching TFT, and thus the liquid crystal device attracts attention because it is suitable for high integration.

In such an active matrix system liquid crystal device, in order to achieve high definition of the display, a light shielding film referred to as a black matrix (or black stripes) or the like and made of a chromium film, aluminum film, or the like is formed on an opposite substrate. The light shielding film is also formed to overlap with the pixel switching TFT so as to prevent the light incident on the opposite substrate from entering the channel region and junctions of the pixel switching TFT and prevent a leak current from flowing through the pixel switching TFT. (This light shielding film is referred to as "third shielding film hereinafter.)

However, the leak current due to light is not only due to the light incident on the opposite substrate side but also irradiation of the channel region of the pixel switching TFT with the light reflected by a polarizing plate or the like disposed on the back side of the liquid crystal device substrate.

As a method of preventing the leak current due to such reflected light (return light), Japanese Examined Patent Publication No. 3-52611 discloses an invention in which a light shielding film is also provided on the lower layer side of the channel region of the pixel switching TFT. However, in the disclosed invention, the potential of the light shielding film is not fixed, and there is thus a problem in which TFT characteristics vary or deteriorate due to the parasitic capacitance between the semiconductor layer of the TFT and the light shielding film.

On the other hand, the peripheral driving circuits are increasingly demanded to be highly integrated with an increase in the number of pixels and miniaturization of an electronic apparatus containing the liquid crystal device. Particularly, in a liquid crystal device containing the peripheral driving circuits provided on the same substrate, as a technology for achieving high integration of circuits, a multilayer wiring technology is used in which wiring is provided by forming metallic films of aluminum or the like in multiple layers with insulating films between the respective layers. However, this technology has a problem in that the number of steps and production cost are increased by forming the multilayer wiring structure.

Also, as the speed of the operation frequency of the active matrix driving system liquid crystal device increases, attempts are made to improve the quality of the semiconductor film by employing a SOI technology, a recrystallization technology using laser annealing, or the like in order to improve TFT characteristics. However, such a method of improving TFT characteristics has the problem of increasing the variations in characteristics and the problem of complicating the manufacturing process.

SUMMARY OF THE INVENTION

Accordingly, an object of the present invention is to provide a technology for suppressing a leak current due to the influence of the light reflected by a polarizing plate or the like in pixel switching TFTs of a liquid crystal device and a projection type display device comprising the liquid crystal device, to stabilize the characteristics of the pixel switching TFTs.

Another object of the present invention is to provide a technology for achieving high integration of driving circuits provided in the periphery of a display region in a liquid crystal device without increasing the number of the steps of the manufacturing process.

A further object of the present invention is to provide a technology for improving TFT characteristics in a liquid crystal device without increasing the number of the steps of the manufacturing process.

In order to solve the above problems, the present invention provides a liquid crystal device comprising a liquid crystal device substrate including a display region in which pixels are formed in a matrix by a plurality of data lines and a plurality of scanning lines, peripheral driving circuits connected to at least one of the data lines and the scanning lines on the outside of the display region, and a plurality of thin film transistors connected to the data lines and the scanning lines; and a liquid crystal held between the liquid crystal device substrate and an opposite substrate;

wherein the liquid crystal device substrate has a first conductive light shielding film provided on at least the lower layer side of the channel regions of the thin film transistors so that the light shielding film and the channel regions overlap each other with an interlayer insulation film therebetween, and a constant voltage is applied to the first light shielding film.

In the liquid crystal device in accordance with the present invention, since the first light shielding film is formed to overlap with the channel regions of the thin film transistors, i.e., the pixel switching TFTs, connected to the data lines and the scanning lines, even if light is reflected from the back side of the liquid crystal device substrate, the reflected light does not enter the channel regions of the pixel switching TFTs. Therefore, no leak current occurs in the pixel switching TFTs due to the light reflected from the back side of the liquid crystal device substrate. In addition, since the potential of the first light shielding film is fixed at the constant voltage power source on the low-potential side of a scanning line driving circuit, the TFT characteristics neither change nor deteriorate due to the influence of the parasitic capacitance between the semiconductor layers of the TFTs and the first light shielding layer.

In the present invention, in order to apply a constant voltage to the first light shielding film, the first light shielding film may comprise channel shielding portions which respectively overlap with the channel regions, and wiring portions extended from the channel shielding portions in order to apply a constant voltage to the channel shielding portions.

In this case, the wiring portions of the first light shielding film are respectively extended from the channel shielding portions to the outside of the display region along the signal lines of at least either of the scanning lines and the data lines, and are connected to constant potential wiring formed between layers different from the first light shielding film at least through contact holes of the interlayer insulation film in the outside of the display region.

In some cases, the wiring portions of the first light shielding film are respectively extended from the channel shielding portions to the outside of the display region along both signal lines of the scanning lines and the data lines, and are connected to constant potential wiring formed between layers different from the first light shielding film at least through contact holes of the interlayer insulation film on the outside of the display region.

In the present invention, each of the wiring portions of the first light shielding layers is connected to the constant potential wiring through the contact hole of the interlayer insulating film on the outside of the display region.

When one side of each of the wiring portions of the first light shielding film is connected to the constant potential wiring through the contact hole of the interlayer insulating film, a constant voltage can be applied to the first light shielding film.

On the other hand, when both ends of each of the wiring portions of the first light shielding film are connected to the constant potential wiring through the contact holes of the interlayer insulating film, even if the wiring portions of the first light shielding film are disconnected at an intermediate position thereof, a constant potential is supplied to the wiring portions of the first light shielding film from the constant potential wiring. Therefore, the wiring portions of the first light shielding film comprise redundant wiring and thus exhibits high reliability.

In the present invention, the wiring portions of the first light shielding film comprise branches respectively extended from the channel shielding portions to the outside of the display region along the signal lines of at least either of the scanning line and the data lines, and a trunk to which the branches are connected on the outside of the display region, the trunk being preferably connected to the constant potential wiring through the contact holes of the interlayer insulation film. This configuration eliminates the need to connect the first light shielding film and the constant potential wiring for each of the branches, and thus the trunk and the constant potential wiring may be connected. Therefore, the trunk may be lead to any desired position without wiring and connected to the constant potential wiring. In the connection between the first light shielding film and the constant potential wiring, wet etching for forming the contact holes easily produces cracks in the interlayer insulation film due to penetration of an etching solution. However, the present invention has the advantage that the trunk can be lead to any desired position, and a place where the racks might occur is limited to a safe position. The present invention also has the advantage that since the place where the cracks might occur is minimized by connecting the trunk and the constant potential wiring in order to connect the first light shielding film and the constant potential wiring, the reliability is high.

In this case, a constant voltage can be applied to the first light shielding film by connecting one end of each of the branches to the trunk.

On the other hand, when both ends of each of the branches are connected to the trunks, even if a branch is disconnected at an intermediate position thereof, a constant voltage is applied to the wiring portion of the first light shielding film from the trunks. Therefore, the wiring portion of the first light shielding film comprises redundant wiring, and thus exhibits high reliability.

In the present invention, the first light shielding film preferably is connected to capacitance wiring which overlaps with the drain regions of the pixel switching TFTs to form the storage capacitor, through at least the contact holes of the interlayer insulation film. Also the first light shielding film preferably overlaps with the drain regions of the pixel switching TFTs through the interlayer insulation film to form the storage capacitor. This configuration eliminates the need to lead each capacitance wiring into the scanning line driving circuit in order to apply a constant voltage, and thus facilitates the layout for introducing a large scale circuit into the scanning line driving circuit.

In the present invention, the constant potential wiring is connected to a power source line for supplying a power source on the low-potential side to the peripheral driving circuits, a power source line for supplying a counter electrode potential to the counter electrode of the opposite substrate from the liquid crystal device substrate through transfer materials, or a power source line for supplying a ground potential to the peripheral driving circuits.

In the present invention, at least one of the liquid crystal device substrate and the opposite substrate preferably comprises a light shielding film for partitioning the display screen, which is provided to surround the display region.

In the present invention, the liquid crystal device substrate preferably comprises a second light shielding film which is provided on the upper layer side of the channel regions of the pixel switching TFTs to cover the channel regions. In this case, as the second light shielding film, for example, the data lines can be used. The second light shielding film is preferably formed to cover not only the channel regions but also the first light shielding film formed below at least the channel regions through the interlayer insulation film so as to prevent incident light from being reflected by the surface of the first light shielding film and applied to the channel regions of the pixel switching TFTs. This configuration permits a decrease in the leak current due to light in the TFTs.

In the present invention, the peripheral driving circuits include P channel type driving circuit TFTs and N channel type driving circuit TFTs, the P channel type and N channel type driving circuit TFTs being preferably formed by the same process as that for producing the pixel switching TFTs. This configuration limits the number of the layers in multilayer wiring, and thus, in the peripheral driving circuits, the conductive film formed at the same time as the first light shielding film is preferably effectively used as an wiring layer.

In the present invention, the wiring layer comprising the conductive film formed at the same time as the first light shielding film is preferably connected to the gate electrodes of the driving circuit TFTs at least through the contact holes of the interlayer insulation film, and overlaps with the channel regions of the driving circuit TFTs with an area smaller than the area of the gate electrodes of the driving circuit TFTs on the lower layer side of the channel regions through the interlayer insulation film.

In the present invention, the wiring layer comprising the conductive film formed at the same time as the first light shielding film is preferably connected to the source electrodes of the driving circuit TFTs at least through the contact holes of the interlayer insulation film, and overlaps with the channel regions of the driving circuit TFTs on the lower layer side thereof.

In the present invention, the first light shielding film preferably comprises an opaque conductive film such as a metallic film made of tungsten, titanium, chromium, tantalum, molybdenum, or the like, or a metal alloy film made of meal silicide or the like, which contains any one of these metals. Such a metallic film or metal alloy film which has high light shielding ability and electrical conductivity functions as a light shielding layer for the light reflected from the back side of the liquid crystal device substrate.

In the present invention, the opposite substrate preferably comprises a third light shielding film formed corresponding to the pixels. In this case, the third light shielding film is preferably formed to cover at least the first light shielding film.

In the present invention, the opposite substrate preferably comprises microlenses formed in a matrix corresponding to the pixels. This construction permits the microlenses to converge light on a predetermined region of the liquid crystal device substrate, and thus permits high-quality display even if the third light shielding film is omitted from the counter substrate. The liquid crystal device of the present invention prevents irradiation of the channel regions of the pixel switching TFTs even if the light converged by the microlenses is reflected by the back side of the liquid crystal device substrate, and thus no leak current flows through the TFTs due to light.

Since the leak current due to light is suppressed in the TFTs, the liquid crystal device of the present invention is preferably used as a light valve for a projection display device which is irradiated with strong light. In such a projection type display device, the light emitted from a light source is modulated by the liquid crystal device of the present invention, and the modulated light is enlarged and projected by projection optical means.

BRIEF DESCRIPTION OF THE DRAWINGS

FIGS. 24(A)–24(F) are sectional views showing the steps of a method of manufacturing a liquid crystal device substrate to which the present invention is applied;

FIGS. 28(A)–28(E) are sectional views showing the steps after the steps shown in FIGS. 27(A) and 27(B) in another method of manufacturing a liquid crystal device substrate to which the present invention is applied;

DETAILED DESCRIPTION OF PREFERRED EMBODIMENTS

Embodiments of the present invention will be described below with reference to the attached drawings.

Figure 1:
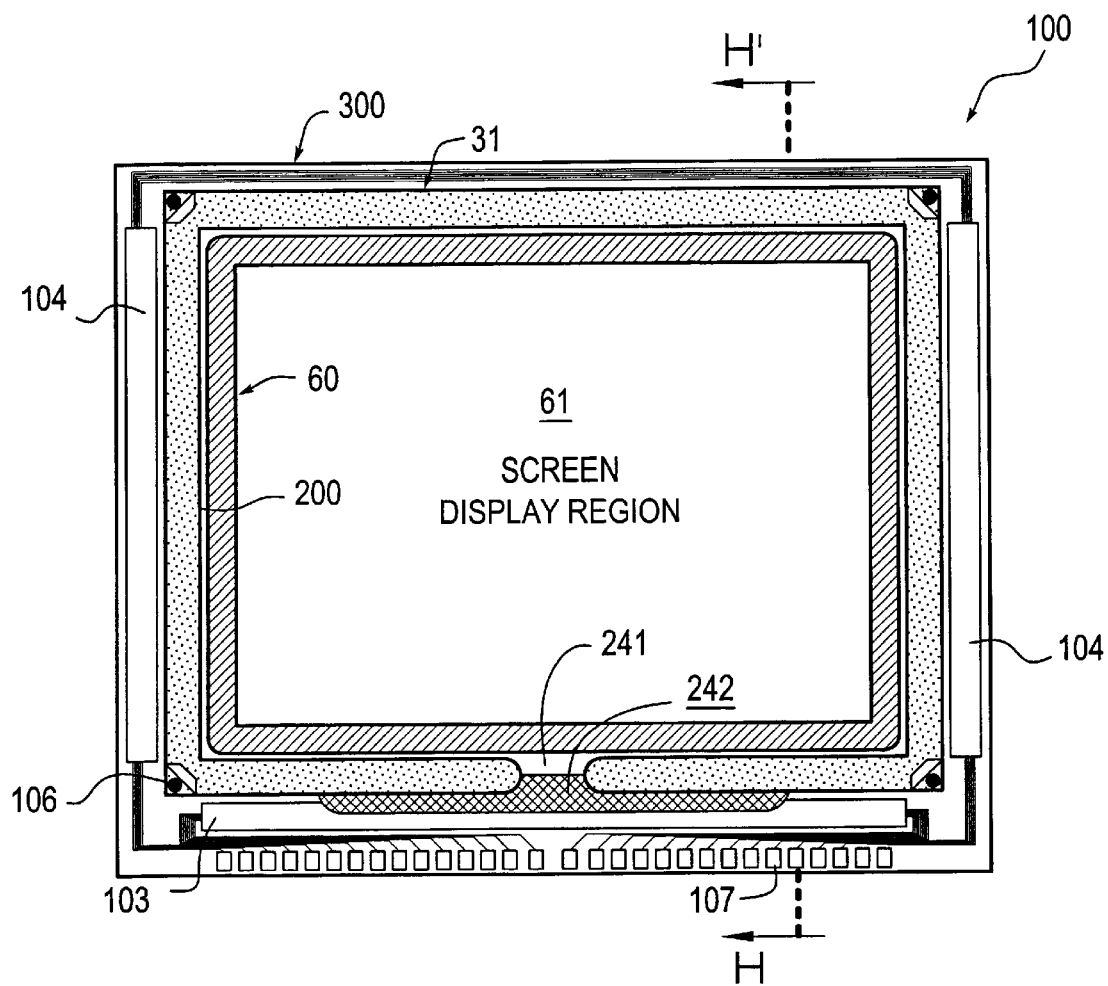
FIG. 1 is a plan view of a liquid crystal device to which the present invention is applied.
Figure 2:
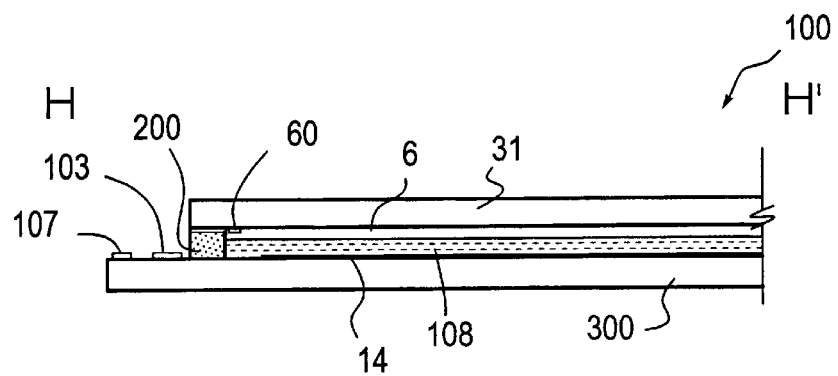
FIG. 2 is a sectional view taken along line H–H' in FIG. 1.

FIGS. 1 and 2 are a plan view of a liquid crystal device to which the present invention is applied, and a sectional view taken along line H–H' in FIG. 1, respectively.

As shown in these drawings, a liquid crystal device 100 schematically comprises a liquid crystal device substrate 300 comprising a rectangular display region 61 (screen display region) having pixels described below which are formed in a matrix therein, a data line driving circuit 103 (peripheral driving circuit) formed in the outside region of the display region 61, and a pair of scanning line driving circuits 104 (peripheral driving circuits) formed on both sides of the display region 61; and an opposite substrate 31 disposed opposite to the liquid crystal device substrate 300. In the liquid crystal device substrate 300, pixel electrodes 14 made of an ITO film (Indium Tin Oxide) are formed for respective pixels 105 which will be described below. In the opposite substrate 31, a counter electrode 32 is formed over substantially the whole surface thereof, and a third light shielding film 6 is formed corresponding to the respective pixels. The opposite substrate 31 has the counter electrode 32 comprising a transparent conductive film such as an ITO film or the like formed on a transparent substrate made of glass, neoceram or silica. The opposite substrate 31 also has a peripheral partitioning light shielding film 60 (light shielding film for partitioning the display region outside the display region) formed along the outer edge of the display region 61 so as to prevent leakage of light when the liquid crystal device 100 is assembled as a module.

The opposite substrate 31 and the liquid crystal device substrate 300 are bonded with a predetermined cell gap therebetween by using a sealing material 200 containing a gap material and formed along the outer edge of the peripheral partitioning light shielding film 60 outside the display region 61, a liquid crystal 108 being sealed in the region inward of the sealing material 200. The sealing material 200 is used for sealing on data lines, which will be described below, between the display region 61 and the data line driving circuit 103, and for sealing on scanning lines, which will be described below, between the display region 61 and each of the scanning line driving circuits 104. A portion of the sealing material 200 is cut off to form a liquid crystal injection port 241 in this portion. Therefore, in the liquid crystal device 10, after the opposite substrate 31 and the liquid crystal device substrate 300 are bonded, the pressure of the region inward of the sealing material 200 is reduced, and then the liquid crystal 108 is injected through the liquid crystal injection port 241 under reduced pressure. After the liquid crystal 108 is sealed, the liquid crystal injection port 241 is sealed with a sealant 242.

As the sealing material 200, epoxy resins and various ultraviolet curable resins can be used, the gap material comprising glass fibers, glass beads or the like being mixed with the sealing material. As the liquid crystal 108, a known TN (Twisted Nematic) liquid crystal can be used. When a polymer dispersion type liquid crystal in which fine particles are dispersed in a polymer is used as the liquid crystal 108, both a alignment film and a polarizing plate become unnecessary, and thus the utilization efficiency of light is increased, thereby making it possible to provide a bright active matrix type liquid crystal device 100. Further, when a non-transmitting metal film having high reflectance, such as an aluminum film or the like, is used for the pixel electrodes 14 in place of the ITO film, the liquid crystal device 100 can be constructed as a reflection type liquid crystal device. In the reflection type liquid crystal device 100, a SH (Super Homeotropic) liquid crystal in which liquid crystal molecules are substantially vertically aligned without application of a voltage can be used. Of course, other liquid crystals can also be used.

In this embodiment, since the opposite substrate 31 is smaller than the liquid crystal device substrate 300, both substrates are bonded together with the peripheral diving circuits of the liquid crystal device substrate 300 formed in a region projecting from the outer edge of the opposite substrate 31. Therefore, the scanning line driving circuits 104 and the data line driving circuit 103 are positioned outside the opposite substrate 31, and are not opposed to the opposite substrate 31, and thus deterioration in the alignment film and the liquid crystal due to a DC component can be prevented. Although the sealing material 200 is formed along the outer edge of the substrate as seen from the opposite substrate 31, the sealing material 200 is formed inside the substrate as seen from the liquid crystal device substrate 300. In the liquid crystal device substrate 300, many leads are formed outside the opposite substrate 31, and a flexible printed wiring substrate is connected by wire bonding, ACF (Anisotropic Conductive Film) compression bonding or the like.

(Basic Configuration of Liquid Crystal Device Substrate and Display Region)

Figure 3:
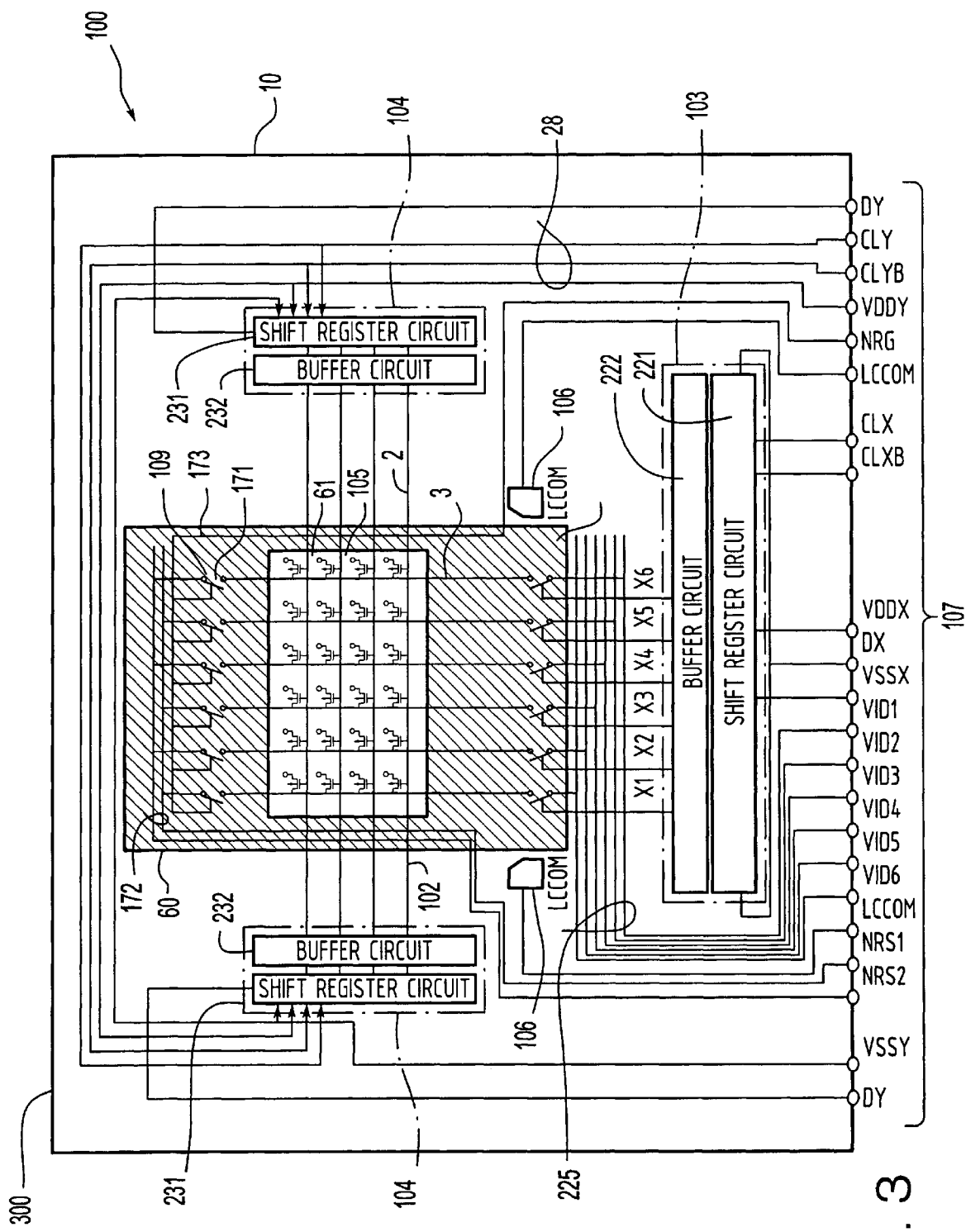
FIG. 3 is a block diagram of the liquid crystal device substrate of a liquid crystal device to which the present invention is applied.

FIG. 3 is a block diagram of the liquid crystal device substrate 300 of a type in which the driving circuits are built in, and which is used in the liquid crystal device 100 of this embodiment. In FIG. 3, in order to permit the basic components of the liquid crystal device substrate 300 to be seen, a first light shielding film on the liquid crystal device substrate 300, which will be described below, is not shown.

Figure 4A:
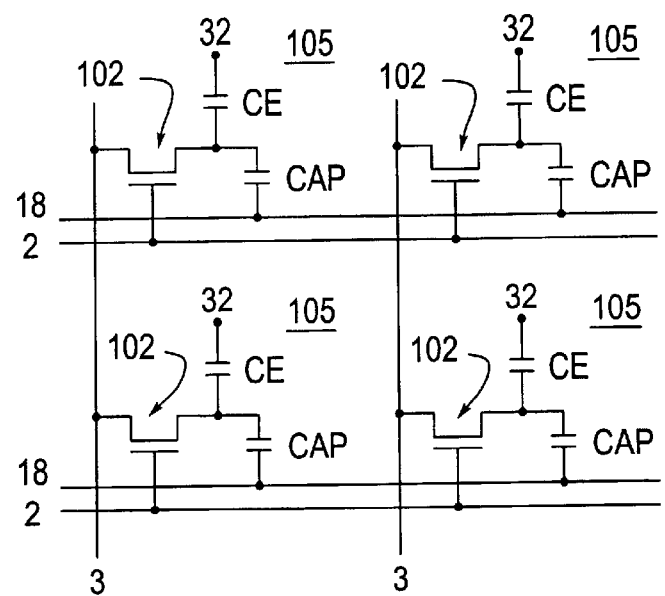
FIGS. 4(A) and (B) are respectively a drawing of equivalent circuits of pixels formed in a matrix on a liquid crystal device substrate, and a plan view thereof.
Figure 4B:
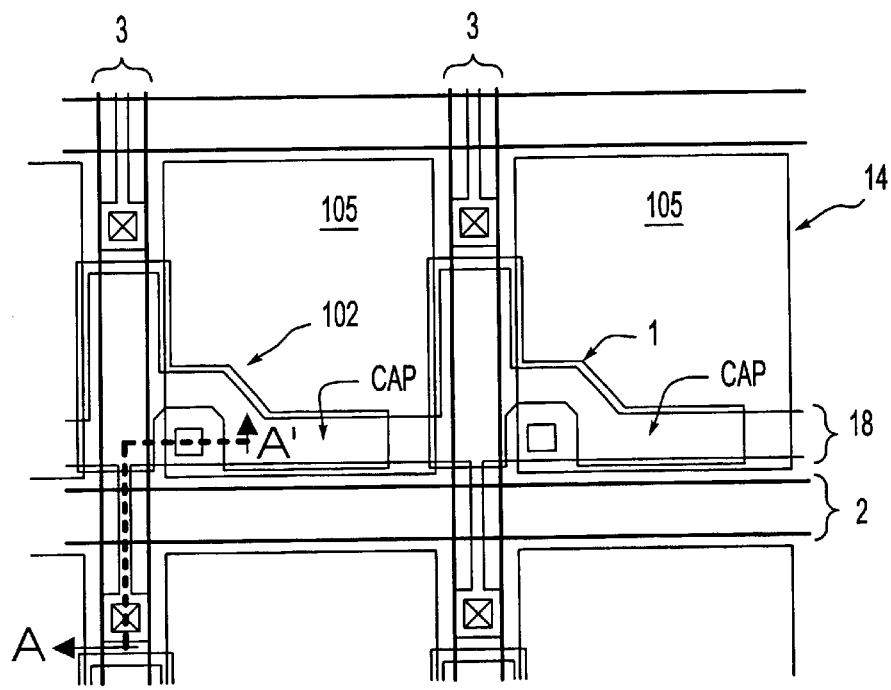

As seen from FIG. 3, in the display region 61 of the liquid crystal device substrate 300, a plurality of pixels 105 are formed in a matrix on a substrate 10 by a plurality of scanning lines 2 and a plurality of data lines 3. FIGS. 4(A) and 4(B) are respectively a detailed black diagram of the pixels 105, and a drawing showing the configuration thereof. As shown in FIGS. 4(A) and 4(B), in each of the pixels 105 is formed a pixel switching TFT 102 connected to the scanning line 2 and the data line 3. The liquid crystal 108 is held between the pixel electrode connected to the TFT 102 and the counter electrode 32 of the opposite substrate 31 to form a liquid crystal cell CE. For the liquid crystal cell CE, a storage capacitor CAP is formed by using capacitance wiring 18 formed at the same time as the scanning lines 2. Namely, in this embodiment, the drain region of the semiconductor layer 1 which constitutes the pixel switching TFT 102 is extended so that the extended region is used as a first electrode for the storage capacitor, the capacitance wiring 18 formed at the same time as the scanning lines 2 is used as a second electrode, and a gate insulation film formed between the first and second electrodes is used as a dielectric film to form the storage capacitor CAP.

The region where the capacitance wiring 18 is formed is a region where the quality of the screen display deteriorates due to the disclination (alignment defect) of the liquid crystal which is caused by the influence of a lateral electric field or the like. This region is shielded from light by superposing the third light shielding film 6 (refer to FIG. 2) of the opposite substrate 31. Therefore, in this embodiment, since the capacitance wiring 18 is arranged in the region serving as such a dead space, the light transmittable area of the pixels 105 can effectively be utilized, and the occurrence of flicker and crosstalk is prevented. It is thus possible to achieve a high-quality display in the liquid crystal device 100 of this embodiment.

In this embodiment, in order to supply a constant potential to a first light shielding film 7, for example, the capacitance wiring 18 formed of the same polysilicon film or the like as the scanning lines may be electrically connected in contact holes 5 by using constant potential wiring 8 formed of the same aluminum film or the like as the data lines 3, for supplying a constant voltage power source VSSY on the low-potential side of the scanning line driving circuits. The contact holes 5 can be formed in the same step as contact holes for connecting the data lines 3 and high-concentration source regions 1a. This configuration permits the constant potential wiring 8 to be used for supplying a constant potential to the first light shielding film 7 and the capacitance wiring 18, and thus eliminates the need to respectively provide exclusive wirings and permits effective layout of the narrow area. Since the constant potential wiring 8 is also used for supplying a power source for the peripheral driving circuits and the counter electrode potential of the opposite substrate, exclusive leads 107 and leading wiring need not be provided. Therefore, it is possible to reduce the number of leads and effectively utilize the space, and thus this configuration is advantageous for, particularly, a small-sized liquid crystal device.

Although not shown in the drawings, the storage capacitor CAP can also be formed by extending the drain region of the semiconductor film which constitutes the pixel switching TFT 102 to overlap with the scanning line 2 through the gate insulation film.

In the liquid crystal device substrate 300, on the side near the data line driving circuit 103 are formed many leads 107 for inputting VDDX, VSSX, VDDY, VSSY, modulated image signals VID1 to VID6, various signals (the start signal DY for a scanning line shift register circuit 231, a clock signal CLY, the reverse clock signal CLYB, the start signal DX for a data line shift register circuit 221, a clock signal CLX and the reverse clock signal CLXB), etc. The leads 107 comprise a metallic film such as an aluminum film or the like, a metal silicide film, or a conductive film such as an ITO film or the like. A plurality of signal wirings 28 for driving the scanning line driving circuits 104 and the data line driving circuit 103 are led from the leads 107 to pass through the outer periphery of the substrate outside the sealing material 200. These signal wirings 28 comprise low-resistance metallic films such as aluminum films or metal silicide films which are formed at the same time as the data lines 3. When a resistance is applied as a counter measure against static, contact holes are formed in a second layer insulating film 13 so that the signal wirings 28 may be electrically connected to polysilicon films formed by the same material in the same step as the scanning lines through the contact holes. In order to supply the counter electrode potential LCCOM input from the outside through the leads 107 to the opposite substrate 31 from the liquid crystal device substrate 300, transfer terminals 106 are formed on the liquid crystal device substrate 300. The liquid crystal device substrate 300 and the opposite substrate 31 are bonded with transfer materials having a predetermined diameter and provided on the transfer terminals 106 therebetween so that the opposite electrode potential LCCOM can be applied to the counter electrode 32 of the opposite substrate 31 from the side of the liquid crystal device substrate 300.

In the liquid crystal device substrate 300, on the side of the data line driving circuit 103 are formed a data sampling circuit 101 provided with an analogue switch comprising TFT and operated on the basis of the signals output from a data line shift register circuit 221, a data line buffer circuit 222, and a data line shift register circuit 221 through the data line buffer circuit 222, and six image signal lines 225 corresponding to the modulated image signals VID 1 to VID 6 developed to six phases.

For example, the data line shift register circuit 221 of the data line driving circuit 103 may comprise a plurality of systems to each of which a common start signal DX is input. When the data line shift register circuit 221 comprises a plurality of systems, as described above, it is possible to lower the transfer frequency of the clock signal CLX and the reverse clock signal CLXB, and thus decrease the circuit load. The start signal DX is supplied to the data line shift register 221 from the outside through the leads 107, and clock signal CLX and the reverse clock signal CLXB are supplied to a flip flop (not shown) in each stage. Therefore, in the data line shift register circuit 221, after the start signal DX has been input, shift signals (sampling signals X1, X2, X3 . . . ) for driving the analogue switches of the data sampling circuit 101 synchronously with the rising edges of the clock signal CLX and the reverse clock signal CLXB thereof are generated and output. When the sampling signals with the phases shifted are output to the data sampling circuit 101 from the data line shift register 221 through the data line buffer circuit 222, the analogue switches are successively operated on the basis of the sampling signals. As a result, the modulated image signals VID1 to VID6 supplied through the image signal lines 225 are captured by the predetermined data lines 3 at predetermined timing, and held by the pixels 105 selected by the scanning signals supplied through the scanning lines. Although, in this embodiment, a method is described in which the data lines 3 are successively driven with predetermined timing, many data lines 3, e.g., 3, 6 or 12 lines, may be simultaneously selected by a single sampling signal, and the timing of the modulated image signal output from the outside may be changed to obtain the same image display as described above. The number of the expanded phases in the modulated image signal supplied to the data lines 3 is not only 6 but also 5 or less as long as the analogue switches which constitute the data sampling circuit 102, have good writing properties or 7 or more times the frequency of the modulated image signal is high. In this case, of course, the image signal lines 225 corresponding to at least the number of the expanded phases of the modulated image signal are required. In addition, the data line driving circuit 103 may be provided on the opposite side with the display region 61 therebetween so that the data lines 3 are alternately driven in a comb-like manner by the two data line driving circuits 103. This configuration can have the driving frequency of the shift register, and decrease the circuit load.

Similarly, in each of the scanning line driving circuits 104 are formed a scanning line shift register 231 which generates a shift signal (scanning signal) on the basis of the start signal DY, the clock signal CLY and the reverse clock signal CLYB, and outputs the shift signal, and a scanning buffer circuit 232. In this embodiment, since the scanning line driving circuits 104 are formed on both sides with the display region 61 therebetween to drive the scanning lines 2 from both sides, the load on driving of the scanning lines 2 can be decreased. When the time constant of the scanning lines 2 can be neglected, the scanning line driving circuit 104 may be provided on only one side of the display region 61.

In the liquid crystal device substrate 300, on the side opposite to the side where the data line driving circuit 103 is formed with respect to the display region 61, an auxiliary circuit 109 for the data lines 3 is also formed in a region which overlaps with the peripheral partitioning light shielding film 60 (the region shown by oblique lines). The auxiliary circuit 109 has a switching circuit 171 which utilizes TFTs, for example, two signal wirings 172, electrically connected to the data lines 3 through the switching circuit 171, and signal wiring 173 for controlling the switching circuit 171. In the auxiliary circuit 109, the connection state between the data lines 3 and the signal wiring 172 can be controlled by operating the switching circuit 171 on the basis of the control signal NRG supplied to the signal wiring 173. Therefore, by a precharge function in which the auxiliary circuit 109 is driven by the control signal NRG during the period of a horizontal retrace line of the image signal to previously apply a predetermined level of potential as signals NRS1 and NRS2 to the data lines 3, it is possible to decrease the load of writing of the actual modulated image signals VID1 to VID6 on the data lines 3 through the data sampling circuit 101. The auxiliary circuit 109 may comprise an inspection circuit for detecting point defects and line defects, or may be used as both the precharge function and the inspection circuit.

Figure 5:
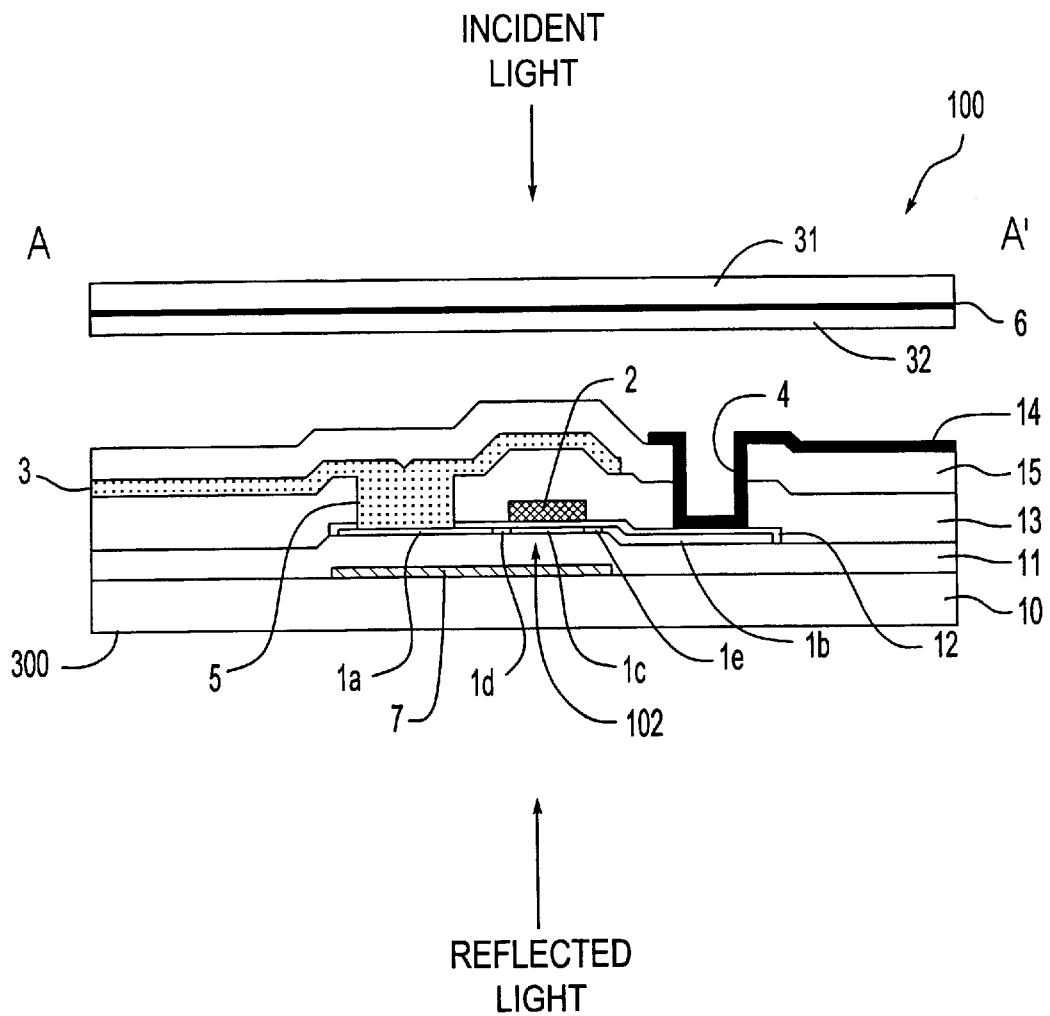
FIG. 5 is a sectional view taken along line A–A' in FIG. 4(B)

FIG. 5 is a sectional view taken along line A–A' in FIG. 4(B).

As seen from FIGS. 4(B) and 5, the pixel switching TFT 102 comprises the scanning line 2 (gate electrode), the channel region 1c where a channel is formed by an electric field from the scanning line 2, the gate insulation film 12 formed between the scanning line 2 and the channel region 1c, the high-concentration source region 1a electrically connected to the data line 3 (source electrode) through the contact hole 5 of the second layer insulation film 13, and the high-concentration drain region 1b electrically connected to the pixel electrode 14 through the contact hole 4 formed in the second layer insulation film 13 and a third layer insulation film 15. The pixel switching TFT 102 also has a LDD (Lightly Doped Drain) structure in which a low concentration of impurity ion is implanted into the junction between the channel region 1c and the source region 1a into which high concentrations of impurities ions are implanted, and the junction between the channel region 1c and the drain region 1b into which a high concentration of impurity ion is implanted to form low-concentration source and drain regions 1d and 1e.

In this embodiment, the TFT 102 is formed by using a portion below the data line 3, and at least the gate electrode of the scanning line 2, i.e., the channel region 1c and the low-concentration source and drain regions 1d and 1e, is covered with the data line 3. Therefore, the channel region 1c and the low-concentration source and drain regions 1d and 1e of the pixel switching TFT 102 are not irradiated with the light incident on the opposite substrate 31 side, thereby decreasing the leak current due to light in the TFT. The basic configurations of embodiments and modified embodiments which will be described below are the same as that described above.

[Embodiment 1]

Figure 6:
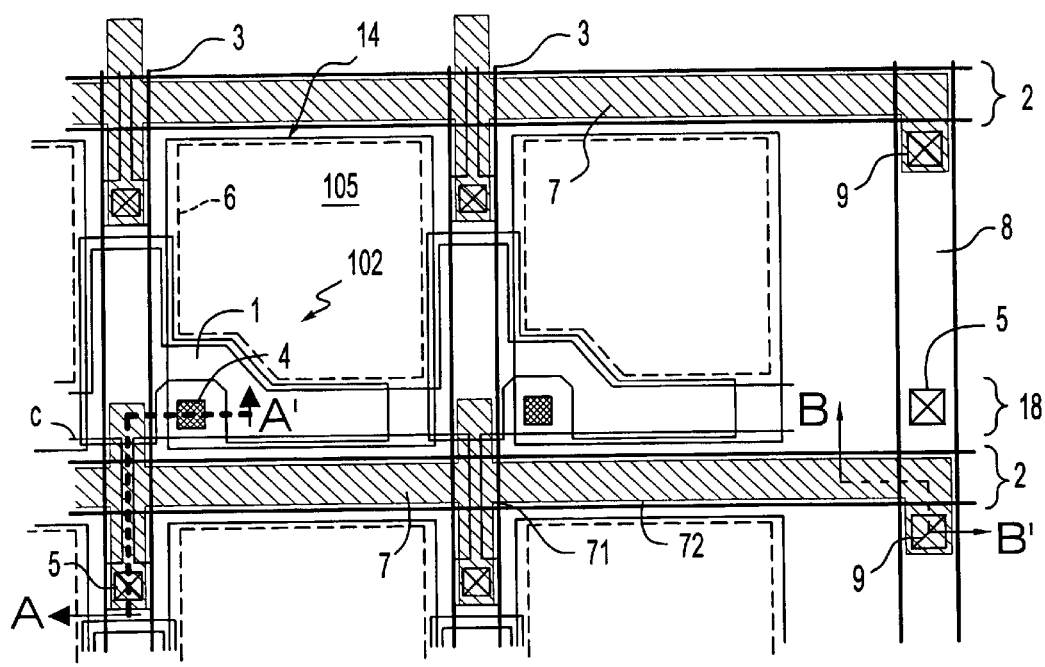
FIG. 6 is an enlarged plan view showing the periphery of two pixels formed at the end of the display region in the liquid crystal device substrate used for a liquid crystal device in accordance with Embodiment 1 of the present invention.
Figure 7:
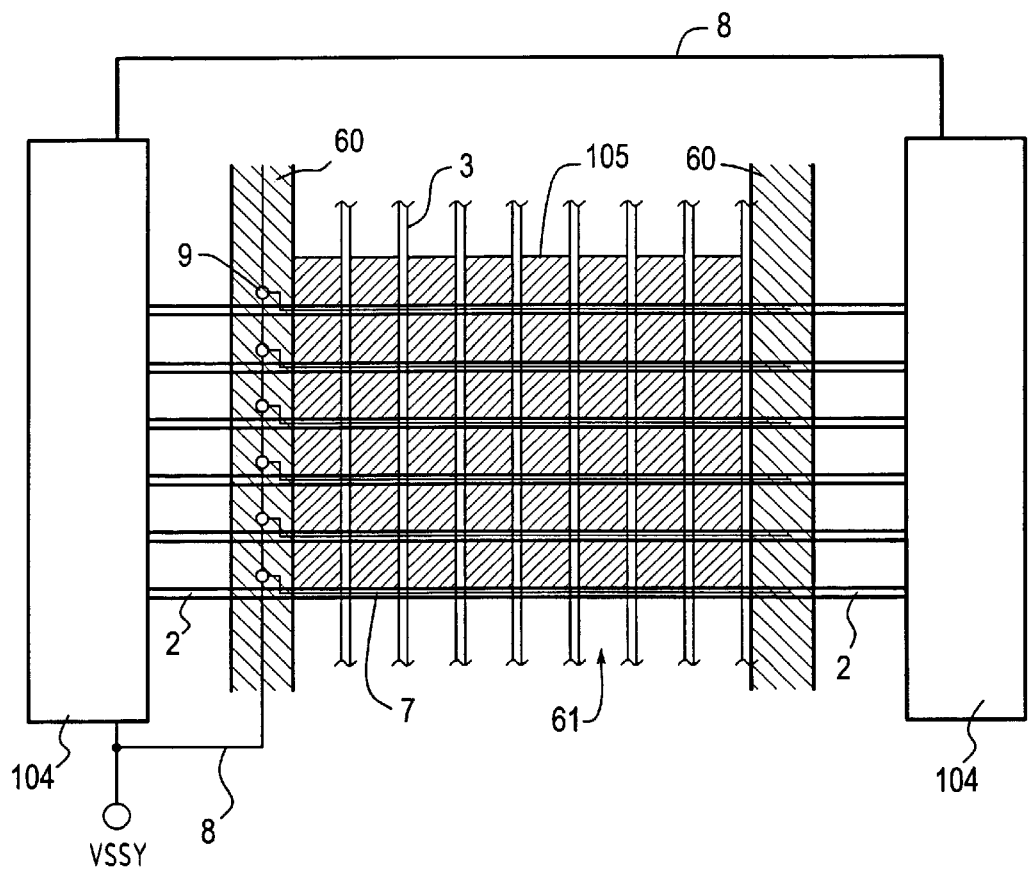
FIG. 7 is a drawing illustrating the wiring portion of a first light shielding film formed on the liquid crystal device substrate shown in FIG. 6 and a connection structure between the wiring portion and constant potential wiring.
Figure 8A:
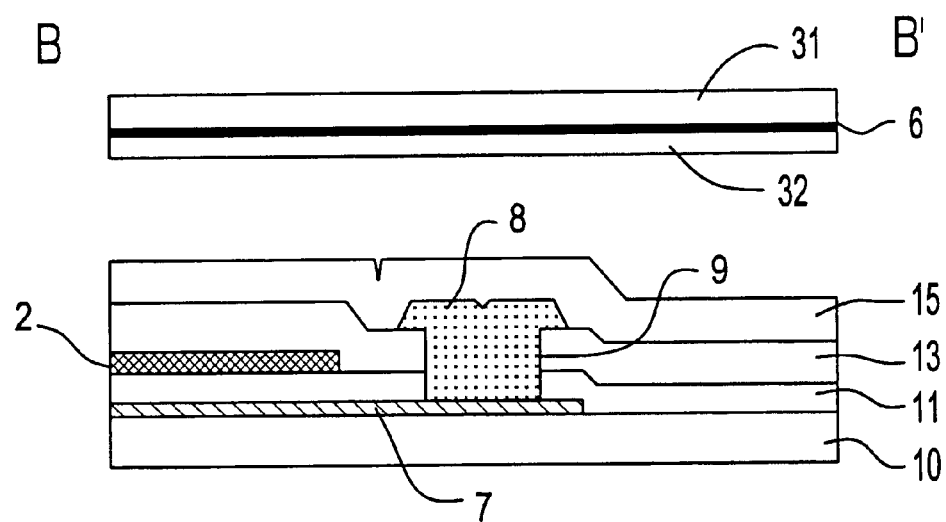
FIGS. 8(A) and (B) are a sectional view of the connection portion between the wiring of the first light shielding film and the constant potential wiring taken along line B–B' in FIG. 6, and an enlarged plan view of the connection portion between the wiring of the light shielding film and the constant potential wiring.
Figure 8B:
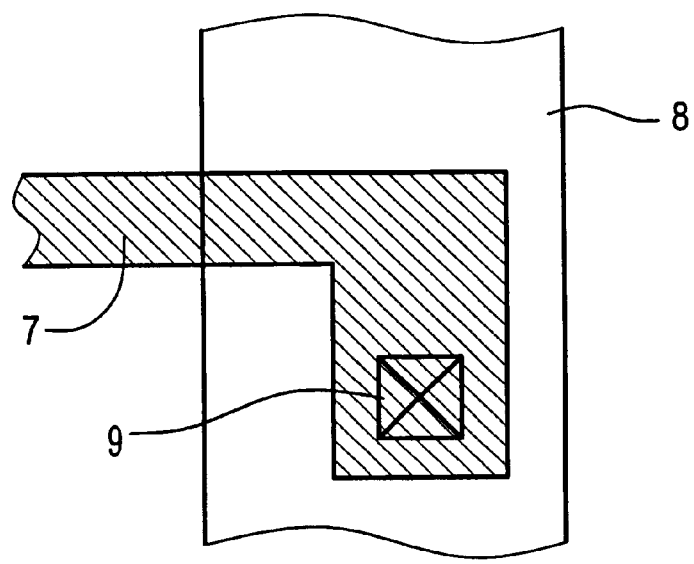

FIG. 6 is an enlarged plan view showing the periphery of two pixels formed at the end of the display region in the liquid crystal device substrate used in a liquid crystal device of this embodiment. FIG. 7 is a drawing illustrating the interconnecting portion (wiring) of the first light shielding film formed on the liquid crystal device substrate of this embodiment, and the structure of connection between the wiring and the constant potential wiring. FIGS. 8(A) and (B) are respectively a sectional view of the connection between the wiring of the first light shielding film and the constant potential wiring taken line in B–B' in FIG. 6, and an enlarged plan view of the connection between the wiring of the first light shielding film and the constant potential wiring.

As shown in FIG. 5, in the liquid crystal device substrate 300 of the liquid crystal device 100 of this embodiment, the first layer insulation film 11 is formed on the lower layer side of the pixel switching TFT 102, and a light shielding structure which will be described below is formed by utilizing the layer space between the layer insulation film 11 and the substrate 10.

In this embodiment, an opaque electrically conductive light shielding film 7 comprising a metallic film of tungsten, titanium, chromium, tantalum, molybdenum or the like, or a metal alloy film of a metal silicide containing one of these metals is formed in the layer space between the first layer insulation film 11 and the substrate 10 to overlap with at least the junctions between the channel region 1c and the low-concentration source and drain regions 1d and 1e, and the junctions between the low-concentration source and drain regions 1d and 1e and the high-concentration source and drain regions 1a and 1b of the pixel switching TFT 102. In this embodiment, since the first light shielding film 7 is not formed on the lower layer side of a portion of the high-concentration drain region 1b of the pixel switching TFT 102, the formation of the first light shielding film 7 causes a difference in height in the region where the TFT 102 is formed, thereby possibly making unstable the characteristics of the TFT 102. In this embodiment, therefore, the position of a difference in height is shifted to the high-concentration drain region 1b by 1 micron or more from the junction between the high-concentration drain region 1b and the low-concentration drain region 1e so as to minimize the effect of the difference in height on the characteristics of the TFT 102.

As seen from FIG. 6, the first light shielding film 7 comprises channel shielding portions 71 each of which overlaps with the channel region 1c on the lower layer side thereof, and wiring portions (wiring) 72 respectively extended from the channel shielding portions along the scanning lines 2 on the lower layer side of the scanning lines 2. In this embodiment, the width of the wiring of the first light shielding film 7 is set to be slightly smaller than the width of the scanning line 2 so as to prevent incident light (the light transmitted through the liquid crystal 108) from being cut off by the wiring of the first light shielding film 7 and the surface of the light shielding film 7 from being directly irradiated with light even if the formation position is shifted between the scanning line 2 and the wiring of the first light shielding film 7 due to deviation in mask alignment during mask alignment in the photolithographic step of the manufacturing process. FIG. 6 shows the positional relationship between the third light shielding film 6 formed on the opposite substrate 31 and each of the pixels 105, and display is carried out in the inside region of the third light shielding film 6 shown by a dotted line. As shown in FIGS. 6 and 7, the wiring of the first light shielding film 7 is extended along each of the scanning lines 2 to the lower layer side of the peripheral partitioning light shielding film 60 outside the display region 61. On the lower layer of the peripheral partitioning light shielding film 60 is arranged, along the display region 61, the constant potential wiring 8 for supplying the low-potential constant voltage power source VSSY to the scanning line driving circuits 104, one end of the wiring of the first light shielding film 7 being connected to the constant potential wiring 8. Therefore, since the first light shielding film 7 is connected to the constant potential wiring 8 for supplying the low-potential side constant voltage power source VSSY to the scanning line driving circuits 104, the first light shielding film 7 is fixed at the potential of the constant potential wiring 8, and is not in a floating state.

In this embodiment, in order to connect the wiring of the first light shielding film 7 and the constant potential wiring 8, the wiring is between the first layer insulation film 11 and the substrate 10, as shown in FIG. 8(A). Also, since the constant potential wiring 8 comprises the conductive film formed at the same time as the data lines 3, the constant potential wiring 8 is disposed between a second layer insulation film 13 and a third layer insulation film 15. Therefore, in this embodiment, the end of the wiring of the first light shielding film 7 is connected to the constant potential wiring 8 through the contact hole 9 formed in the first layer insulation film 11 and the second layer insulation film 13, as shown in FIGS. 6, 7, 8(A) and 8(B).

Such a connection structure corresponds to the case wherein the contact hole 9 for connecting the wiring of the first light shielding film 7 and the constant potential wiring 8 and the contact hole 5 (refer to FIG. 5) for connecting the source region of the pixel switching TFT 102 and the source electrode (the data line 3) are simultaneously formed, and the contact hole 9 is formed in one etching step. However, in order to simultaneously form the contact hole 5 and the contact hole 9, the first layer insulation film 11 is preferably sufficiently thinner than the second layer insulation film 13 so as to prevent etching of the polysilicon film in the portion of the high-concentration source region 1a of the pixel switching TFT 102 which corresponds to the contact hole 5.

In this way, in the liquid crystal device 100 of this embodiment, since the first light shielding film 7 (the channel shielding portion) is formed to overlap with at least the channel region 1c, the low-concentration source and drain regions 1d and 1e, and the junctions between the low-concentration source and drain regions 1d and 1e and the high-concentration source and drain regions 1a and 1b of the pixel switching TFT 102 on the lower layer side thereof through the first layer insulation film 11, light does not reach the channel region 1c of the pixel switching TFT 102 even if light is reflected from the back side of the liquid crystal device substrate 300. Therefore, in the liquid crystal device 100 of this embodiment, no leak current occurs due to the light reflected from the back side of the liquid crystal device substrate 300 in the TFT 102. Further, since the first light shielding film 7 is fixed at the potential of the constant voltage power source VSSY on the low-voltage side of the scanning line driving circuits 104, the TFT characteristics neither varies nor deteriorates due to the influence of the parasitic capacitance between the semiconductor layer 1 of the TFT 102 and the first light shielding film 7.

The surface of the first light shielding film 7 is preferably subjected to an antireflection treatment so as to prevent reflection of incident light (the light transmitted through the liquid crystal 108) by the surface of the first light shielding film 7 and irradiation of the pixel switching TFT 102.

In this embodiment, also the pixel switching TFT 102 is formed by utilizing the portion below the data line 3, as described above with reference to FIG. 4(B), and assumes the state wherein at least the channel region 1c, the low-concentration source and drain regions 1d and 1e, and the junctions between the low-concentration source and drain regions 1d and 1e and the high-concentration source and drain regions 1a and 1b of the pixel switching TFT 102 are covered with the data line 3. Therefore, the data line 3 functions as the second light shielding film for the pixel switching TFT 102 to form a structure in which the channel region 1c, the low-concentration source and drain regions 1d and 1e, and the junctions between the low-concentration source and drain regions 1d and 1e and the high-concentration source and drain regions 1a and 1b are vertically sandwiched between at least the first light shielding film 7 and the data line 3 (the second light shielding film). Further, the third light shielding film 6 described above with reference to FIG. 2 is formed to overlap with the data line 3 (the second light shielding film), to cover the channel region 1c, the low-concentration source and drain regions 1d and 1e, the junctions between the low-concentration source and drain regions 1d and 1e and the high-concentration source and drain regions 1a and 1b, and the first light shielding film 7 arranged below these regions. Therefore, the third light shielding film 6 functions as light shielding film for the pixel switching TFT 102, and exhibits a redundant function for the data line 3 serving as the second light shielding film. Thus, in the liquid crystal device substrate 300 of this embodiment, the TFT 102 produces no leak current due to the light reflected from the opposite substrate 31 side.

Although, in this embodiment, the LDD structure of the pixel switching TFT 102 has been described as an example, the present invention may be applied to an offset structure in which no impurity ion is introduced into regions corresponding to the low-concentration source and drain regions 1d and 1e. Such a LDD structure or offset structure TFT has the advantages of improving voltage resistance and decreasing the leak current in an off time. The present invention can, of course, be applied to a self alignment structure TFT in which the source and drain regions are formed by implanting high concentrations of impurity ions while the gate electrode (a portion of the scanning line 2) is masked.

Modified examples of the connection between the first light shielding film and the constant potential wiring, which will be described below, have the same configuration as the first embodiment. In these modified examples, the connection between the first light shielding film and the constant potential wiring is described, and description of the other portions is omitted.

(Modified Example 1 of Connection Between First Light Shielding Film and Constant Potential Wiring)

Figure 9A:
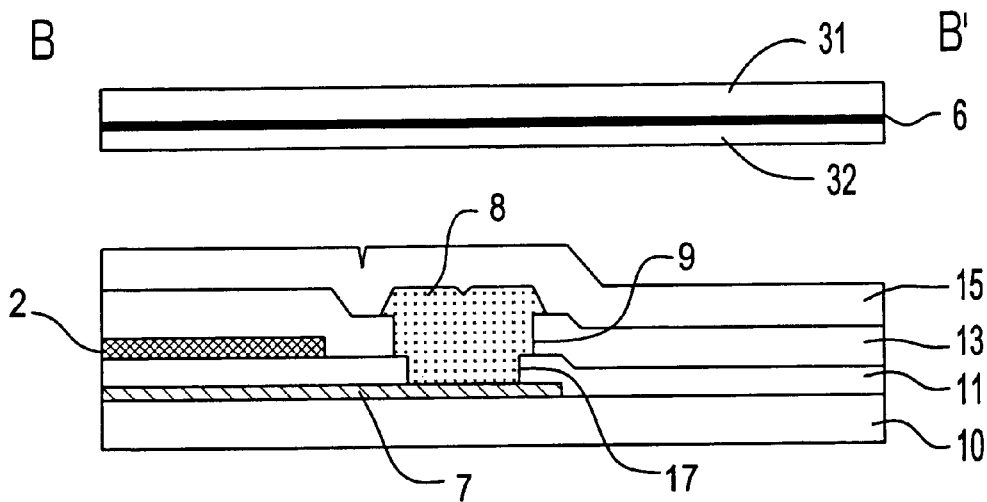
FIGS. 9(A) and (B) are a sectional view of Modified Example 1 of the connection portion between the wiring of the first light shielding film and the constant potential wiring corresponding to a sectional view taken along line B–B' in FIG. 6, and an enlarged plan view of the connection portion between the wiring of the light shielding film and the constant potential wiring.
Figure 9B:
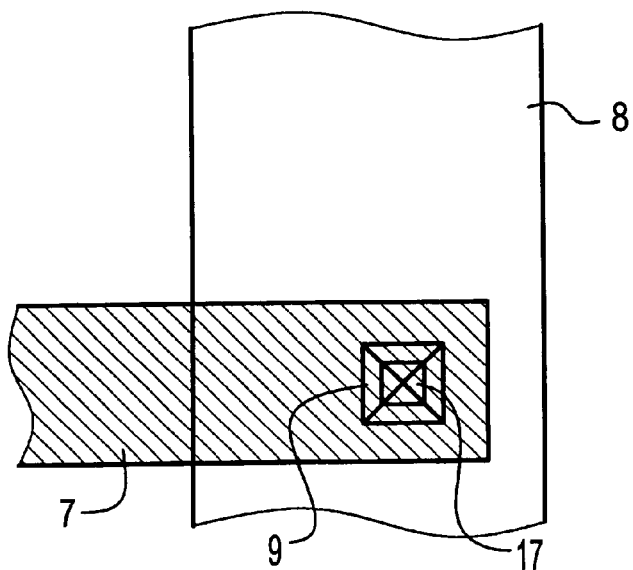

As shown in FIGS. 9(A) and 9(B), the wiring of the first light shielding film 7 between the first layer insulation film 11 and the substrate 10 and the constant potential wiring 8 between the second layer insulation film 13 and the third layer insulation film 15 may be connected by using contact holes 17 and 9 formed in the first layer insulation film 11 and the second layer insulation film 9, respectively. In the use of such a connection structure, the step of forming the contact hole 17 in the first layer insulation film 11 and the step of forming the contact hole 9 in the second layer insulation film 13 are separately carried out. Therefore, even when the first layer insulation film 11 is as thick as the unit of several thousands angstrom, as compared with the gate insulation film 12, either the contact hole 9 or 17 having substantially the same depth as the contact hole 5 (refer to FIG. 5) is formed at the same time that the contact hole 5 is formed for the high-concentration source region 1a of the pixel switching TFT 102, and thus the high-concentration source region 1a of the TFT 102 is not etched during formation of the holes.

(Modified Example 2 of Connection between First Light Shielding Film and Constant Potential Wiring)

Figure 10A:
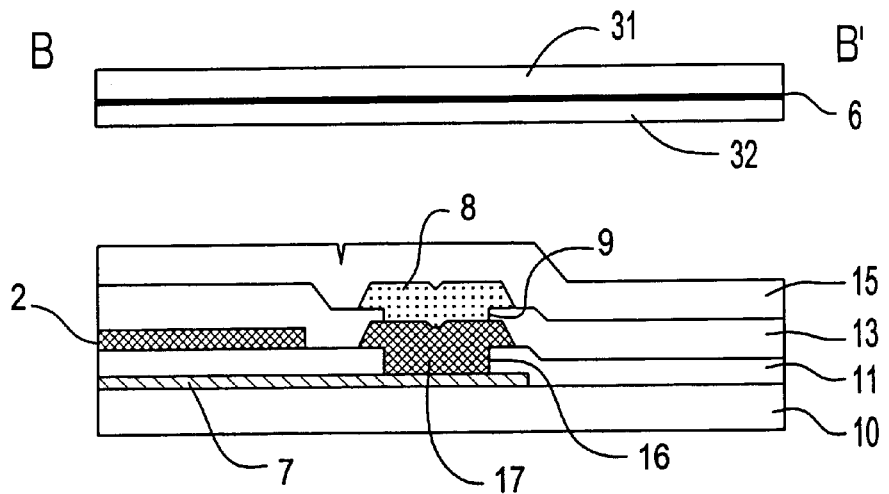
FIGS. 10(A) and (B) are a sectional view of Modified Example 2 of the connection portion between the wiring of the first light shielding film and the constant potential wiring corresponding to a sectional view taken along line B–B' in FIG. 6, and an enlarged plan view of the connection portion between the wiring of the light shielding film and the constant potential wiring.
Figure 10B:
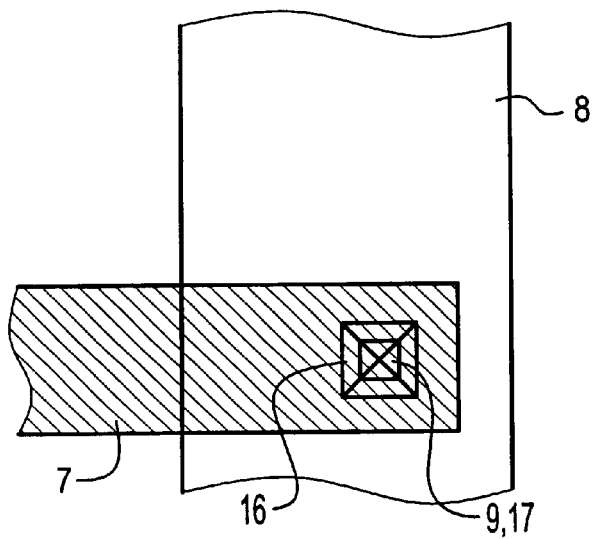

As shown in FIGS. 10(A) and 10(B), the wiring 72 of the first light shielding film 7 between the first layer insulation film 11 and the substrate 10 and the constant potential wiring 8 between the second layer insulation film 13 and the third layer insulation film 15 may be connected by using the contact hole 17 formed in the first layer insulation film 11, a junction electrode 16 connected to the wiring of the first light shielding film 7 through the contact hole 17, and the contact hole 9 formed at a position in the second layer insulation film 13 corresponding to the junction electrode 16. In this case, the junction electrode 16 is formed at the same time as the scanning lines 2 and the capacitance wiring 18.

(Modified Example 3 of Connection between First Light Shielding Film and Constant Potential Wiring)

Figure 11A:
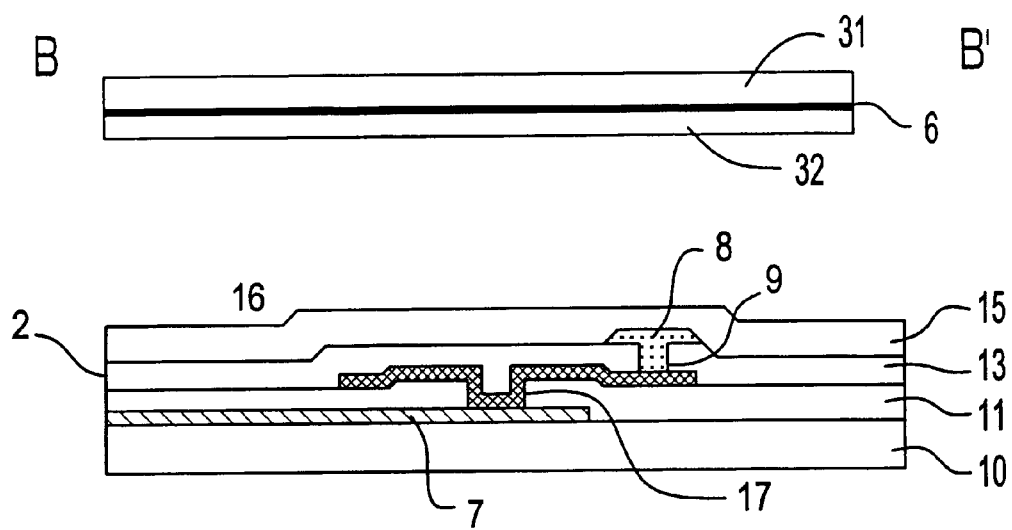
FIGS. 11(A) and (B) are a sectional view of Modified Example 3 of the connection portion between the wiring of the first light shielding film and the constant potential wiring corresponding to a sectional view taken along line B–B' in FIG. 6, and an enlarged plan view of the connection portion between the wiring of the light shielding film and the constant potential wiring.
Figure 11B:
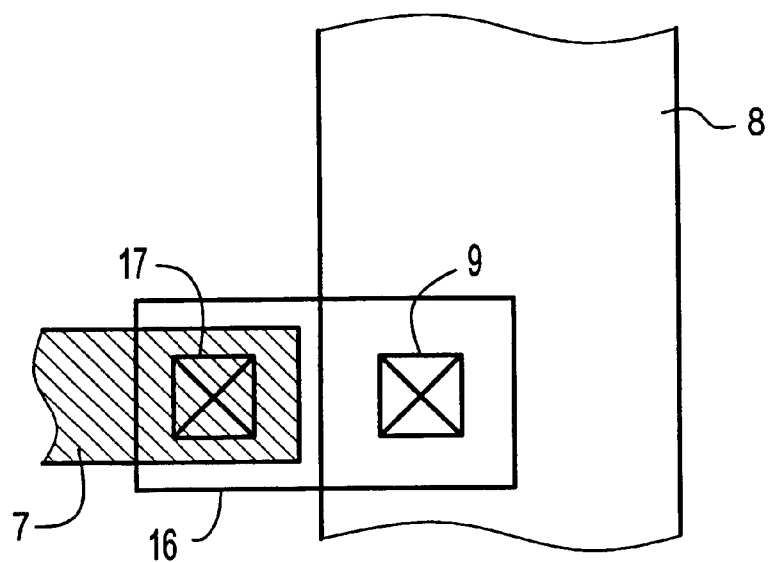

As shown in FIGS. 11(A) and 11(B), the wiring 72 of the first light shielding film 7 between the first layer insulation film 11 and the substrate 10 and the constant potential wiring 8 between the second layer insulation film 13 and the third layer insulation film 15 may be connected by using the contact hole 17 formed in the first layer insulation film 11, a relatively wide junction electrode 16 connected to the wiring of the first light shielding film 7 through the contact hole 17, and the contact hole 9 formed at a position in the second layer insulation film 13, which is deviated from the contact hole 17 in the region corresponding to the junction electrode 16. In this case, the junction electrode 16 is formed at the same time as the scanning line 2 and the capacitance wiring 18. [Modified Example 1 of Embodiment 1]

Although in the embodiment shown in FIG. 7, one end of the wiring of the first light shielding film 7 is connected to the constant potential wiring 8, both ends of the wiring 72 of the first light shielding film 7 may be led to the outside of the display region 61 along each of the scanning lines 2, and each of both ends may be connected to the constant potential wiring 8. In this case, since the first light shielding film 7 and the constant potential wirings 8 are formed between different layers, the wiring of the first light shielding film 7 and the constant potential wirings 8 are connected by the connection structure shown in FIGS. 8, 9, 10 or 11 which uses the contact hole 9, etc. Since the other configuration is the same as described above with reference to FIG. 6, description of the other configuration is omitted.

In this embodiment, since the lower layer sides of the channel region 1c, etc. of the pixel switching TFT 102 are covered with the channel shielding portions 71 of the first light shielding film 7, even if light is reflected from the back side of the liquid crystal device substrate 300, the reflected light does not reach the channel region 1c, etc. of the pixel switching TFT 102. Therefore, in the liquid crystal device 100 of this embodiment, no leak current due to the light reflected from the back side of the liquid crystal device substrate 300 occurs in the TFT 102. In addition, the first light shielding film 7 is connected to the constant potential wirings 8 for supplying the constant voltage power source VSSY on the low-potential side of the scanning line driving circuit 104, and is thus fixed at the potential of each of the constant potential wirings 8. Therefore, the TFT characteristics neither vary nor deteriorate due to the influence of the parasitic capacitance between the semiconductor layer 1 of the TFT 102 and the first light shielding film 7.

Further, in this embodiment, since both ends of the wiring of the first light shielding film 7 are respectively connected to the constant potential wirings, if the wiring is disconnected at an intermediate position thereof, a constant potential is supplied to the entirety of the first light shielding film 7. Therefore, the first light shielding film 7 comprises redundant wiring for the wiring thereof, and thus has high reliability. [Modified Example 2 of Embodiment 1]

Figure 12:
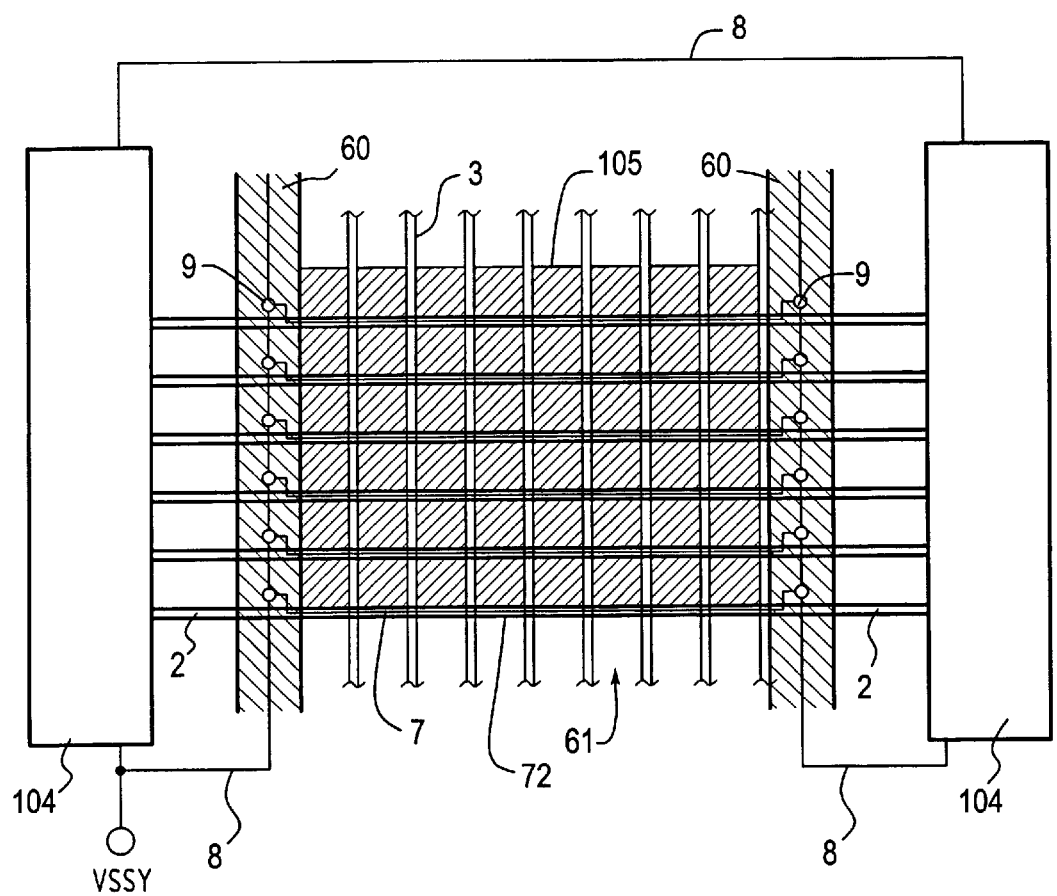
FIG. 12 is a drawing illustrating the wiring portion of a first light shielding film formed on the liquid crystal device substrate used in a liquid crystal device in accordance with Modified Example 1 of Embodiment 1 of the present invention, and a connection structure between the wiring portion and constant potential wiring.
Figure 13:
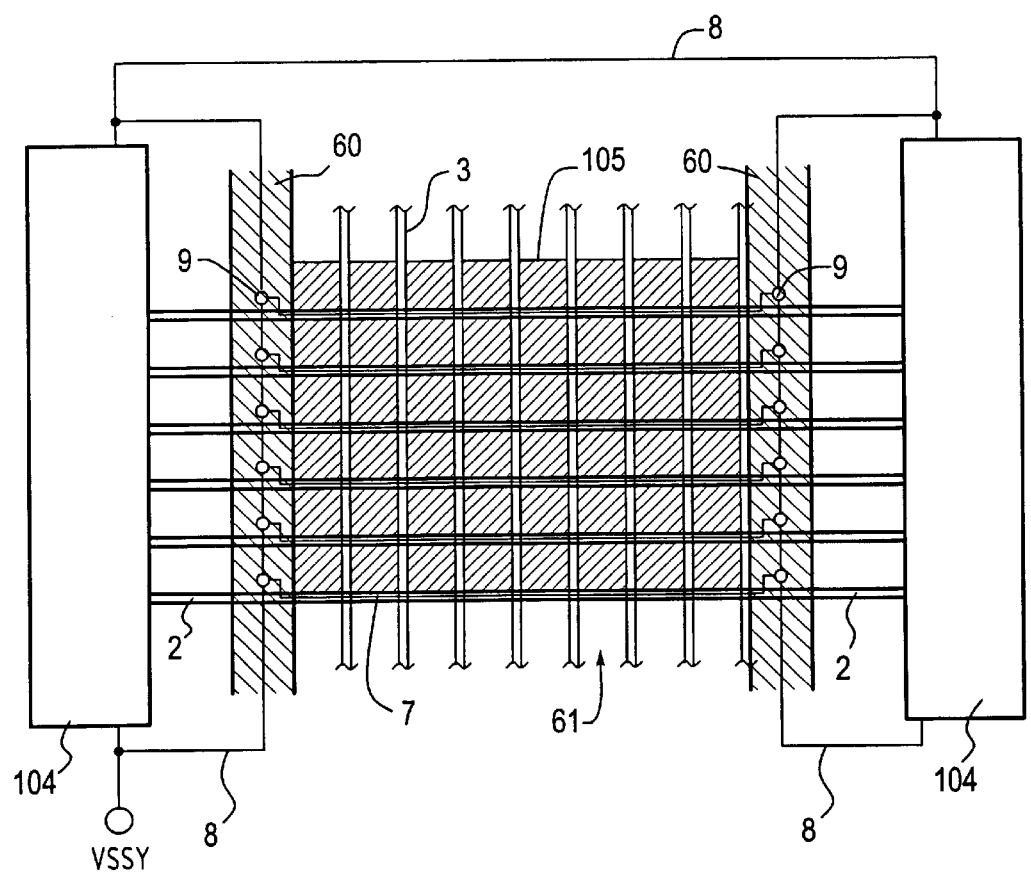
FIG. 13 is a drawing illustrating the wiring portion of a first light shielding film formed on the liquid crystal device substrate used in a liquid crystal device in accordance with Modified Example 2 of Embodiment 1 of the present invention, and a connection structure between the wiring portion and constant potential wiring.

Although, in the embodiment shown in FIG. 12, a constant potential is applied from one end of each of the two constant potential wirings 8, a constant potential is more preferably applied from both ends of each of the two constant potential wirings 8, as shown in FIG. 13. In this configuration, the constant potential wirings for applying a constant potential to the first light shielding film 7 also comprise redundant wirings. The other configuration is the same as Embodiment 1 and Modified Example 1 thereof, and thus description of the other configuration is omitted.

[Modified Example 3 of Embodiment 1]

Figure 14:
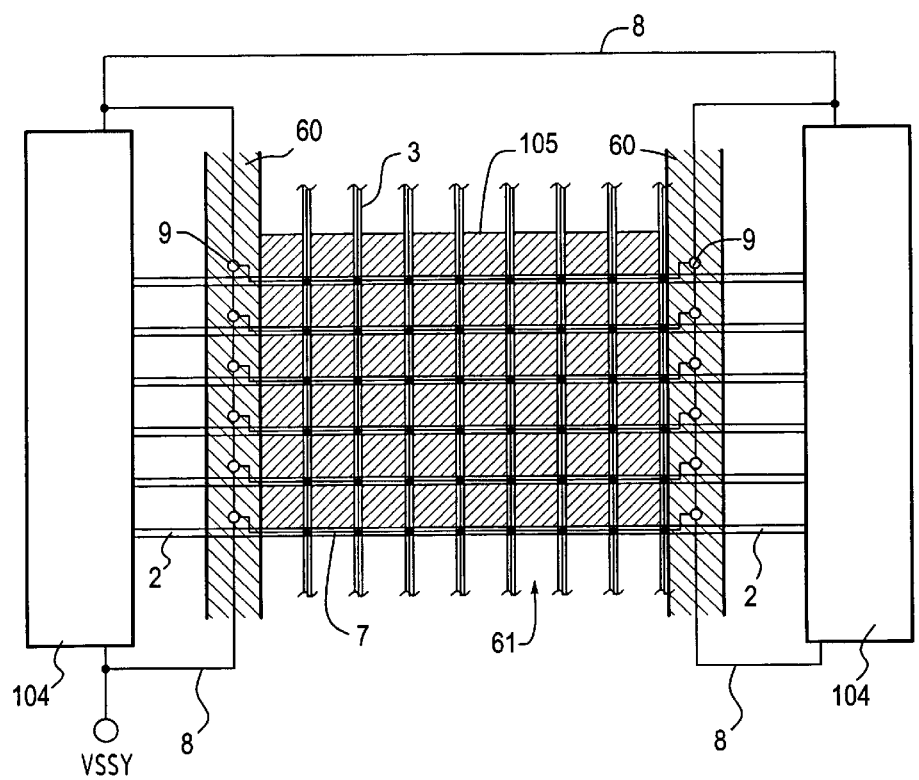
FIG. 14 is a drawing illustrating the wiring portion of a first light shielding film formed on the liquid crystal device substrate used in a liquid crystal device in accordance with Modified Example 3 of Embodiment 1 of the present invention, and a connection structure between the wiring portion and constant potential wiring.

Since the basic configuration of this embodiment is the same as Embodiment 1 and Modified Examples 1 and 2 thereof, description of common portions is omitted. In this example, the wiring 72 of the first light shielding film 7 is formed in a lattice form along both the scanning lines 2 and the data lines 3, as shown in FIG. 14. Therefore, the resistance of the first light shielding film 7 is further reduced, and redundancy is enhanced. Also the first light shielding film 7 overlaps with the third light shielding film 6 (refer to FIG. 2) of the opposite substrate 31. Therefore, the first light shielding film 7 exhibits a redundant function for the third light shielding film 6 of the opposite substrate 31, and permits omission of the third light shielding film 6 of the opposite substrate 31.

In such a configuration, in the wiring of the first light shielding film 7, both ends of a portion extended along each of the scanning lines 2 may be extended to the outside of the display region 61, and connected to the constant potential wirings 8 by the connection structure shown in FIGS. 8, 9, 10 or 11, which uses the contact hole 9, etc., in the region which overlaps with the peripheral partitioning light shielding film 60.

In Embodiment 1 shown in FIGS. 7, 12, 13 and 14, the wiring 72 of the first light shielding film 7 connected to the constant potential wiring 8 by the connection structure (shown in FIGS. 8, 9, 10 or 11) using the contact hole 9, etc. is formed independently below each of the scanning lines 2. The wiring portions 72 of the first light shielding film 7 are extended so that the extended wiring portions of the first light shielding film 7 are electrically connected by using the same conductive film as the first light shielding film 7 comprising a metallic film or a metal alloy film of a metal silicide or the like containing a metal, which is formed in the same step as the first light shielding film 7. In such connection, a redundant function is exhibited when the wiring is disconnected, and the resistance of the first light shielding film 7 can be advantageously decreased.

[Embodiment 2]

Figure 15:
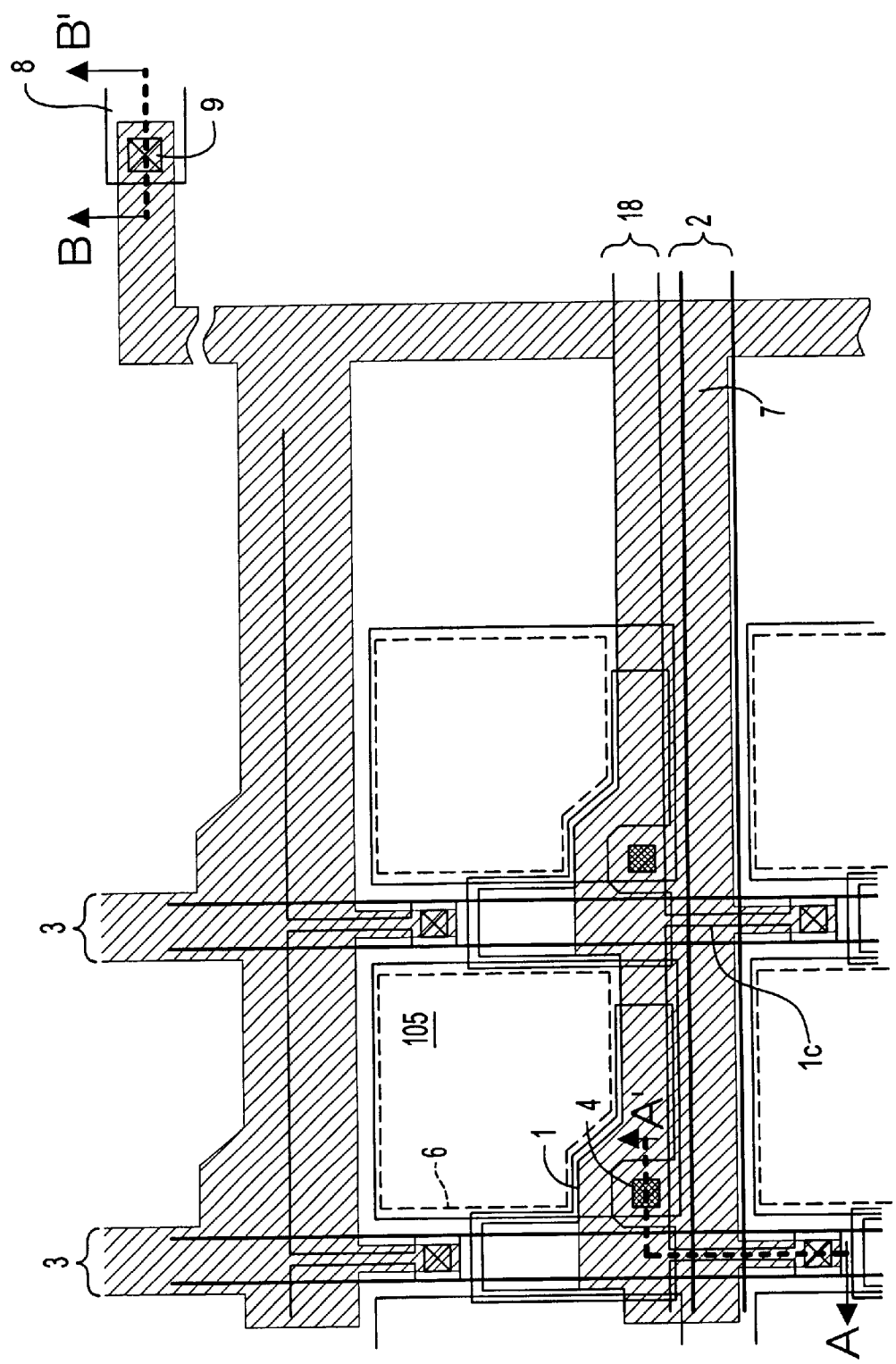
FIG. 15 is an enlarged plan view showing the periphery of two pixels formed at the end of the display region in the liquid crystal device substrate used in a liquid crystal device in accordance with Embodiment 2 of the present invention.
Figure 16:
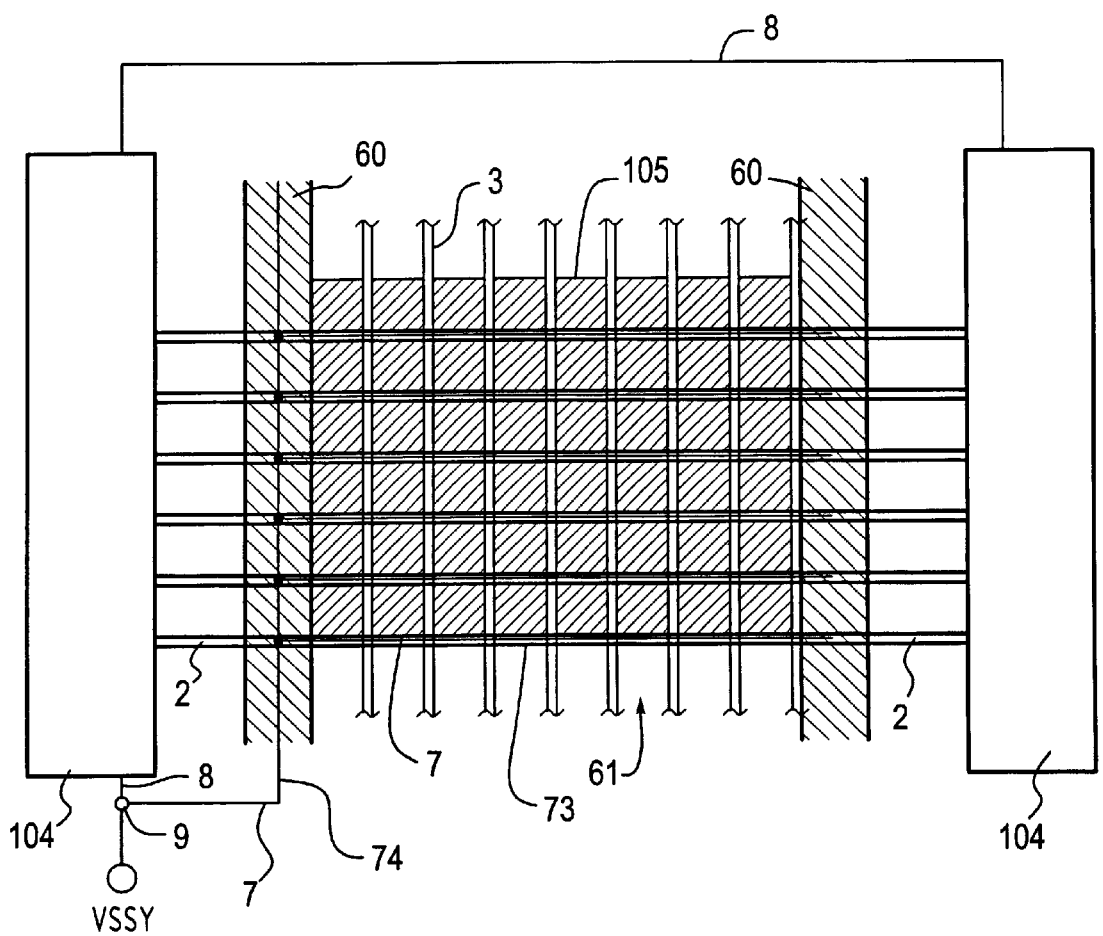
FIG. 16 is a drawing illustrating the wiring portion of a first light shielding film formed on the liquid crystal device substrate shown in FIG. 15 and a connection structure between the wiring portion and constant potential wiring.

FIG. 15 is an enlarged plan view showing the periphery of two pixels formed at the end of the display region in a liquid crystal display substrate used in a liquid crystal device of this embodiment. FIG. 16 is a drawing illustrating the wiring of the first light shielding film formed on the liquid crystal device substrate of this embodiment, and the structure of connection between the wiring and the constant potential wiring. The basic configuration of the liquid crystal device substrate 300 of this embodiment is the same as that described with reference to FIGS. 1 to 5. Here, the light shielding structure formed in the liquid crystal device substrate 300, and the structure of connection between the light shielding film which constitutes the light shielding structure, and the constant potential wiring are mainly described. Since the basic configuration of the liquid crystal device substrate of the liquid crystal device of this embodiment is the same as the liquid crystal device substrate of the liquid crystal device of Embodiment 1, portions having the same functions are denoted by the same reference numerals, and description thereof is omitted.

This embodiment has a basic configuration in which the opaque conductive light shielding film 7 comprising a metallic film of tungsten, titanium, chromium, tantalum, molybdenum, or the like, or a metal alloy film of a metal silicide or the like containing one of these metals is formed between the first layer insulation film 11 and the substrate 10 so as to overlap with at least the channel region 1c, the low-concentration source and drain regions 1d and 1e, and the junctions between the low-concentration source and drain regions 1d and 1e and the high-concentration source and drain regions 1a and 1b of the pixel switching TFT 102, as described above with reference to FIG. 5.

The first light shielding film 7 comprises a channel shielding portion 71 which overlaps with the channel region 1c on the lower layer side thereof, and a wiring portion 72 extended from the channel shielding portion along each of the scanning lines 2 on the lower layer side thereof, for applying a constant voltage to the channel shielding portion.

In this embodiment, the wiring 72 of the first light shielding film 7 comprises branches 73 extended to the outside of the peripheral partitioning light shielding film 60 from the display region 61 along each of the scanning lines 2, and a trunk 74 for connecting the ends of the branches on one side thereof. The trunk 74 is at a position where it overlaps with the peripheral partitioning light shielding film 60 formed between the display region 61 and the scanning line driving circuits 104. In this embodiment, one end of the trunk (wiring) 74 of the first light shielding film 7 overlaps with the constant potential wiring for supplying the low-voltage power source VSSY on the low voltage side of the scanning line driving circuits 104, and the wiring (trunk) 74 of the first light shielding film 7 is connected to the constant potential wiring 8 in the overlap portion. Therefore, the first light shielding film 7 is connected to the constant potential wiring 8 for supplying the constant voltage power source VSSY on the low-voltage side of the scanning line driving circuits 104, and is thus fixed at the potential of the constant potential wiring 8 and not in the floating state.

Since the wiring (trunk) 74 of the first light shielding film 7 is between the first layer insulation film 11 and the substrate 10, as shown in FIG. 5, and the constant potential wiring 8 is between the second layer insulation film 13 and the third layer insulation film 15, the wiring (trunk) 74 of the first light shielding film 7 and the constant potential wiring 8 are connected by the connection structure shown in FIGS. 8, 9, 10 or 11, which uses the contact holes 9, etc. The other configuration is substantially the same as Embodiment 1, and thus description thereof is omitted.

In the liquid crystal device 100 constructed as described above, like Embodiment 1, since the first light shielding film 7 is formed to overlap with the channel region 1c, etc. of the pixel switching TFT 102, even if light is reflected from the back side of the liquid crystal device substrate 300, the light does not reach at least the channel region 1c, etc. of the pixel switching TFT 102. Therefore, in the pixel switching TFT 102. no leak current occurs due to the light reflected from the back side of the liquid crystal device substrate 300. Since the first light shielding film 7 is also connected to the constant potential wiring 8 for supplying the constant voltage power source VSSY on the low potential side of the scanning line driving circuits 104, the first light shielding film 7 is fixed at the potential of the constant potential wiring 8. Therefore, the same effect as Embodiment 1 is exhibited, i.e., the TFT characteristics neither vary nor deteriorate due to the influence of the parasitic capacitance between the semiconductor layer 1 of the TFT 102 and the first light shielding film 7.

Further, in this embodiment, the wiring 72 of the first light shielding film 7 comprises a branch 73 extended along each of the scanning lines 2, and a trunk 74 for connecting the ends of the branches, and the wiring 72 of the first light shielding film 7 is connected to the constant potential wiring through the trunk 74. Therefore, connection between the first light shielding film 7 and the constant potential wiring 8 need not be performed for each of the branches, and the connection may be performed between the trunk 74 and the constant potential wiring 8. Thus, the trunk 74 can be led to any desired position without wiring, and the first light shielding film 7 and the constant potential wiring 8 can be connected at this position. Also wet etching for forming the contact hole 9 for connecting the first light shielding film 7 and the constant potential wiring 8 easily produces cracks in the layer insulation film due to penetration of the etching solution used. However, this embodiment has the advantage that the trunk 74 can be led to any desired position, and a portion where the cracks might occur can be limited to a safe position. There is also the advantage that since the first light shielding film 7 and the constant potential wiring 8 are connected by connecting the trunk 74 and the constant potential wiring 8, the portion where the cracks might occur is limited to a single position, thereby increasing reliability.

This embodiment may be applied to a configuration in which the contact hole 9 for connecting the first light shielding film 7 and the constant potential wiring is formed by dry etching.

[Modified Example 1 of Embodiment 2]

Although, in the embodiment shown in FIG. 16, one end of each of the branches 73 of the wiring of the first light shielding film 7 is connected to the trunk, both ends of each of the branches 73 may be led to the outside of the display region 61 along each of the scanning lines 2 and connected to trunks. In this case, since the first light shielding film 7 and the constant potential wirings 8 are formed between different layers, the trunks 74 of the wiring 72 of the first light shielding film 7 and the constant potential wirings 8 are connected at two positions by the connection structure shown in FIGS. 8, 9, 10 or 11 which uses the contact holes 9, etc. Since the other configuration is the same as described above with reference to FIG. 15, description of the other configuration is omitted.

In such configuration, since the lower layer side of the channel region 1c of the pixel switching TFT 102 is covered with the first light shielding film 7, even if light is reflected from the back side of the liquid crystal device substrate 300, the reflected light does not reach the channel region 1c of the pixel switching TFT 102. Therefore, in the liquid crystal device 100 of this embodiment, no leak current occurs due to the light reflected from the back side of the liquid crystal device substrate 300 in the TFT 102. In addition, the first light shielding film 7 is connected to the constant potential wirings 8 for supplying the constant voltage power source VSSY on the low-potential side of the scanning line driving circuits 104, and is thus fixed at the potential of each of the constant potential wirings 8. Therefore, the TFT characteristics neither vary nor deteriorate due to the influence of the parasitic capacitance between the semiconductor layer 1 of the TFT 102 and the first light shielding film 7.

In this embodiment, only two trunks 74 are connected to the constant potential wirings 8, and thus connection between the first light shielding film 7 and the constant potential wiring 8 need not be performed for each of the branches 73. Therefore, the same effect as Embodiment 2 is exhibited, i.e., the trunk 74 may be led to any desired position such as a position adjacent to each of the scanning line driving circuits 104, where no wiring is provided, and the first light shielding film 7 and the constant potential wirings may be connected at two positions.

Further, in the wiring of the first light shielding film 7, since both ends of each of the branches 73 are respectively connected to the two trunks 74, if each of the branches 73 is disconnected at an intermediate position thereof, a constant potential is supplied from the trunks 74. Therefore, the first light shielding film 7 comprises redundant wiring for the wiring 72 thereof, and thus has high reliability.

[Modified Example 2 of Embodiment 2]

Figure 17:
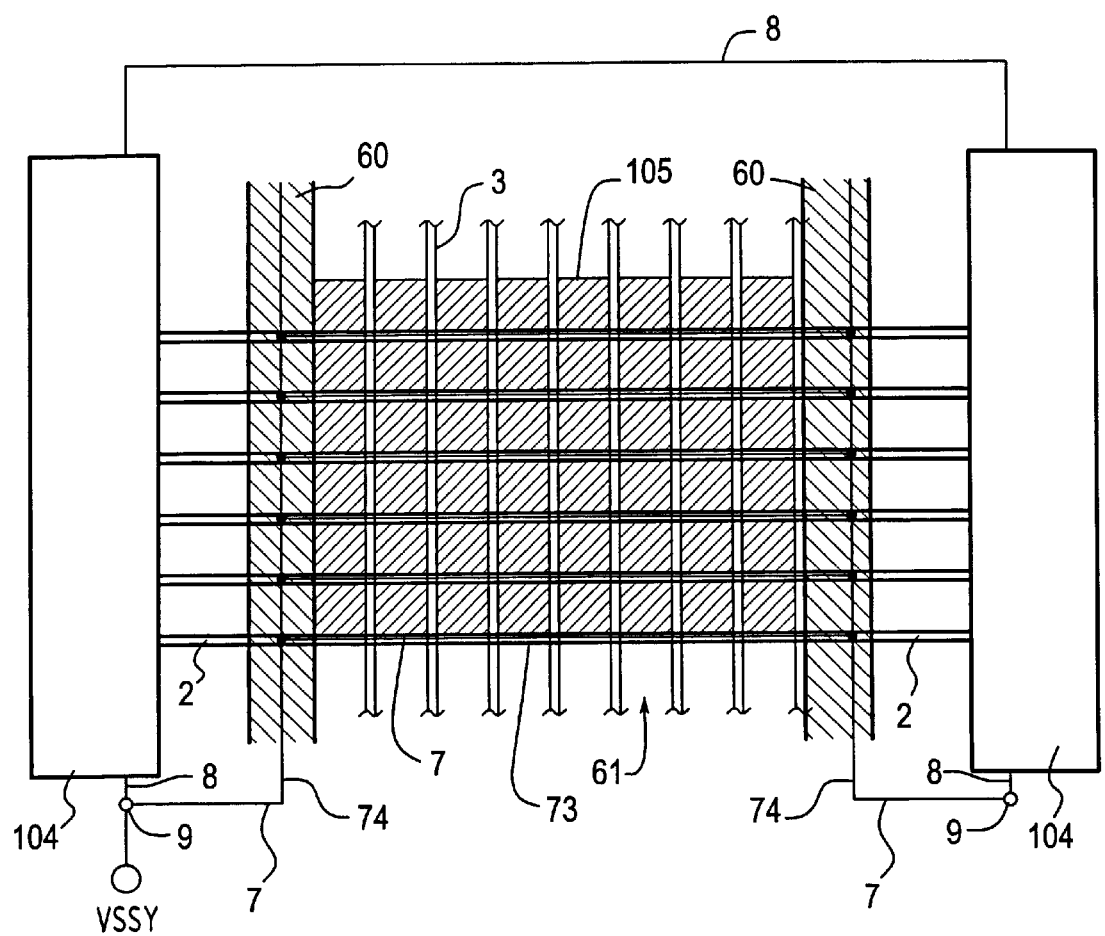
FIG. 17 is a drawing illustrating the wiring portion of a first light shielding film formed on the liquid crystal device substrate used in a liquid crystal device in accordance with Modified Example 1 of Embodiment 2 of the present invention, and a connection structure between the wiring portion and constant potential wiring.
Figure 18:
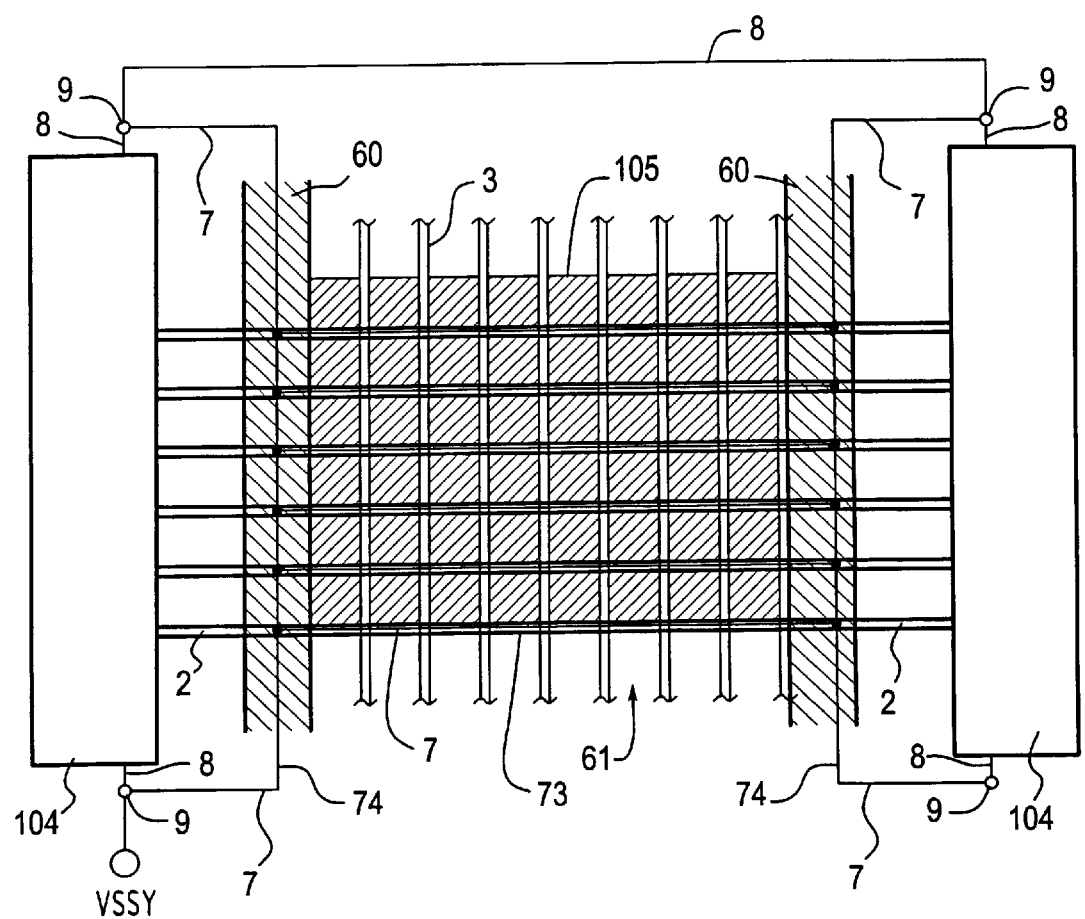
FIG. 18 is a drawing illustrating the wiring portion of a first light shielding film formed on the liquid crystal device substrate used in a liquid crystal device in accordance with Modified Example 2 of Embodiment 2 of the present invention, and a connection structure between the wiring portion and constant potential wiring.

Although, in the embodiment shown in FIG. 17, one end of each of the two trunks 74 is connected to the constant potential wiring 8, both ends of each of the two trunks 74 are preferably connected to the constant potential wirings 8, as shown in FIG. 18. In this configuration, the trunks for applying a constant potential to each of the branches 73 of the first light shielding film 7 also comprise redundant wirings. The other configuration is the same as Embodiment 2 and Modified Example 2 thereof, and thus description of the other configuration is omitted.

[Modified Example 3 of Embodiment 2]

Figure 19:
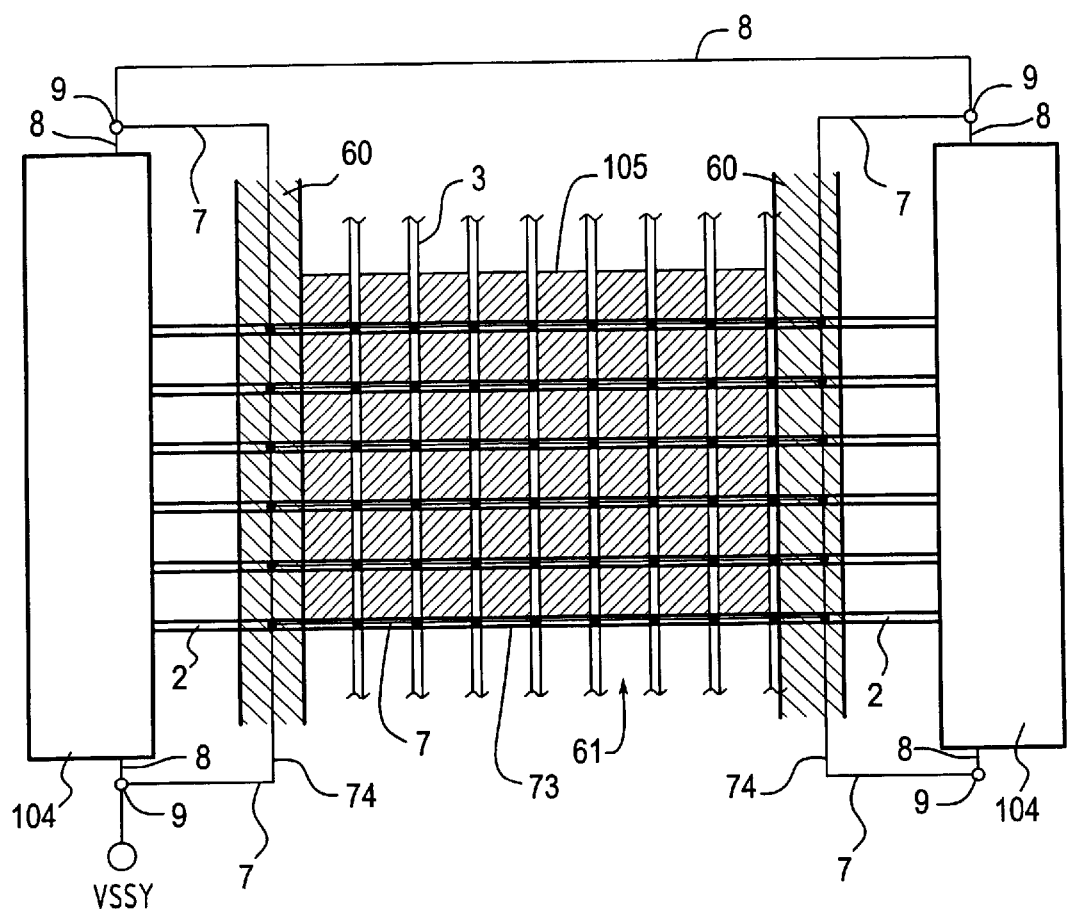
FIG. 19 is a drawing illustrating the wiring portion of a first light shielding film formed on the liquid crystal device substrate used in a liquid crystal device in accordance with Modified Example 3 of Embodiment 2 of the present invention, and a connection structure between the wiring portion and constant potential wiring.

Since the basic configuration of this embodiment is the same as Embodiment 2 and Modified Examples 1 and 2 thereof, description of common portions is omitted. In this example, the wiring 72 of the first light shielding film 7 is formed in a lattice form along both the scanning lines 2 and the data lines 3, as shown in FIG. 19. Therefore, the resistance of the first light shielding film 7 is further reduced, and redundancy is increased. Also the first light shielding film 7 overlaps with the third light shielding film 6 (refer to FIGS. 2 and 15) of the opposite substrate 31. Therefore, the first light shielding film 7 exhibits a redundant function for the third light shielding film 6 of the opposite substrate 31, and permits omission of the third light shielding film 6 of the opposite substrate 31.

In such a configuration, of the branches 73 of the wiring 72 of the first light shielding film 7, both ends of a portion extended along each of the scanning lines 2 may be extended to the outside of the display region 61, and connected by the trunks in regions which overlap with the peripheral partitioning light shielding film 60. In Embodiment 2, the constant potential wiring may be extended to the peripheral partitioning light shielding film 60 to be connected with the first light shielding film 7 in the corner regions of the peripheral partitioning light shielding film 60. Further, in Embodiments 1 and 2, only one lead to be electrically connected to an external IC may be provided for supplying a constant potential signal (for example, VSSY) to the constant potential wiring, or at least two leads may be provided so as to be short circuited in the liquid crystal device substrate, thereby decreasing wiring resistance and forming a redundant structure.

[Embodiment 3]

Figure 20:
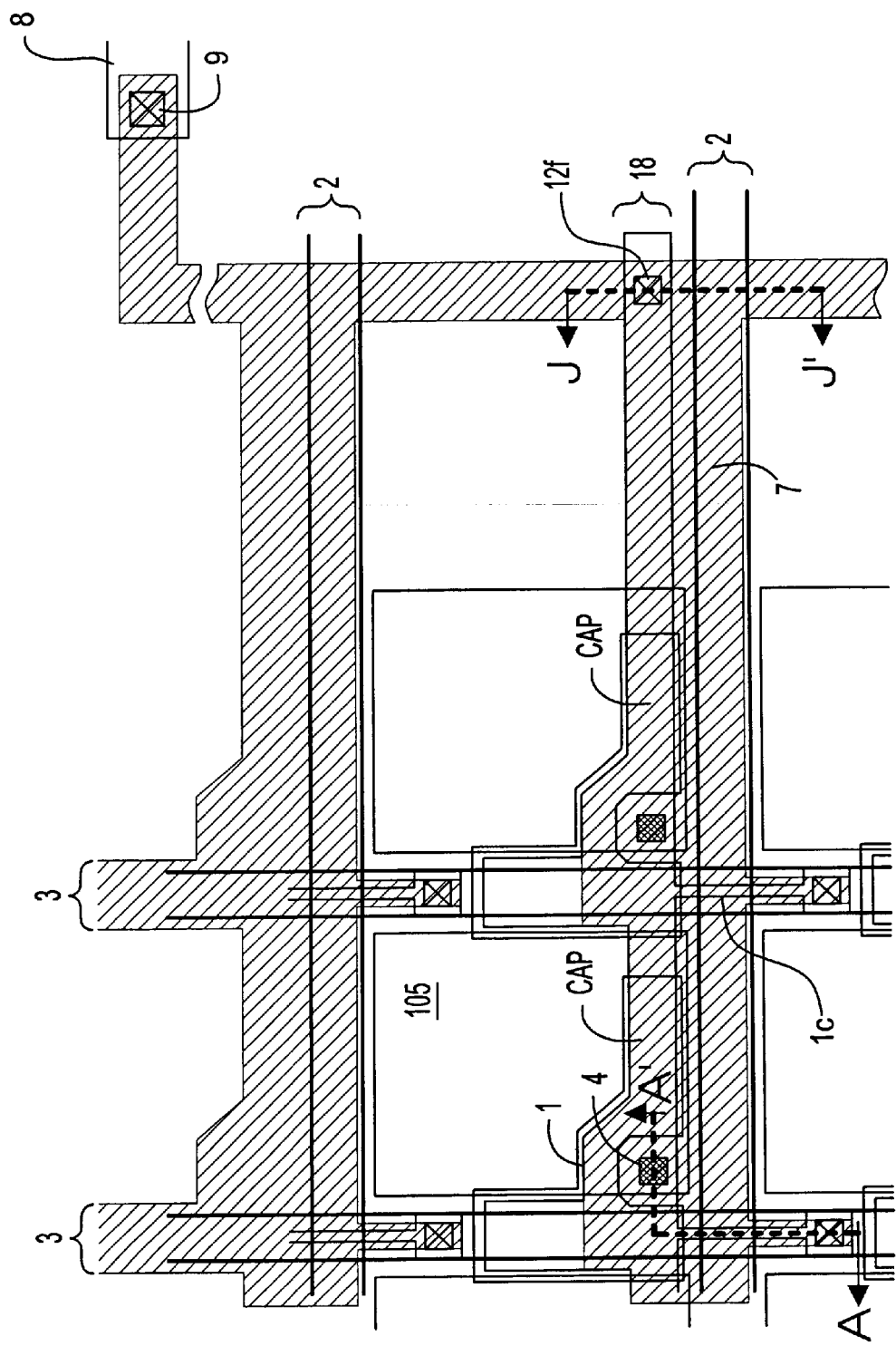
FIG. 20 is an enlarged plan view showing the periphery of two pixels formed at the end of the display region in the liquid crystal device substrate used in a liquid crystal device in accordance with Embodiment 3 of the present invention.
Figure 21:
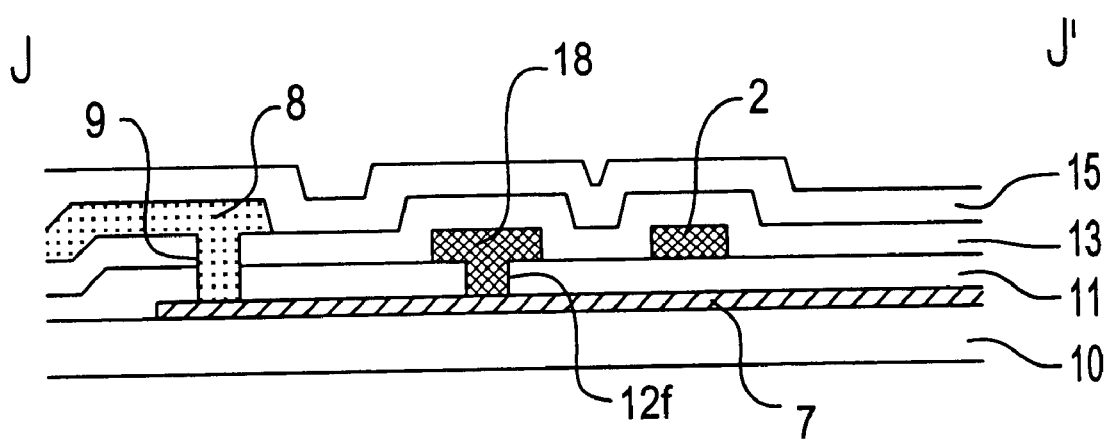
FIG. 21 is a sectional view taken along line J–J' in FIG. 20.

FIG. 20 is an enlarged plan view showing the periphery of two pixels formed at the end of the display region in a liquid crystal display substrate used in a liquid crystal device of this embodiment. FIG. 21 is a sectional view taken along line J–J' in FIG. 20. The basic configuration of the liquid crystal device substrate 300 of this embodiment is the same as that described with reference to FIGS. 1 to 5. Here, the structure of connection between the light shielding film which constitutes the light shielding structure of the liquid crystal device substrate 300 and the constant potential wiring 18 is mainly described. Since the basic configuration of the liquid crystal device substrate of the liquid crystal device of this embodiment is the same as the liquid crystal device substrate of the liquid crystal device of Embodiments 1 and 2, portions having the same functions are denoted by the same reference numerals, and description thereof is omitted.

In this embodiment, as shown in FIG. 20, the first light shielding film 7 comprises channel shielding portions 71 each of which overlaps with the channel region 1c, and wiring portions 72 respectively extended from the channel shielding portions along the scanning lines 2 on the lower layer side thereof, for applying a constant voltage to the channel shielding portions. The wiring portions 72 of the first light shielding film 7 comprise branches 73 extended from the display region 61 along the scanning lines 2 to a position which overlaps with the peripheral partitioning light shielding film 60, and a trunk 74 for connecting the ends of the branches 73. The trunk 74 is overlapped with the constant potential wiring 8 for supplying the constant voltage power source VSSY on the low potential side of the scanning line driving circuits 104, and the wiring (trunk) 74 of the first light shielding film 7 is connected to the constant potential wiring 8 in the overlap portion through the contact hole 9 shown in FIGS. 8, 9, 10 or 11.

In each of the pixels 15 is formed a capacitance wiring 18 in parallel with the scanning line 2, and the first light shielding film 7 is formed to overlap with the scanning line 2 and the capacitance wiring 18. Therefore, in this embodiment, the capacitance wiring 18 is connected to the trunk of the first light shielding film 7 through the contact hole 12f formed in the first layer insulation film 11, not extended to the scanning line driving circuits 104, as shown in FIG. 21.

In this configuration, since the constant voltage power source VSSY on the low potential side of the scanning line driving circuits 104 is supplied to the first light shielding film 7 through the constant potential wiring 8, the constant voltage power source VSSY is also supplied to the capacitance wiring 18 through the trunk 74 of the first light shielding film 7. Therefore, a constant potential need not be supplied to each capacitance wiring 18 in the scanning line driving circuits 104, and the wiring density and the number of the contact holes in the scanning line driving circuits 104 are thus decreased. There is thus the advantage that a large scale circuit can be introduced into the scanning line driving circuit 104. There is also the advantage that it is unnecessary to provide a lead and executive wiring for supplying a constant potential to the capacitance wiring from the outside.

FIG. 21 shows the state wherein the trunk 74 of the first light shielding film 7 and the constant potential wiring 18 are connected by using the contact hole 9 formed in the first layer insulation film 11 and the second layer insulation film 13, as described above with reference to FIG. 8(A). However, the trunk 74 of the first light shielding film 7 and the constant potential wiring 8 may be connected by using the connection structure described above with reference to FIGS. 8, 9, 10 or 11.

[Embodiment 4]

Figure 22:
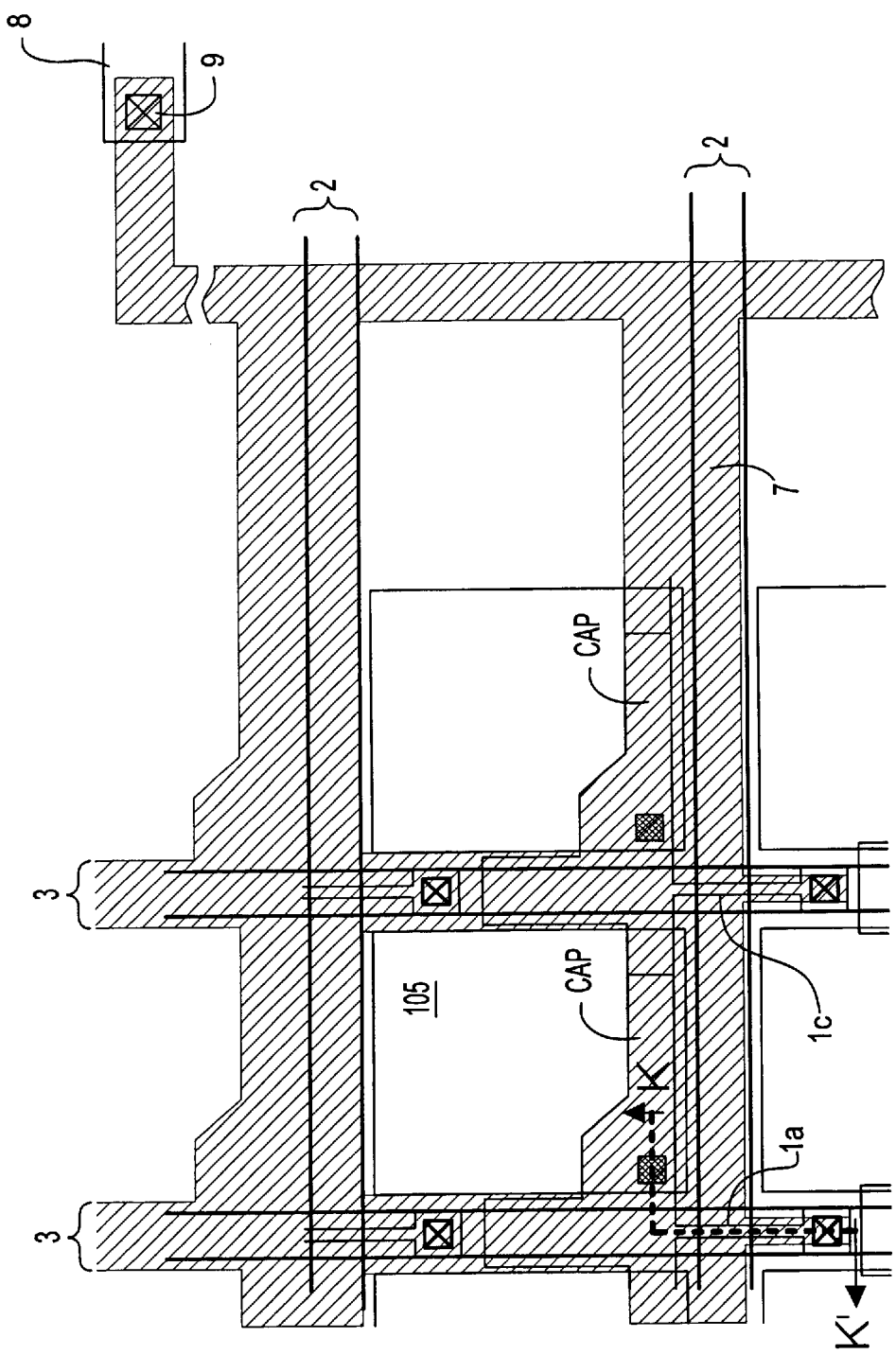
FIG. 22 is an enlarged plan view showing the periphery of two pixels formed at the end of the display region in the liquid crystal device substrate used in a liquid crystal device in accordance with Embodiment 4 of the present invention.
Figure 23:
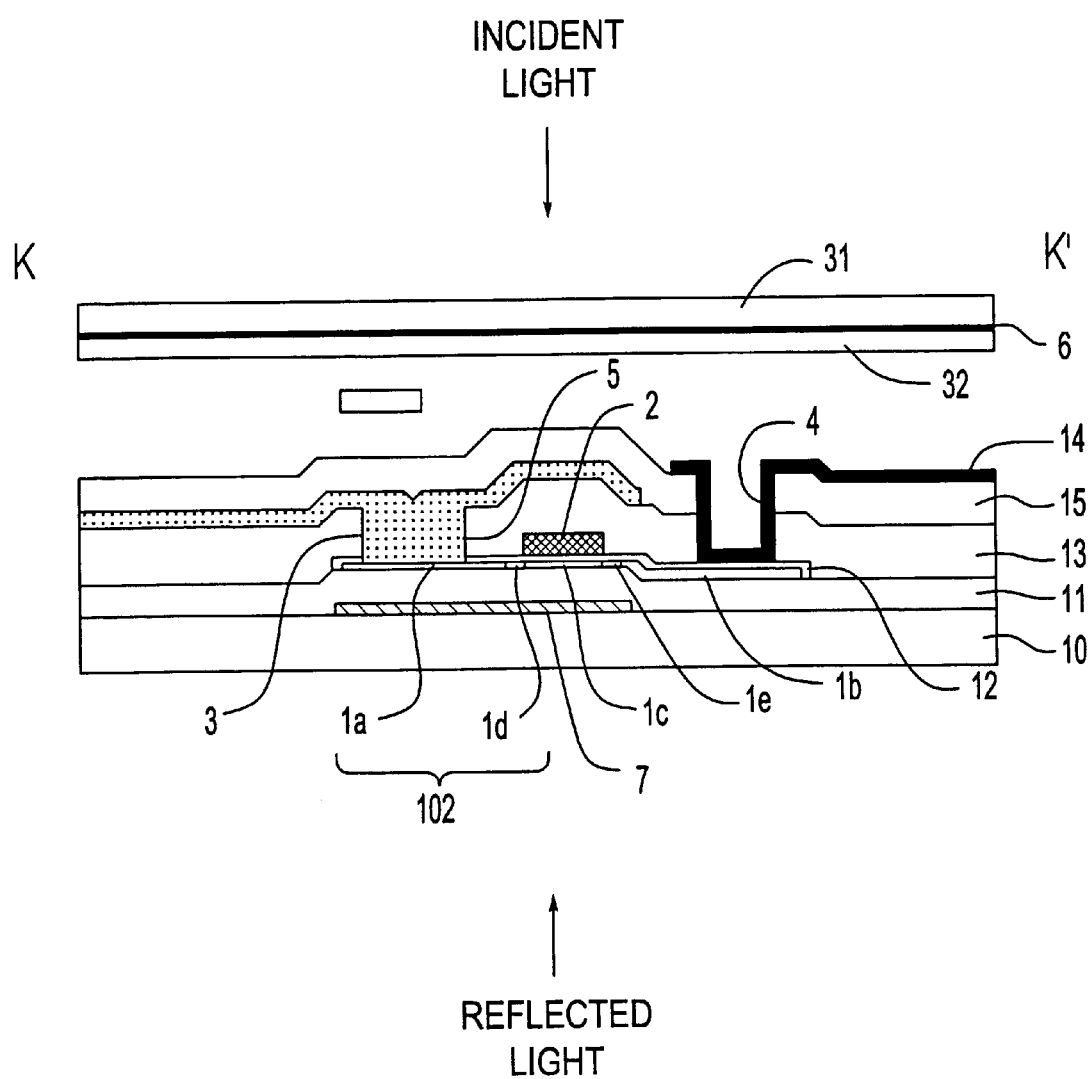
FIG. 23 is a sectional view taken along line K–K' in FIG. 22.

FIG. 22 is an enlarged plan view showing the periphery of two pixels formed at the end of the display region in a liquid crystal display substrate used in a liquid crystal device of this embodiment. FIG. 23 is a sectional view taken along line K–K' in FIG. 22. The basic configuration of the liquid crystal device substrate 300 of this embodiment is the same as that described with reference to FIGS. 1 to 5. Here, the structure for using as the capacitance wiring and the light shielding film which constitutes the light shielding structure of the liquid crystal device substrate 300 is mainly described. Since the basic configuration of the liquid crystal device substrate of the liquid crystal device of this embodiment is the same as the liquid crystal device substrate of the liquid crystal device of Modified Example 3 of Embodiment 2, portions having the same functions are denoted by the same reference numerals, and description thereof is omitted.

In this embodiment, as shown in FIG. 22, the first light shielding film 7 comprises channel shielding portions 71 each of which overlaps with the channel region 1c, and wiring portions 72 formed in a lattice to extend from the channel shielding portions 71 along the scanning lines 2 and the data lines 3, for applying a constant voltage to the channel shielding portions 71. The wiring portions 72 of the first light shielding film 7 comprise branches 73 extended from the display region 61 along the scanning lines 2 to a position which overlaps with the peripheral partitioning light shielding film 60, and a trunk 74 for connecting the ends of the branches 73. The trunk 74 of the first light shielding film 7 is overlapped with the constant potential wiring 8 for supplying a constant potential such as the counter electrode potential LCCOM, and the wiring portion (trunk) 74 of the first light shielding film 7 is connected to the constant potential wiring 8 in the overlap portion through the contact hole 9 shown in FIGS. 8, 9, 10 or 11.

Since the first light shielding film 7 is formed to overlap with the capacitance wiring 18 described above with reference to FIGS. 4(A) and 4(B), in this embodiment, the storage capacitor CAP is formed by utilizing the structure in which the first light shielding film 7 overlaps with the high concentration drain region 1b of the TFT 102 through the first layer insulation film 11, as shown in FIG. 23, in place of the formation of the capacitance wiring described above with reference to FIGS. 4(A) and 4(B). Namely, since the constant voltage power source VSSY on the low potential side of the scanning line driving circuits 104 is supplied to the first light shielding film 7 through the constant potential wiring 8, the storage capacitor CAP comprises the first layer insulation film 11 as a dielectric film between the first light shielding film 7 and the drain region (the high concentration region 1b) of the TFT 102.

[Example 1 of Method of Manufacturing the Light Crystal Device Substrate 300]

In the method of manufacturing the liquid crystal device 100, the process for manufacturing the liquid crystal device substrate 300 will be described with reference to FIGS. 24 to 27. These drawings are sectional drawings showing the steps of the method of manufacturing the liquid crystal device substrate of this embodiment. In all drawings, the left drawing is a sectional view (the section of the pixel TFT) corresponding to a section taken along line A–A' of FIG. 4(B), and the right drawing is a sectional view (the section of the connection between the first light shielding film 7 and the constant potential wiring) corresponding to a section taken line B–B' of FIG. 6. In this example, the connection between the first light shielding film 7 and the constant potential wiring comprises, as shown in FIG. 9.

First, as shown in FIG. 24(A), an opaque conductive light shielding film 70 comprising a metallic film of tungsten, titanium, chromium, tantalum, molybdenum or the like, or a metal alloy film of a metal silicide containing any one of these metals, is formed, by sputtering or the like, to a thickness of about 500 angstroms to about 3000 angstroms, preferably about 1000 angstroms to about 2000 angstroms, over the entire surface of the transparent insulation substrate 10 such as a glass substrate, for example, comprising nonalkaline glass or silica, followed by patterning by photolithography, to form the first light shielding film 7, as shown in FIG. 24(B). The first light shielding film 7 is formed so as to cover at least the channel region 1c, the low concentration source and drain regions 1d and 1e, and the junctions between the low concentration source and drain regions 1d and 1e and the high concentration source and drain regions 1a and 1b of the pixel switching TFT 102, which will be described below, as seen from the back side of the insulation substrate 10 (refer to FIG. 5). Of the thus-formed first light shielding film 7, a portion formed corresponding to the channel region of the pixel switching TFT 102 is the channel shielding portion, and a portion formed to be connected to the constant potential wiring 8 is the wiring portion.

Next, as shown in FIG. 24(C), the first layer insulation film 11 is formed to a thickness of about 500 angstroms to about 15000 angstroms, preferably about 8000 angstroms, on the surface of the first light shielding film 7. The first layer insulation film 11 functions to insulate the first light shielding film 7 from the semiconductor layer 1 which is formed later, and comprises, for example, an insulation film such as a silicon oxide film, a silicon nitride film, or the like, formed by atmospheric pressure CVD or low pressure CVD or using TEOS gas or the like. Since the first layer insulation film 11 is formed over the entire surface of the insulation substrate 10, the effect as a base film can be obtained. Namely, it is possible to prevent roughing by polishing of the surface of the insulation substrate 10, and deterioration in the characteristics of the pixel switching TFT 102 due to contamination by insufficient cleaning.

Next, as shown in FIG. 24(D), a polysilicon film 1 a is formed to a thickness of about 500 angstroms to about 2000 angstroms, preferably about 1000 angstroms, over the entire surface of the first layer insulation film 11. In a method, monosilane gas or disilane gas is supplied at a flow rate of about 400 cc/min to about 600 cc/min under heating of the substrate to about 450° C. to about 550° C., preferably about 500° C., to form an amorphous silicon film under a pressure of about 20 Pa to about 40 Pa. Then the amorphous silicon film is annealed at about 600° C. to about 700° C. for about 1 hour to about 10 hours, preferably about 4 hours to about 6 hours, to form the polysilicon film by solid phase growth. The polysilicon film 1a may be formed directly by the low pressure CVD process or the like, or implanting silicon ions into the polysilicon film deposited by the low pressure CVD process or the like to form an amorphous silicon film, and then recrystallizing the film by annealing.

Next, as shown in FIG. 24(E), the polysilicon film 1a is patterned by photolithography to form the island-like semiconductor layer (active layer) in the pixel switching TFT 102. On the other hand, in the connection with the constant potential wiring 8, the polysilicon layer 1 a is completely removed.

Next, as shown in FIG. 24(F), the semiconductor layer 1 is thermally oxidized at about 900° C. to about 1300° C. to form the gate insulation film 12 comprising a silicon oxide film having a thickness of about 500 angstroms to about 1500 angstroms on the surface of the semiconductor layer 1. In this step, the thickness of the semiconductor layer 1 finally becomes about 300 angstroms to about 1500 angstroms, preferably about 350 angstroms to about 450 angstroms, and the thickness of the gate insulation film 12 becomes about 200 angstroms to about 1500 angstroms. When a large substrate of about 8 inches is used, in order to prevent thermal warping of the substrate, the thickness of the thermal oxide film may be decreased by decreasing the thermal oxidation time, and a high temperature silicon oxide film (HTO film) or a silicon nitride film may be deposited on the thermal oxide film by CVD or the like to form a multilayer gate insulation film structure comprising at least two layers.

Figures 25A, 25B, 25C, 25D, 25E:
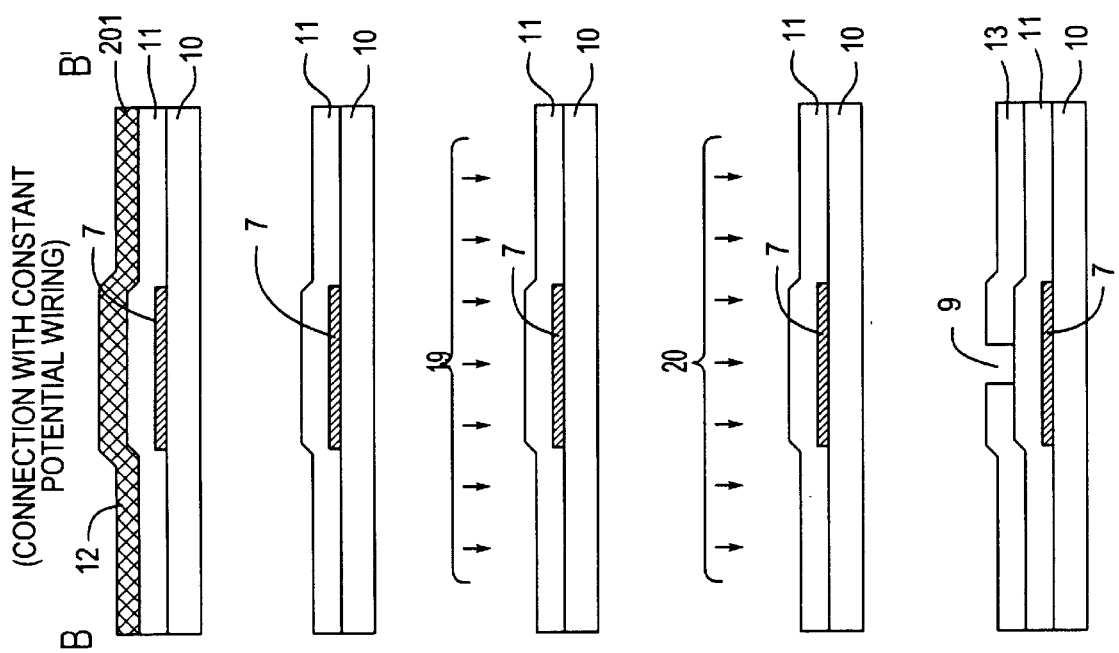
FIGS. 25(A)–25(E) are sectional views showing the steps after the steps shown in FIGS. 24(A)–24(F) in the method of manufacturing a liquid crystal device substrate to which the present invention is applied.

Next, as shown in FIG. 25(A), a polysilicon film 201 for forming the scanning lines 2 (gate electrode) is formed over the entire surface of the substrate 10, followed by thermal diffusion of phosphorus to make the polysilicon film 201 conductive. Alternatively, a doped silicon film into which phosphorus is introduced at the same time as the deposition of the polysilicon film 201, may be used.

Next, the polysilicon film 201 is patterned by using photolithography to form the gate electrode (a portion of the scanning lines 2) on the pixel switching TFT 102 side, as shown in FIG. 25(B). On the other hand, in the connection with the constant potential wiring 8, the polysilicon film 201 is completely removed. As the material for the scanning lines 2 (gate electrode), a metal film or a metal silicide film can be used, or the gate electrode may be formed in multilayers comprising a combination of a metal film or a metal silicide film and a polysilicon film. Particularly, since the metallic film and metal silicide film have the light shielding property, the scanning lines 2 can be formed as a light shielding film and also used as a black matrix, and thus the light shielding film 6 on the opposite substrate 31 can be omitted. It is thus possible to prevent a decrease in the pixel aperture ratio due to a shift in alignment between the opposite substrate 31 and the liquid crystal device substrate 300.

Next, as shown in FIG. 25(C), a low concentration of impurity ions (phosphorus) 19 are implanted with a dosage of about $0.1 \times 10^{13}/cm^2$ to about $10 \times 10^{13}/cm^2$ into the pixel switching TFT 102 and the N channel TFT of the peripheral driving circuits using the gate electrode as a mask to form the low concentration source and drain regions 1d and 1e on the pixel switching TFT 102 side in the self alignment manner with respect to the gate electrode. At the same time, the portion below the gate electrode into which no impurity ion 19 is introduced becomes the channel region 1c comprising the semiconductor layer 1. In such ion implantation, since the impurity ions are also introduced into the polysilicon layer formed as the gate electrode, the polysilicon layer is further made conductive.

Next, as shown in FIG. 25(D), a high concentration of impurity ions (phosphorus) 20 are implanted with a dosage of about $0.1\times10^{15}/cm^2$ to about $10\times10^{15}/cm^2$ into the pixel switching TFT 102 and the N channel TFT of the peripheral driving circuits by using a resist mask 21 wider than the gate electrode to form the high concentration source and drain regions 1a and 1b.

A high concentration of impurity ions (phosphorus or the like) may be implanted using a wider resist mask than the gate electrode, which is formed without implantation of a low concentration of impurity ions, in place of the above impurity introduction step, to form the offset structure source and drain regions. A high concentration of impurity ions (phosphorus) may be implanted by using the gate electrode as a mask to form self-alignment structure source and drain regions.

Although not shown in the drawings, in order to form the P channel TFT of the peripheral driving circuits, the pixel switching TFT 102 and the N channel TFT are covered with a resist, and impurity ions such as boron or the like are implanted at a dosage of about $0.1\times10^{15}/cm^2$ to about $10\times10^{15}/cm^2$ using the gate electrode as a mask to form the P channel source and drain regions in a self alignment manner. A low concentration impurity ions (boron or the like) may be introduced with a dosage of about $0.1\times10^{13}/cm^2$ to about $10\times10^{13}cm^2$ by using the gate electrode as a mask to form the low concentration source and drain regions in the polysilicon film at the same time as the formation of the pixel TFT and the N channel TFT of the peripheral driving circuits, and then a high of concentration impurity ions (boron or the like) may be implanted with a dosage of about $0.1\times10^{5}/cm^2$ to about $10\times10^{15}/cm^2$ by a mask wider than the gate electrode to form LDD structure concentration source and drain regions. Alternatively, a high concentration of impurity ions (boron or the like) may be implanted using a mask wider than the gate electrode without implantation of a low concentration of impurity ions to form offset structure source and drain regions. These implantation steps permits achievement of complementary type, and thus the peripheral driving circuits to be built in the same substrate.

Next, as shown in FIG. 25(E), the second layer insulation film 13 comprising a NSG film (a silicate glass film containing neither boron nor phosphorus) or a silicon nitride film is formed to a thickness of about 5000 angstroms to about 15000 angstroms on the surface of the gate electrode by atmospheric pressure CVD or low pressure CVD at a temperature of about 800° C. Then, annealing is carried out at about 1000° C. in order to activate the impurity ions introduced into the source and drain regions.

Next, in the connection with the constant potential wiring 8, the contact hole 9 is formed in a portion corresponding to each of the wiring portions of the first light shielding film 7. At this time, in order to achieve high definition, it is advantageous to form the anisotropic contact hole 9 by dry etching such as reaction ion etching, reactive ion beam etching or the like because the hole can be formed with substantially the same diameter as the mask. When the contact hole 9 is formed in a tapered shape by combination of dry etching and wet etching, there is the effect of preventing disconnection in the wiring connection.

Figures 26A, 26B, 26C, 26D, 26E:
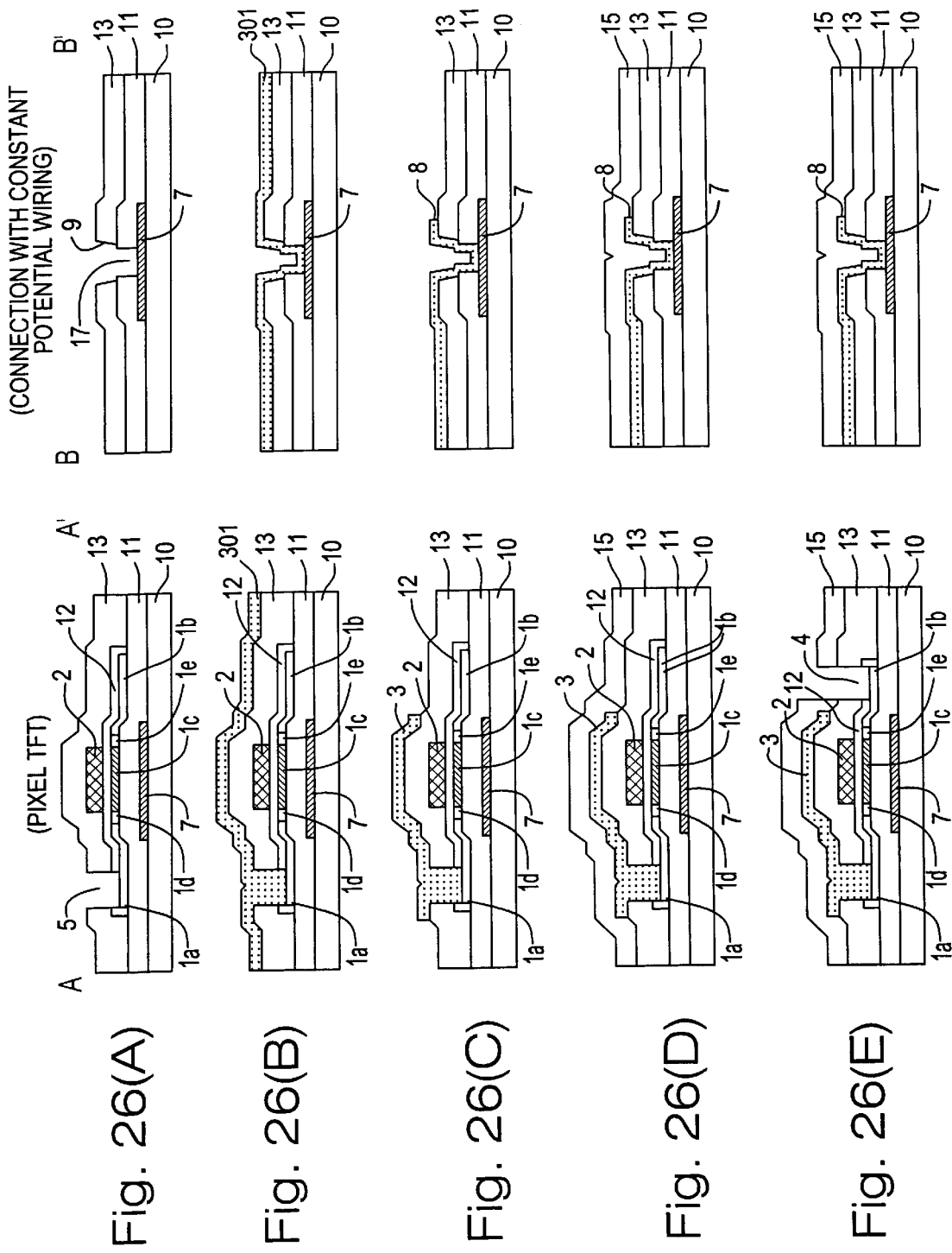
FIGS. 26(A)–26(E) are sectional views showing the steps after the steps shown in FIGS. 25(A)–25(E) in the method of manufacturing a liquid crystal device substrate to which the present invention is applied.

Next, as shown in FIG. 26(A), the contact hole 5 is formed in a portion of the second layer insulation film 13 corresponding to the source region 1a of the pixel switching TFT 102 by using photolithography. In the connection with the constant potential wiring 8, the contact hole 17 to be connected to the contact hole 9 is formed in the second layer insulation film 13.

Next, as shown in FIG. 26(B), an aluminum film 301 for forming the data lines 3 (source electrode) is formed on the surface of the layer insulation film 13 by sputtering. Besides the metallic film of aluminum or the like, a metal silicide film or a metal alloy film may be sued.

Next, as shown in FIG. 26(C), the aluminum film 301 is patterned by photolithography to form the source electrode as a portion of the data lines on the pixel switching TFT 102 side. On the other hand, in the connection with the constant potential wiring 8, the constant potential wiring 8 is formed.

Next, as shown in FIG. 26(D), the third layer insulation film 15 comprising at least two layers of a BPSG film (a silicate glass film containing boron or phosphorus) having a thickness of about 500 angstrom to about 15000 angstrom and a NSG film having a thickness of about 100 angstrom to about 3000 angstrom is formed on the surface side of the source electrode and the constant potential wiring 8 by atmospheric pressure CVD or low pressure CVD at a temperature of about 400° C. Alternatively, a flattened film having no stage may be formed by spin coating an organic film or the like.

Next, as shown in FIG. 26(E), on the pixel switching TFT 102 side, a contact hole 4 is formed in portions of the second and third layer insulation films 13 and 15 corresponding to the high concentration drain region 1b by using photolithography and dry etching. At this time, it is advantageous for high definition that the contact hole is formed by dry etching such as reactive ion etching, reactive ion beam etching or the like. When the contact hole 4 is formed in a tapered shape by combination of dry etching and wet etching, there is the effect of preventing disconnection in the wiring connection.

Figures 27A, 27B:
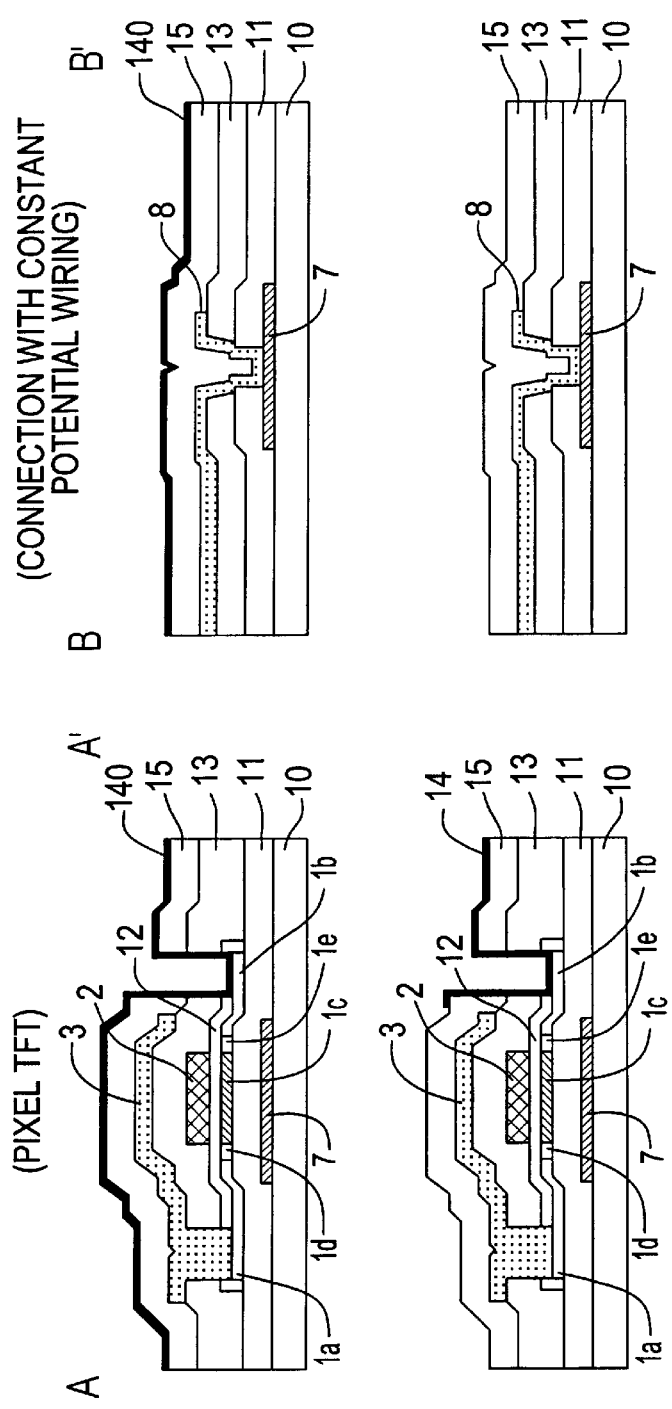
FIGS. 27(A) and 27(B) are sectional views showing the steps after the steps shown in FIGS. 26(A)–26(E) in the method of manufacturing a liquid crystal device substrate to which the present invention is applied.

Next, as shown in FIG. 27(A), an ITO film 140 for forming the drain electrode is formed to a thickness of about 400 angstroms to about 2000 angstroms on the surface side of the third layer insulation film 15 by sputtering, followed by patterning of the ITO film 140 by photolithography to form the pixel electrode 14 on the pixel switching TFT 104 side, as shown in FIG. 27(B). In the connection with the constant potential wiring 18, the ITO film 140 is completely removed. On the surface of the pixel electrode 14 is formed a alignment film of polyimide or the like, followed by rubbing. As the pixel electrode 14, the material is not limited to the ITO film, and transparent electrode materials comprising a high-melting-point metal oxide, such as a SnOX film, a ZnOX film, and the like can be used. These materials can provide step coverage in the contact hole, which can resist practical use. In manufacture of a reflection type liquid crystal device, a film having high reflectance, such as an aluminum film, is formed as the pixel electrode 14.

In the steps shown in FIGS. 25(E) and 26(A), if the contact holes 9 and 17 are not separately formed in the connection with the constant wiring 8, and the contact hole 9 is formed at the same time as formation of the contact hole 5, the connection between the constant wiring 8 and the first light shielding film 7 can be constructed as shown in FIG. 8.

[Example 2 of Method of Manufacturing the Liquid Crystal Device Substrate 300]

In the method of manufacturing the liquid crystal device 100, another process for manufacturing the liquid crystal device substrate 300 will be described with reference to FIGS. 28 to 30. These drawings are sectional drawings showing the steps of the method of manufacturing the liquid crystal device substrate. In all drawings, the left drawing is a sectional view (the section of the pixel TFT) corresponding to a section taken along line A–A' of FIG. 4(B), and the right drawing is a sectional view (the section of the connection between the first light shielding film 7 and the constant potential wiring 8) corresponding to a section taken along line B–B' of FIG. 6. In this example, the connection between the first light shielding film 7 and the constant potential wiring comprises, as shown in FIG. 10 or 11. In this manufacturing method, the steps shown in FIGS. 24(A) to 24(F) are the same as those of the above described manufacturing method, the steps after the step in FIG. 24(F) will be described below.

In this example, as shown in FIG. 24(F), the gate insulation film 12 comprising a silicon oxide film having a thickness of about 500 angstroms to about 1500 angstroms is formed on the surface of the semiconductor layer 1 by thermal oxidation or the like, and in the connection with the constant potential wiring 8, the contact hole 7 is formed in the first layer insulation film 11, as shown in FIG. 28(A). Next, a polysilicon film 201 for forming the gate electrode is formed over the entire surface of the substrate 10, followed by thermal diffusion of phosphorus to make the polysilicon film 201 conductive. Alternatively, a doped silicon film into which phosphorus is introduced at the same time as the deposition of the polysilicon film 201, may be used.

Next, the polysilicon film 201 is patterned by using photolithography to form the gate electrode (a portion of the scanning lines 2) on the pixel switching TFT 102 side, as shown in FIG. 28(B). On the other hand, in the connection with the constant potential wiring 8, the junction electrode 16 is formed.

Next, as shown in FIG. 28(C), a low concentration of impurity ion (phosphorus) 19 is implanted into the pixel switching TFT 102 and the N channel TFT of the peripheral driving circuits using the gate electrode as a mask to form the low concentration source and drain regions 1d and 1e on the pixel switching TFT 102 side in the self alignment manner with respect to the gate electrode. At the same time, the portion below the gate electrode into which no impurity ion 100 is introduced becomes the channel region 1c comprising the semiconductor layer 1. In such ion implantation, since the impurity ion is also introduced into the polysilicon formed as the gate electrode and the polysilicon film formed as the junction electrode 16, these polysilicon layers are further made conductive.

Next, as shown in FIG. 28(D), a high concentration of impurity ion (phosphorus) 20 is implanted into the pixel switching TFT 102 and the N channel TFT of the peripheral driving circuits by using a resist mask 21 wider than the gate electrode to form the high concentration source and drain regions 1a and 1b.

Next, as shown in FIG. 28(E), the second layer insulation film 13 comprising a NSG film (a silicate glass film containing neither boron nor phosphorus) is formed to a thickness of about 5000 angstroms to about 15000 angstroms on the surfaces of the gate electrode and the junction electrode 16 by the CVD process at a temperature of about 800° C.

Figures 29A, 29B, 29C, 29D, 29E:
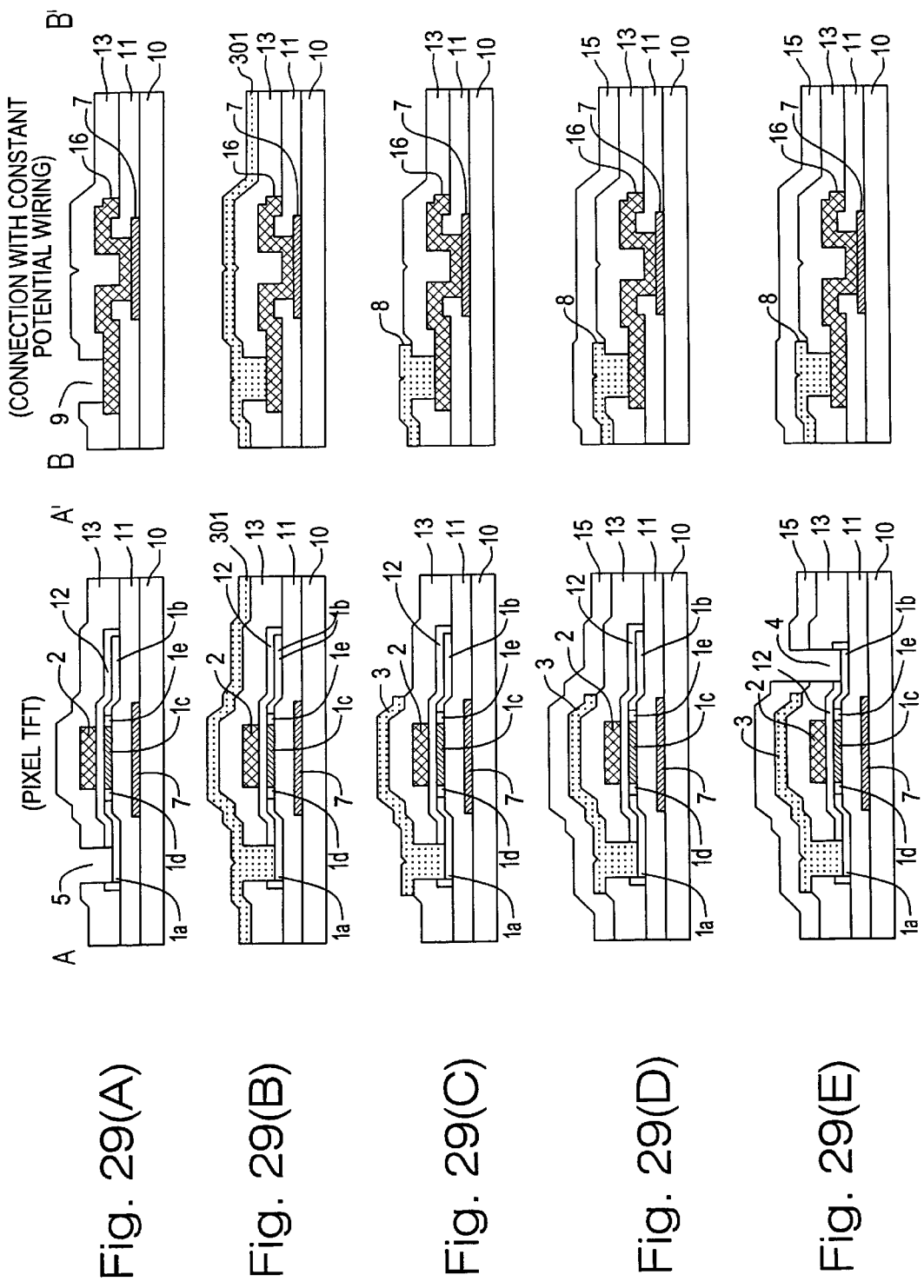
FIGS. 29(A)–29(E) are sectional views showing the steps after the steps shown in FIGS. 28(A)–28(E) in the method of manufacturing a liquid crystal device substrate to which the present invention is applied.

Next, as shown in FIG. 29(A), the contact hole 5 is formed in a portion of the second layer insulation film 13 corresponding to the source region 1a of the pixel switching TFT 102 by using photolithography. In the connection with the constant potential wiring 8, the contact hole 9 is formed in the second layer insulation film 13 at a position corresponding to the junction electrode 16.

Next, as shown in FIG. 29(B), an aluminum film 301 for forming the data lines 3 (source electrode) is formed on the surface of the second layer insulation film 13 by sputtering. Besides the metallic film of aluminum or the like, a metal silicide film or a metal alloy film may be used.

Next, as shown in FIG. 29(C), the aluminum film 301 is patterned by photolithography to form the source electrode as a portion of the data lines on the pixel switching TFT 102 side. On the other hand, in the connection with the constant potential wiring 8, the constant potential wiring 8 is formed.

Next, as shown in FIG. 29(D), the third layer insulation film 15 comprising at least two layers of a BPSG film (a silicate glass film containing boron or phosphorus) having a thickness of about 500 angstroms to about 15000 angstroms and a NSG film having a thickness of about 100 angstroms to about 3000 angstroms is formed on the surface side of the source electrode and the constant potential wiring 8 by the CVD process at a temperature of about 400° C.

Next, as shown in FIG. 29(E), on the pixel switching TFT 102 side, the contact hole 4 is formed in portions of the second and third layer insulation films 13 and 15 corresponding to the high concentration drain region 1b by using photolithography and dry etching.

Figures 30A, 30B:
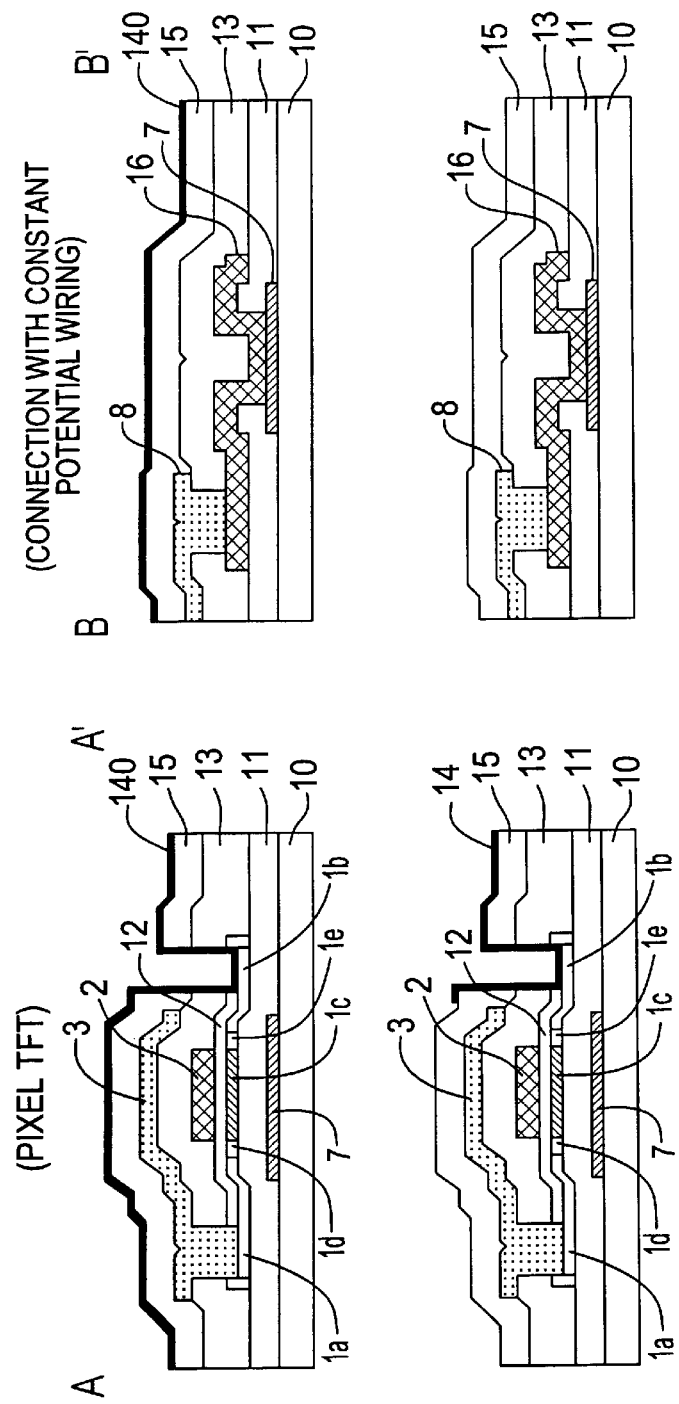
FIGS. 30(A) and 30(B) are sectional views showing the steps after the steps shown in FIGS. 29(A)–29(E) in the method of manufacturing a liquid crystal device substrate to which the present invention is applied.

Next, as shown in FIG. 30(A), an ITO film 140 for forming the drain electrode is formed to a thickness of about 400 angstroms to about 2000 angstroms on the surface side of the third layer insulation film 15 by sputtering, followed by patterning of the ITO film 140 by photolithography to form the pixel electrode 14 on the pixel switching TFT 102 side, as shown in FIG. 30(B). In the connection with the constant potential wiring 18, the ITO film 140 is completely removed.

In the steps shown in FIGS. 28(B) and 29(A), if the pattering position of the junction electrode 16 and the formation position of the contact hole 17 are changed, the connection between the constant wiring 8 and the first light shielding film 7 can be constructed in the form shown in one of FIGS. 10 and 11.

[Configuration of periphery driving circuit]

In the present invention, since the first light shielding film 7 is formed between the first layer insulation film 11 and the substrate 10, the number of the wiring layers in the peripheral driving circuits (the scanning line driving circuit 104 and the data line driving circuit 103) comprising multilayer wiring is increased. Therefore, an example in which the conductive film formed at the same time as the first light shielding film 7 is used as wiring in the peripheral driving circuits.

(Example 1 of Configuration of Peripheral Driving Circuit)

Figure 31:
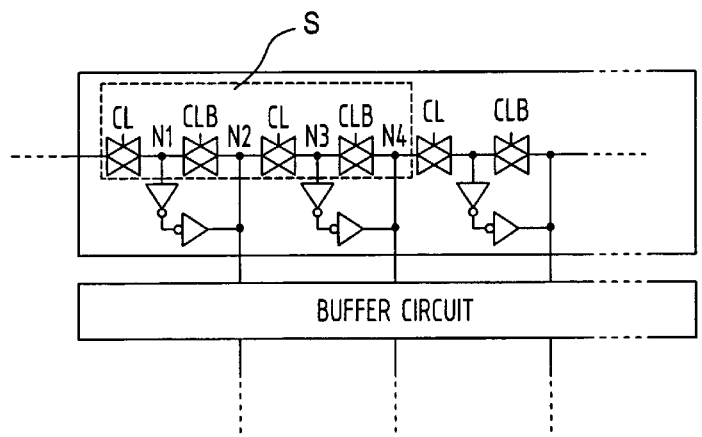
FIG. 31 is a drawing showing equivalent circuits in an example of a shift register circuit which constitutes peripheral driving circuits of a liquid crystal device suitable for application of the present invention.

FIG. 31 is a drawing showing an example of equivalent circuits of a shift register circuit which constitutes the peripheral driving circuits (the scanning line driving circuit 104 and the data line driving circuit 103) of the active matrix type liquid crystal device 100 suitable for application of the present invention. A circuit for latching a transmission signal may comprises a transmission gate circuit, a clocked inverter circuit or the like.

Figure 32A:
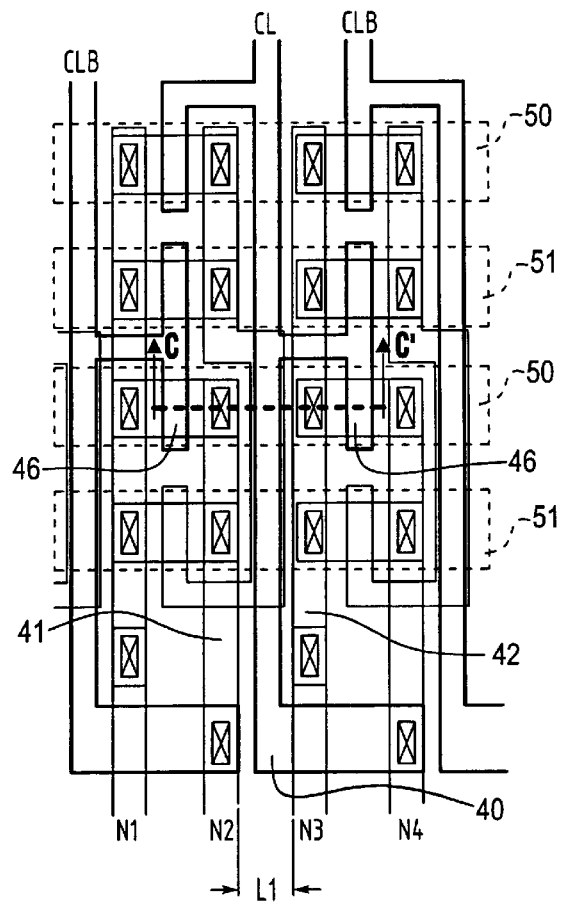
FIG. 32(A) is a plan view showing an example of the layout of a shift register circuit which constitutes peripheral driving circuits of a liquid crystal device suitable for application of the present invention.
Figure 32B:
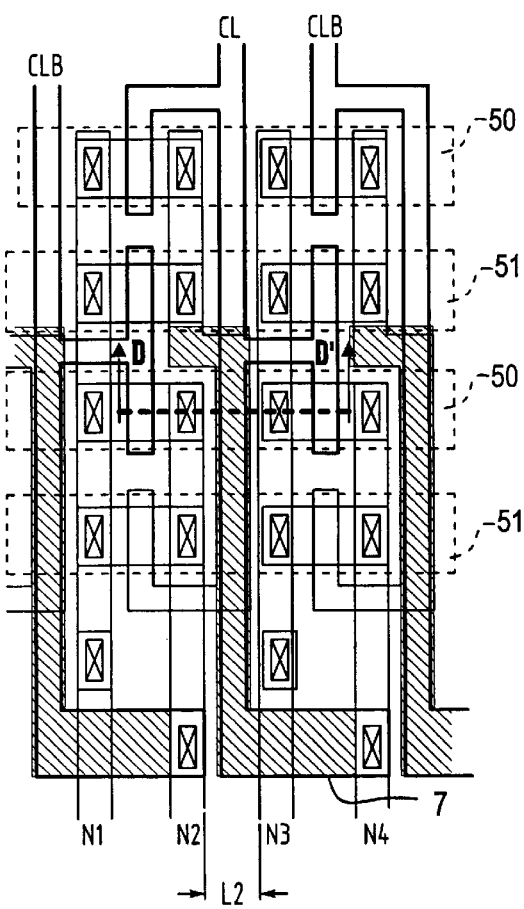
FIG. 32(B) is a plan view showing the layout of a shift register circuit which constitutes peripheral driving circuits of a conventional liquid crystal device.
Figure 33A:
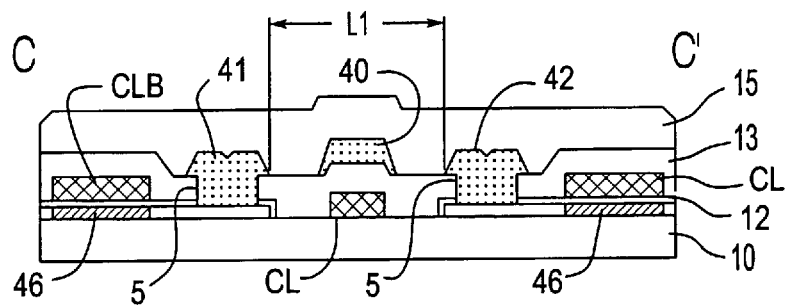
FIG. 33(A) is a sectional view showing an example of the layout of a shift register circuit which constitutes peripheral driving circuits of a liquid crystal device suitable for application of the present invention.
Figure 33B:
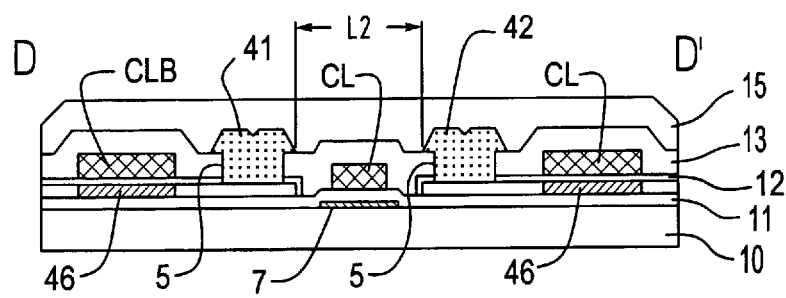
FIG. 33(B) is a sectional view showing the layout of a shift register circuit which constitutes peripheral driving circuits of a conventional liquid crystal device.

FIG. 32 is a plan view showing an example of layout when the portion S of the shift register shown in FIG. 31 is formed to be integrated on the liquid crystal device substrate 300. FIG. 32(A) shows a conventional pattern layout, and FIG. 32(B) shows a pattern layout to which the present invention was applied. FIGS. 33(A) and 33(B) are sectional views taken along line C–C' in FIG. 32(A) and line D–D' in FIG. 32(B), respectively.

In FIG. 32(A) and FIG. 33(A), reference numerals 50, 51 and 46 denote the P type region, the N type region and the P channel TFT for driving circuits, respectively. In the conventional example shown in these drawings, wiring is passed through the connection between the shift register circuit in a present stage and the shift register in the next stage by using wiring 40 comprising a metallic film of aluminum or the like which is formed in the same step between the same layers as the data lines 3 on the second layer insulation film 13 formed on the surface of the clock signal line CL (formed between the same layers in the same step as the scanning lines) for controlling the transmission gate circuit. As a result, in the conventional example, the source and drain electrodes 41 and 42 of the transmission gate circuit are formed of the same layer as the wiring 40. Therefore, the distance L1 of the transmission gate circuits is determined by the dimensional precision of the wiring 40 and the source and drain electrodes 41 and 42 of the transmission gate circuit in the photolithographic step and the etching step, and thus the distance L1 of the transmission gate circuits cannot be made finer because the wiring 40 is passed, thereby interfering with high integration.

However, in this example, as described above in each of the embodiments, since the first light shielding film 7 is formed between the substrate 10 and the first layer insulation film 11, the first light shielding film is also formed in the peripheral driving circuits, so as to be used as the wiring material for the peripheral driving circuits, thereby realizing refining. Namely, as shown in FIGS. 32(B) and 33(B), as the wiring material for the connection N4 between the shift register circuit in a present stage and the shift register in the next stage, the first light shielding film 7 formed between the first layer insulation film 11 and the substrate 10 is used, thereby eliminating wiring between the same layers as the source and drain electrodes 41 and 42 of the transmission gate circuit. Therefore, for the distance L2 of the transmission gate circuits, only the distance between the source and drain electrodes 41 and 42 of the adjacent transmission gate circuits may be taken into consideration. Therefore, in this example, the distance L2 between the transmission gate circuits can be decreased, as compared with the conventional distance L1 between the transmission gate circuits.

(Example 2 of Configuration of Peripheral Driving Circuit)

Figure 34A:
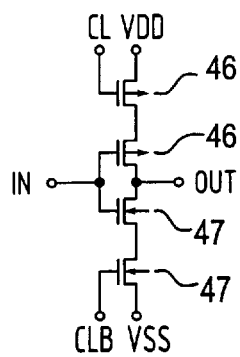
FIGS. 34(A)–(C) are drawings showing equivalent circuits of a clocked inverter, an inverter, and a transmission gate, respectively, which constitute peripheral driving circuits of a liquid crystal device suitable for application of the present invention.
Figure 34B:
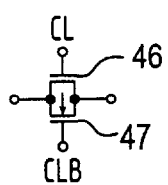
Figure 34C:
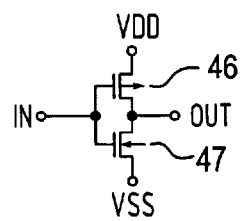

In this example, it is described that the characteristics of the TFT for the peripheral driving circuits (the scanning line driving circuit and the data line driving circuit) can be improved by the same number of the steps used as the conventional steps. FIGS. 34(A)–34(C) show examples of equivalent circuits used in the peripheral driving circuits, FIGS. 34(A), (B) and (C) showing the clocked inverter circuit, the transmission gate circuit, and the inverter circuit, respectively.

Figure 35A:
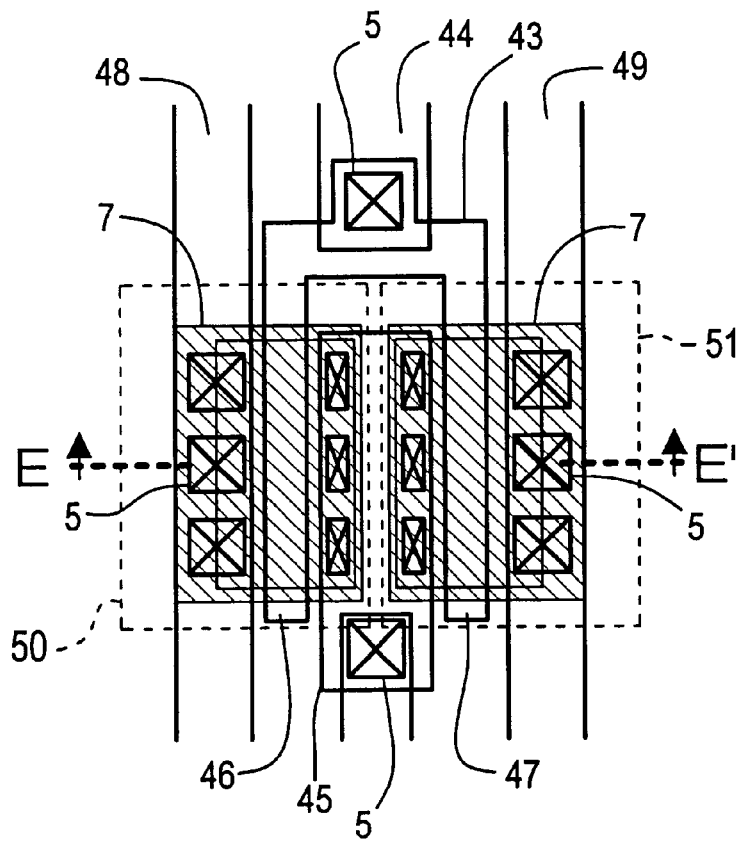
FIG. 35(A) is a plan view of an example of the layout of an inverter circuit which constitutes peripheral driving circuits of a liquid crystal device suitable for application of the present invention.

In FIGS. 34(A)–34(C), each of the equivalent circuits comprises complementary type TFT comprising P channel type TFT and N channel type TFT, and can be formed in the step for forming the pixel switching TFT. CL denotes the clock signal, CLB denotes the reverse signal of the clock signal, VDD denotes the constant voltage power source on the high potential side of the peripheral driving circuits, and VSS denotes the constant voltage power source on the low potential side of the peripheral driving circuits. Reference numerals 46 and 47 denote the P channel TFT for the driving circuits, and the N channel TFT for the driving circuits, respectively. The signal input from the IN side is output to the OUT side. The CL signal and CLB signal are replaced with each other, as shown in FIG. 31. FIG. 35(A) is a plan view showing the layout on the liquid crystal device substrate of the inverter circuit shown in FIG. 34(C), and FIG. 35(B) is a sectional view taken along line E–E' of FIG. 35(A).

In this example, as described above in each of the embodiments, since the first light shielding film 7 is formed between the substrate 10 and the first layer insulation film 11, the first light shielding film 7 is also formed in the peripheral driving circuits. Namely, as shown in FIGS. 35(A) and (B), the first light shielding film 7 is connected to the source electrode 48, 49 of each of the P channel TFT 46 and the N channel TFT which constitute the inverter circuit, through the contact hole 5 in the first layer insulation film 11. The first light shielding film 7 is formed to completely cover the channel regions 52 and 53 below the gate electrodes 43 of the P channel TFT 46 and the N channel TFT 47 through the first layer insulation film 11. Therefore, the first light shielding film 7 functions as the pseudo second gate electrode by the voltage applied from the source electrode 48 (the constant voltage power source VDD on the low potential side of the peripheral driving circuits ) of the P channel TFT 46 and the source electrode 49 (the constant voltage power source VSS on the low potential side of the peripheral driving circuits) of the N channel TFT 47. Therefore, in the channel region 53 of the N channel TFT 47, the potential in the portion in contact with the gate insulation film 12 comprising a depletion layer is increased, as compared with conventional examples, thereby decreasing the potential energy of electrons. As a result, the electrons are gathered in the portion in contact with the gate insulation film 12 comprising a depletion layer to easily form a reverse layer, thereby decreasing the resistance of the semiconductor layer and improving the TFT characteristics. In the channel region 52 of the P channel TFT 46, a phenomenon occurs in which the electrons are replaced with holes.

Figure 35B:
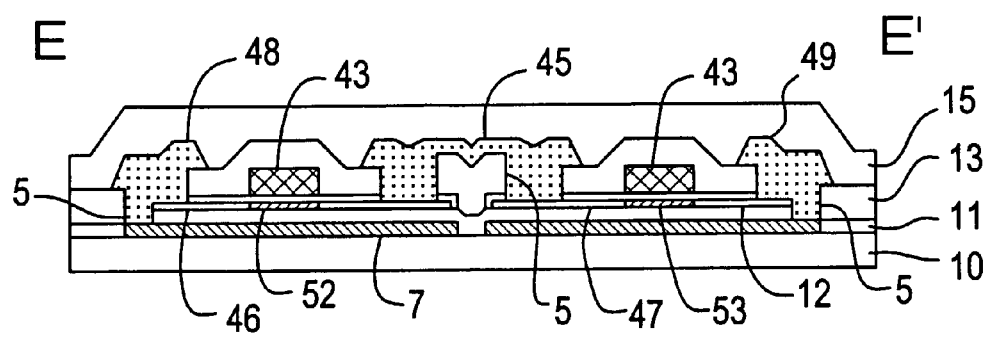
FIG. 35(B) is a sectional view taken along line E–E'.

Although, in FIG. 35(B), the P channel TFT 46 and the N channel TFT 47 of the peripheral driving circuits are formed in a gate self alignment structure, the P channel TFT 46 and the N channel TFT 47 of the peripheral driving circuits may be formed in the LDD structure or offset gate structure in order to improve the voltage resistance of TFT and reliability, as in the above-described manufacturing process.

(Example 3 of Configuration of Peripheral Driving Circuit)

Figure 36A:
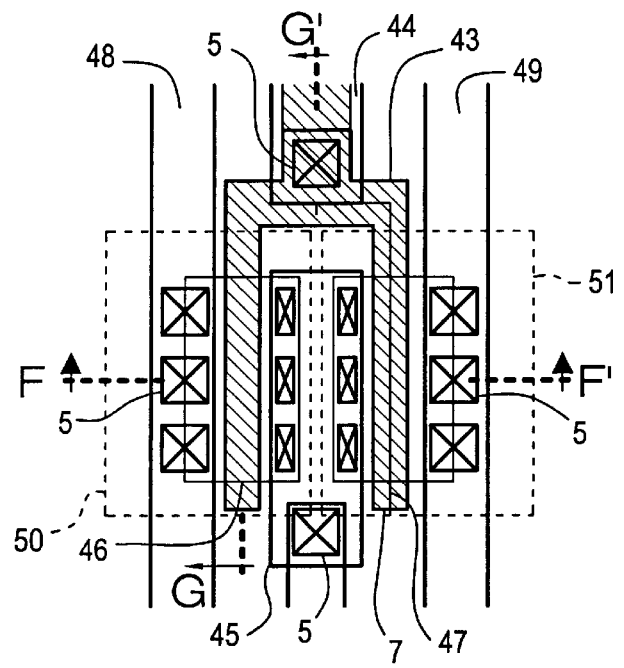
FIG. 36(A) is a plan view of an example of the layout of an inverter circuit which constitutes peripheral driving circuits of a liquid crystal device suitable for application of the present invention.
Figure 36B:
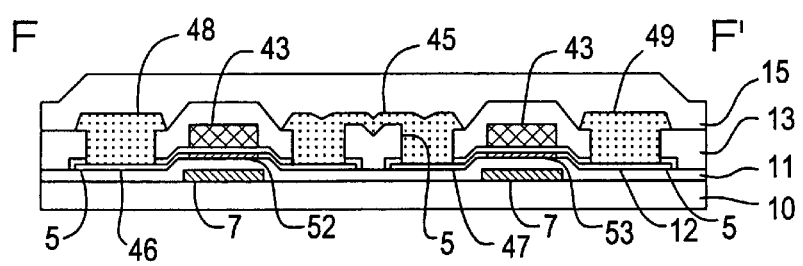
FIG. 36(B) is a sectional view taken along line F–F' and FIG. 36(C) is a sectional view taken along line G–G'.
Figure 36C:
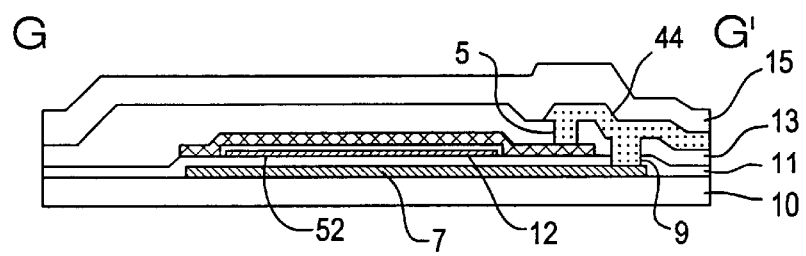

FIG. 36(A) is a plan view showing the layout on the liquid crystal device substrate of the inverter circuit shown in FIG. 34(C), and FIG. 36(B) is a sectional view taken along line F–F' of FIG. 36(A). FIG. 36(C) is a sectional view taken along line G—G of FIG. 36(A).

In this example, as described above in each of the embodiments, since the first light shielding film 7 is formed between the substrate 10 and the first layer insulation film 11, the first light shielding film 7 is also formed in the peripheral driving circuits. Namely, as shown in FIGS. 36(A), 36(B) and 36(C), the first light shielding film 7 formed to overlap with the gate electrode 43 of each of the P channel TFT 46 and the N channel TFT 47, which constitute the inverter circuit, is connected to the gate electrode 43. Also the first light shielding film 7 is formed with a width which is the same as or smaller than the gate electrode 43, to form double gate structure TFT in which the channel regions 52 and 53 are held between the gate electrode 43 and the first light shielding film 7 through the gate insulation film 12 and the first layer insulation film 11. The wiring 44 on the input side of the inverter circuit comprises the same layer as the data lines 3, and is connected to the gate electrode 43 through the contact hole 5 of the first layer insulation film 11 and connected to the first light shielding film 7 through the contact hole 5 of the first layer insulation film 11. The contact holes 5 are formed in the same step. Therefore, in this double gate structure TFT, since the first light shielding film 7 functions as the second gate electrode, the TFT characteristics can further be improved by the back channel effect.

(TFT Characteristic)

Figure 37:
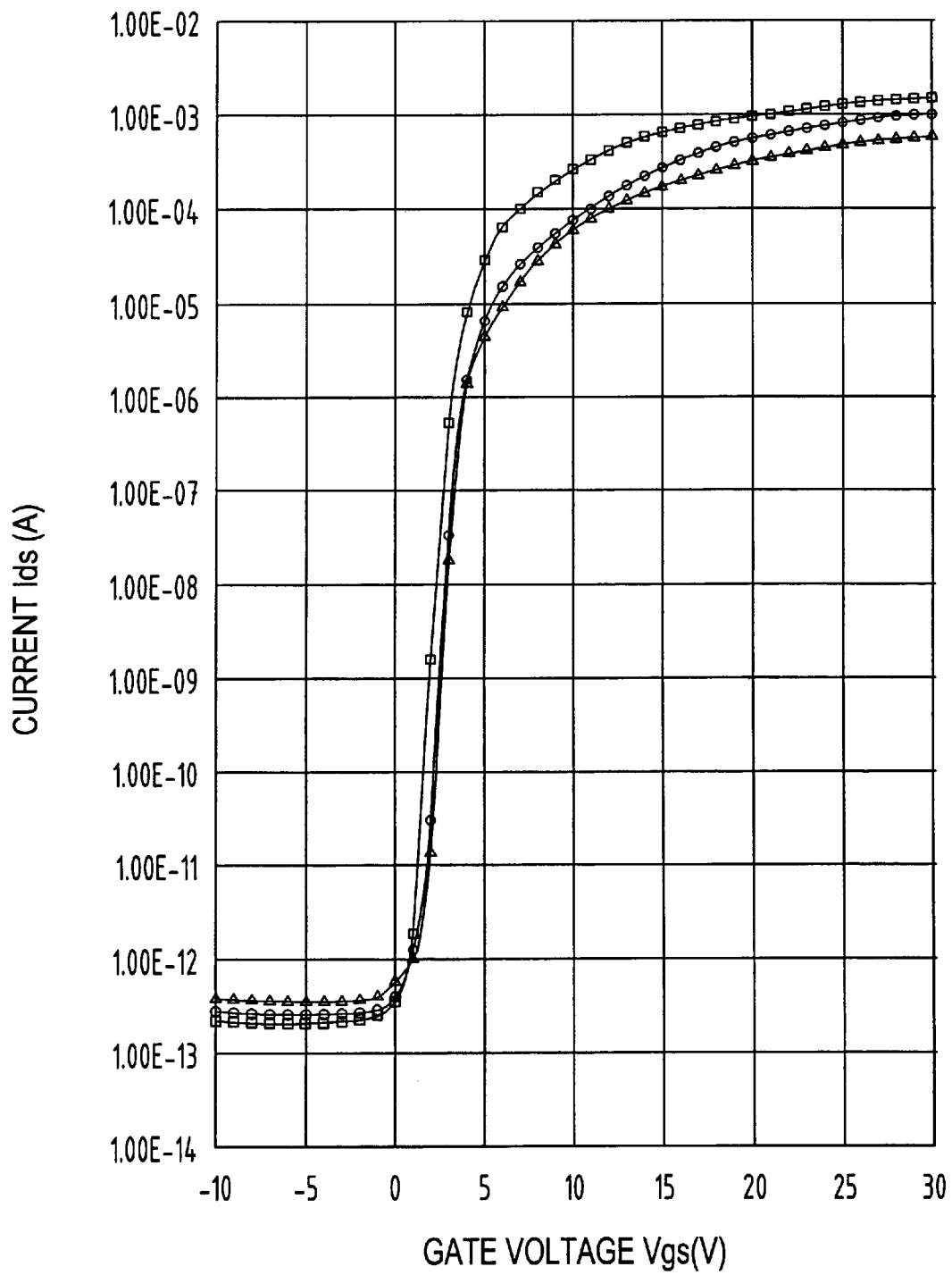
FIG. 37 is a drawing showing the current-voltage characteristics of a conventional N channel TFT and a N channel TFT to which the present invention is applied.

FIG. 37 shows the characteristics of the N channel TFT having the structure described above with reference to Examples 2 and 3 of the configuration of the peripheral driving circuits. In FIG. 37, triangular marks and solid line (a) connecting the triangular marks show a conventional N channel TFT without any other layer below the channel region, circular marks and solid line (b) connecting the circular marks show the N channel TFT having the structure described above with reference to Example 2 of the configuration of the peripheral driving circuits, and square marks and solid line (c) connecting the square marks show the N channel TFT having the structure described above with reference to Example 3 of the configuration of the peripheral driving circuits. The size of TFT was the same (the channel length 5 $\mu$m, the channel width 20 $\mu$m) in the three structures, and measurement was made by applying a voltage of 15 V between the source and drain. As the conditions of the thickness, the thickness of the first light shielding film 7 was set to 1000 angstroms, the thickness of the first layer insulation film 11 was set to 1000 angstroms, the thickness of the semiconductor layer 1 was set to 500 angstroms, and the thickness of the gate insulation film was set to 900 angstroms. As a result of measurement, it was confirmed that when 15 V was applied to the gate electrode of the TFT, the on current obtained in the N channel TFT (the characteristics shown by circular marks and solid line (b) connecting the marks) of the structure described above with reference to Example 2 of the configuration of the peripheral driving circuits is about 1.5 times the on current of conventional TFT (the characteristics shown by triangular marks and solid line (a) connecting the marks). It could also be confirmed that when 15 V was applied to the gate electrode of TFT, the on current obtained in the N channel TFT (the characteristics shown by square marks and solid line (b) connecting the marks) of the structure described above with reference to Example 3 of the configuration of the peripheral driving circuits is about 3.0 times the on current of conventional TFT (the characteristics shown by triangular marks and solid line (a) connecting the marks). Therefore, by using the N channel TFT having the structure described above with reference to Example 2 or 3 of the configuration of the peripheral driving circuits, it is possible to increase the speed of the peripheral driving circuits and make fine the peripheral driving circuits as the number of display pixels increases. Also, since writing of image signals on the data lines 3 is improved, a liquid crystal device which can realize a high quality image display can be provided.

[Example of Application to Projection Type Liquid Crystal Device]

Figure 38:
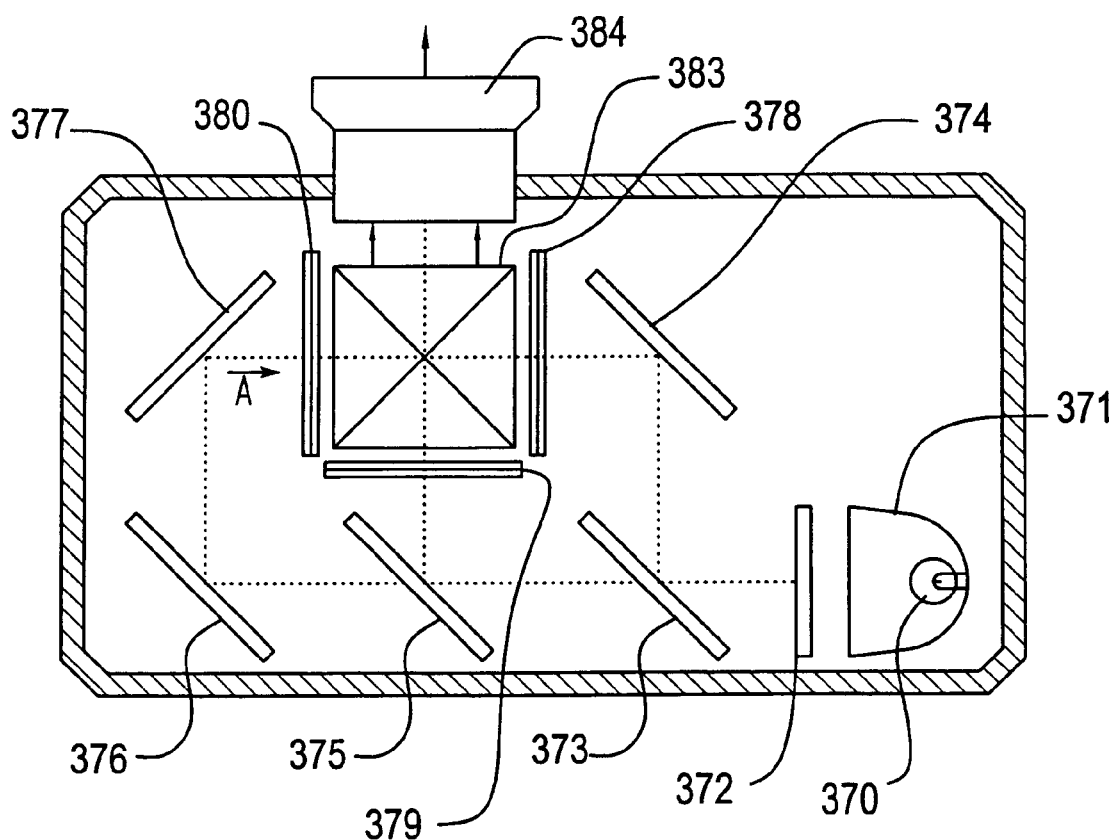
FIG. 38 is a schematic drawing showing the configuration of a projector as an example of a projection type display device which uses as a light valve a liquid crystal device comprising a liquid crystal device substrate of the present invention.

FIG. 38 is a drawing illustrating the optical system used for a projector of a prism color composition system comprising three active matrix type liquid crystal devices as an example of a projection type display device to which the liquid crystal device 100 of each of the embodiments is applied as a light valve.

In FIG. 38, reference numeral 370 denotes a light source such as a halogen lamp or the like; reference numeral 371 denotes a parabolic mirror; reference numeral 372 denotes a heat ray cut filter; reference numerals 373, 375 and 376 denote dichroic mirrors for blue color reflection, green color reflection, and red color reflection, respectively; reference numerals 374 and 377 each denote a reflection mirror; reference numerals 378, 379 and 380 respectively denote blue, green and red color modulation light valves each comprising the active matrix type liquid crystal device; and reference numeral 383 denotes a dichroic prism.

In this projector, the white light emitted from the light source 370 is converged by the parabolic mirror 371, and passed through the heat ray cut filter 372 to cut off heat rays in the infrared light region, and then only the visible light is incident on the dichroic mirror system. First blue light (wavelength of about 500 nm or less) is reflected by the blue color reflection dichroic mirror 373, and the other light (yellow light) is transmitted. The direction of the reflected blue light is changed by the reflection mirror 374, and the blue light is incident on the blue color modulation light valve 378. On the other hand, the light transmitted through the blue color reflection dichroic mirror 373 is incident on the green color reflection dichroic mirror 375 to reflect green light (wavelength of about 500 to 600 nm), and the other light, i.e., red light (wavelength of about 600 nm or more) is transmitted. The green light reflected by the green color modulation light valve 375 is incident on the green color modulation light valve 379. The direction of the red light transmitted through the dichroic mirror 375 is changed by the reflection mirrors 376 and 377, and the red light is incident on the red color modulation light valve 380.

The light valves 378, 379 and 380 of the respective colors are driven by the primary color signals of blue, green and red, respectively, which are supplied from an image signal processing circuit, and the light incident on the respective light valves are modulated and composed by the dichroic prism 383. The dichroic prism 383 is constructed so that a red color reflection surface 381 and a blue color reflection surface 382 are perpendicular to each other. The color image composed by the dichroic prism 383 is enlarged and projected on a screen by a projection lens 384. Further, since most of the light (return light) reflected from the back side of the liquid crystal device substrate can be neglected, a polarizing plate or film which is subjected to antireflection treatment need not be provided on the emission side of the liquid crystal device, thereby permitting realization of cost reduction.

In the liquid crystal device 100 to which the present invention was applied, it is possible to suppress a leak current in the pixel switching TFT 102 for controlling each of the pixel electrodes 14 even if strong light is applied thereto, and thus obtain a high quality image display having high contrast. When the present invention is applied to a projector in which light composition is performed by using a mirror in place of the dichroic prism 383, or a projector using the liquid crystal device 100 according to the present invention and the opposite substrate having R (red), G (green) and B (blue) color filter layers formed thereon so that a color image can be enlarged and projected by using a single liquid crystal device 100, the same effect as described above is obtained.

Particularly, when the dichroic prism 383 is used for color composition, as shown in FIG. 38, the present invention has advantages. For example, the light reflected by the dichroic mirror 374 is transmitted through the light valve 378 and subjected to color composition by the dichroic prism 383. In this case, the light incident on the light valve 378 is modulated by 90° and then incident on the projection lens 384. However, the light incident on the light valve 378 possibly slightly leaks and is incident on the opposite light valve 380. Therefore, in the light valve 380 as an example, not only the light reflected by the dichroic mirror 377 is incident from the incident direction side, as shown by an arrow A, but also the light transmitted through the light valve 378 is partly transmitted through the dichroic prism 382 and incident on the light valve 380. Also, when the light reflected by the dichroic mirror 377 is passed through the light valve 380 and incident on the dichroic prism 383, the light is possibly slightly reflected (regular reflection) by the dichroic prism 383 and again incident on the light valve 380. In this way, in the light valve 380, light is mainly incident from both the incident side and the opposite side. However, even in this case, since the present invention comprises the data lines 2 (second light shielding film), the third light shielding film 6 on the opposite substrate 31, and the first light shielding film 7, which are formed to prevent light incidence on the pixel switching TFT 102 from the incident side and the opposite side, as described above with reference to each of the embodiments, the light incident from the incident side is cut off by the data lines 2 (second light shielding film) and the third light shielding film 6 on the opposite substrate 31, and the light incident from the opposite side is cut off by the first light shielding film 7. Therefore, no leak current occurs in the pixel switching TFT 102.

[Modified Example of Liquid Crystal Device]

Figure 39:
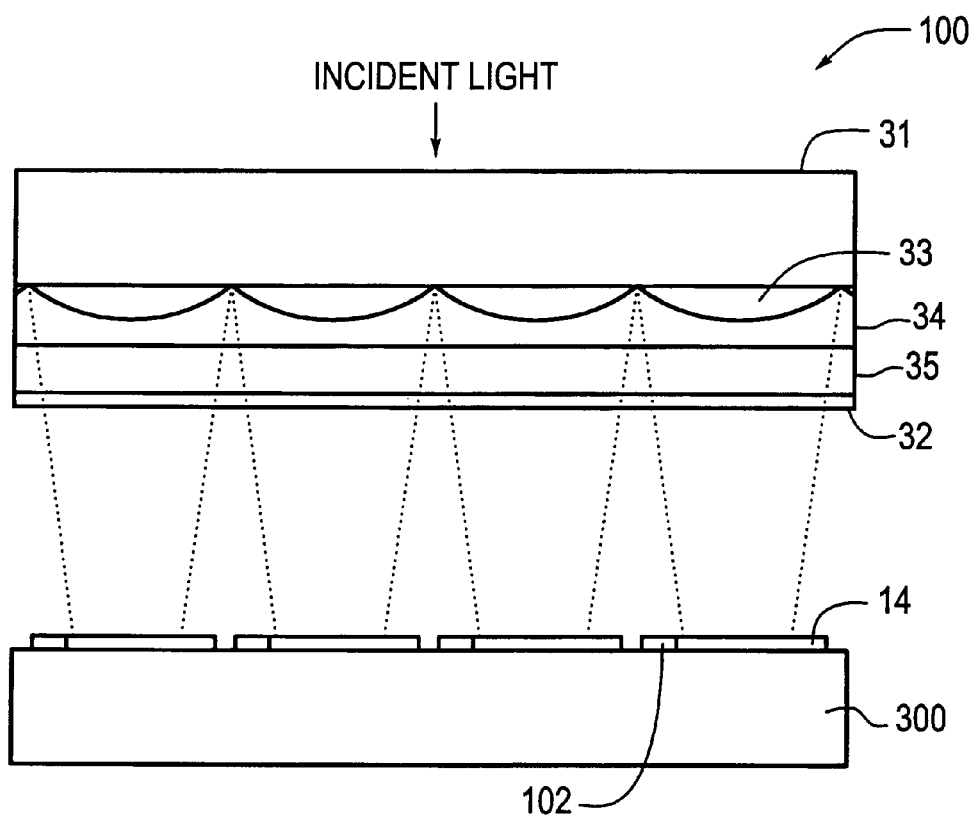
FIG. 39 is a sectional view showing an example of configuration in which a microlens is used on the opposite substrate side in a liquid crystal device comprising a liquid crystal device substrate of the present invention.

In the liquid crystal device 100 of each of the above embodiments, for example, a matrix-shaped microlens 33 is bonded to the opposite substrate 34 in the pixel unit with an adhesive 34 without no gap therebetween, and then covered with a thin glass plate 35 so that incident light can be converged on the pixel electrodes 14 on the liquid crystal device substrate 300, as shown in FIG. 39. Therefore, contrast and brightness can significantly be improved. In addition, since the incident light is converged, it is possible to prevent light incidence on the channel region 1c of the pixel switching TFT 102 from an oblique direction. Further, in the use of the microlens 33, the third light shielding film 6 on the opposite substrate 31 side can be omitted. In the liquid crystal device of the present invention, at least the first light shielding film 7 is provided below the channel region 1c of the pixel switching TFT 102, the channel region 1c is not irradiated with the light (return light) reflected from the black side of the liquid crystal device substrate 300, and thus the leak current due to light can be suppressed. therefore, convergence using the microlens 33 causes no problem.

Although, in all of the above embodiments, the first light shielding film 7 is connected to the constant voltage power source VSSY on the low potential side of the scanning line driving circuits 104, the first light shielding film 7 may be connected to the constant voltage power source VDDY on the high potential side. The first light shielding film 7 may be connected to the constant voltage power source VSSX on the low potential side of the data line driving circuit 103 or the constant voltage power source VDDX on the high potential side. Further, the first light shielding film 7 may be connected to a power source line for supplying the counter electrode potential LCCOM to the counter electrode 32 of the opposite substrate 31 from the liquid crystal device substrate 300 through the transfer material 31, or a power source line for supplying a ground potential to each of the driving circuits 103 and 104.

Further, although, in Embodiments 1 and 2, the wiring portion of the first light shielding film 7 is extended along each of the scanning lines 2, the first light shielding film 7 may be extended along each of the data lines 3 to the outside of the display region 61.

[Effect of the Invention]

As described above, in the liquid crystal device of the present invention, since the first light shielding film is formed below the channel region of the pixel switching TFT so as to overlap with it, the light reflected from the back side of the liquid crystal device substrate does not reach the channel region of the pixel switching TFT. Therefore, no leak currents occurs in the TFT due to the light reflected from the back side of the liquid crystal device substrate, In addition, since the first light shielding film is connected to the constant potential wiring for supplying a constant voltage power source on the low potential side of the scanning line driving circuits and so on, TFT characteristics neither change nor deteriorate due to the effect of the parasitic capacitance between the semiconductor layer of TFT and the first light shielding film.

What is claimed is:

1. A liquid crystal device, comprising:
   a liquid crystal device substrate including a display region in which pixels are formed in a matrix by a plurality of light shielding data lines and a plurality of scanning lines, a peripheral driving circuit connected to at least one of the data lines and the scanning lines on an outer peripheral side of the display region, and a plurality of thin film transistors connected to the data lines and the scanning lines, and a liquid crystal held between the liquid crystal device substrate and an opposite substrate;
   a peripheral partitioning light shielding film formed in an outer peripheral of the display region;
   a plurality of conductive first light shielding films for shielding respective channel regions of the thin film transistors, the plurality of conductive first light shielding films being formed below at least the respective channel regions of the thin film transistors so as to extend along the scanning line; and
   a constant potential wiring connected to the peripheral driving circuit, the constant potential wiring electrically connected to the conductive first light shielding films, the films are connected with each other and below the peripheral partitioning light shielding film.

2. A liquid crystal device according to claim 1, wherein the liquid crystal device substrate comprises a second light shielding film which surrounds the display region on an upper layer side of the channel region of each of the thin film transistors.

3. A liquid crystal device according to claim 2, wherein the second light shielding film comprises the data lines.

4. A liquid crystal device according to claim 1, wherein the first light shielding film comprises a metallic film of tungsten, titanium, chromium, tantalum, or molybdenum, or a metal alloy film which may be a metal silicide film.

5. A liquid crystal device according to claim 1, wherein the opposite substrate comprises a third light shielding film formed corresponding to the pixels.

6. A liquid crystal device according claim 5, wherein the third light shielding film is formed to cover at least the first light shielding film.

7. A liquid crystal device according to claim 1, wherein the opposite substrate comprises a microlens formed in a matrix in correspondence with the respective pixels.

8. A projection type display device comprising a liquid crystal device according to claim 1, wherein the light emitted from a light source is modulated by the liquid crystal device, and the modulated light is enlarged and projected by projection optical means.

9. A liquid crystal device according to claim 1, wherein a constant potential wiring is disposed below the peripheral partitioning light shielding film, and an end of the wiring portion is connected to the constant potential wiring.

10. A liquid crystal device according to claim 9, wherein the constant potential wiring and the wiring portion are connected to each other via a contact hole.

11. A liquid crystal device according to claim 10, wherein the contact hole is positioned below a region of the peripheral partitioning light shielding film in which is extended from a plurality of contact holes is connected to the data lines and the thin film transistors.

12. A liquid crystal device according to claim 9, wherein the constant potential wiring and the wiring portion are connected via a junction electrode.

13. A liquid crystal device according to claim 12, wherein a contact hole connecting the constant potential wiring and the junction electrode and a contact hole connecting the wiring portion and the junction electrode are positioned offset.

14. A liquid crystal device according to claim 9, wherein the constant potential wiring is connected to a capacitance wiring.

15. A liquid crystal device according to claim 14, wherein the capacitance wiring extends parallel to the conductive first light shielding film.

* * * * *